United States Patent
Tonkikh et al.

(10) Patent No.: US 12,148,863 B2
(45) Date of Patent: Nov. 19, 2024

(54) DIRECTIONAL LIGHT EXTRACTION FROM MICRO-LED VIA LOCALIZATION OF LIGHT EMITTING AREA USING MESA SIDEWALL EPITAXY

(71) Applicant: Meta Platforms Technologies, LLC, Menlo Park, CA (US)

(72) Inventors: Alexander Tonkikh, Cork (IE); Salim Boutami, Seattle, WA (US); Sophia Antonia Fox, Cork (IE)

(73) Assignee: META PLATFORMS TECHNOLOGIES, LLC, Menlo Park, CA (US)

( * ) Notice: Subject to any disclaimer, the term of this patent is extended or adjusted under 35 U.S.C. 154(b) by 413 days.

(21) Appl. No.: 17/703,578

(22) Filed: Mar. 24, 2022

(65) Prior Publication Data
US 2023/0307584 A1     Sep. 28, 2023

(51) Int. Cl.
*H01L 33/44*     (2010.01)
*H01L 27/15*     (2006.01)
(Continued)

(52) U.S. Cl.
CPC ............ *H01L 33/44* (2013.01); *H01L 27/156* (2013.01); *H01L 33/0062* (2013.01);
(Continued)

(58) Field of Classification Search
CPC ......... H01L 33/44; H01L 33/24; H01L 33/30; H01L 33/58; H01L 33/60; H01L 33/62; H01L 33/46; H01L 27/156
See application file for complete search history.

(56) References Cited

U.S. PATENT DOCUMENTS 9,484,492 B2   11/2016   Bour et al.
10,193,013 B2   1/2019   Bour et al.
(Continued)

FOREIGN PATENT DOCUMENTS

GB          2584150 B      5/2021
KR     20180074726 A       7/2018

OTHER PUBLICATIONS

Bulashevich K.A., et al., "Effect of Die Shape and Size on Performance of III-Nitride Micro-LEDs: A Modeling Study," Photonics, Oct. 27, 2018, vol. 5, No. 4, 15 pages.
(Continued)

*Primary Examiner* — Ida M Soward
(74) *Attorney, Agent, or Firm* — Weaver Austin Villeneuve & Sampson LLP

(57) ABSTRACT

A micro-light emitting diode includes a semiconductor mesa structure that includes at least a portion of an n-type semiconductor layer, an active region configured to emit visible light, and a p-type semiconductor layer. The micro-LED device also includes an insulator layer that includes an undoped semiconductor passivation layer grown on sidewalls of the semiconductor mesa structure, and a dielectric passivation layer characterized by a refractive index lower than a refractive index of the undoped semiconductor passivation layer. The micro-LED device further includes a reflective metal layer deposited on the dielectric passivation layer, and a micro-lens configured to collimate the visible light emitted by the active region, where a ratio between a width of the micro-lens and a width of the active region may be greater than about 1.5.

20 Claims, 16 Drawing Sheets

(51) Int. Cl.
    *H01L 33/00*     (2010.01)
    *H01L 33/24*     (2010.01)
    *H01L 33/30*     (2010.01)
    *H01L 33/58*     (2010.01)
    *H01L 33/60*     (2010.01)
    *H01L 33/62*     (2010.01)

(52) U.S. Cl.
    CPC .............. *H01L 33/24* (2013.01); *H01L 33/30* (2013.01); *H01L 33/58* (2013.01); *H01L 33/60* (2013.01); *H01L 33/62* (2013.01); *H01L 2933/0025* (2013.01); *H01L 2933/0058* (2013.01); *H01L 2933/0066* (2013.01)

(56) References Cited

U.S. PATENT DOCUMENTS

| | | | | |
|---|---|---|---|---|
| 10,811,460 | B2* | 10/2020 | Dimitropoulos | H01L 27/156 |
| 10,923,628 | B2* | 2/2021 | Dimitropoulos | H01L 33/56 |
| 2005/0110033 | A1* | 5/2005 | Heremans | H01L 33/46 |
| | | | | 257/E33.068 |
| 2021/0111319 | A1 | 4/2021 | Lutgen et al. | |
| 2022/0059740 | A1* | 2/2022 | Hahn | H01L 33/44 |
| 2022/0384516 | A1* | 12/2022 | Tan | H01L 27/156 |

OTHER PUBLICATIONS

European Search Report for European Patent Application No. 23159940.8, dated Aug. 25, 2023, 03 pages.

Huang H.H., et al., "Investigation on Reliability of Red Micro-Light Emitting Diodes with Atomic Layer Deposition Passivation Layers," Optics Express, Dec. 7, 2020, vol. 28, No. 25, pp. 38184-38195.

Wong M.S., et al., "Improved Performance of AlGaInP Red Micro-Light-Emitting Diodes with Sidewall Treatments," Optics Express, Feb. 17, 2020, vol. 28, No. 04, pp. 5787-5793.

Yang C.M., et al., "Enhancement in Light Extraction Efficiency of GaN-Based Light-Emitting Diodes Using Double Dielectric Surface Passivation," Optics and Photonics Journal, Sep. 2012, vol. 2, pp. 185-192.

* cited by examiner

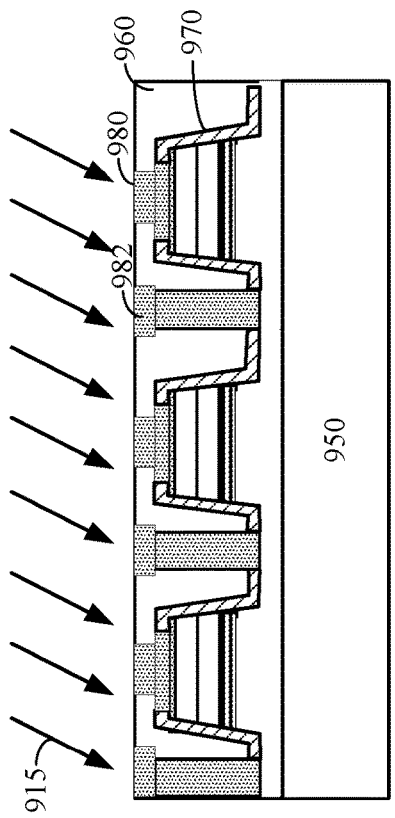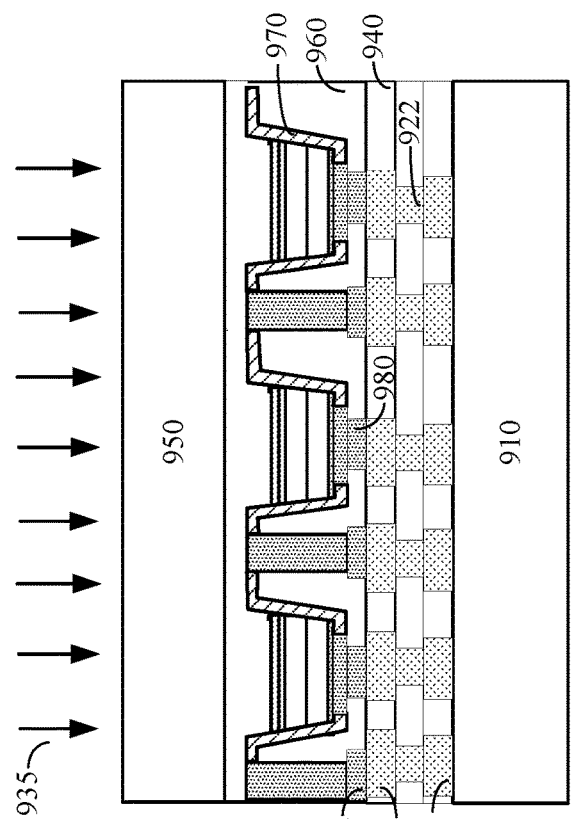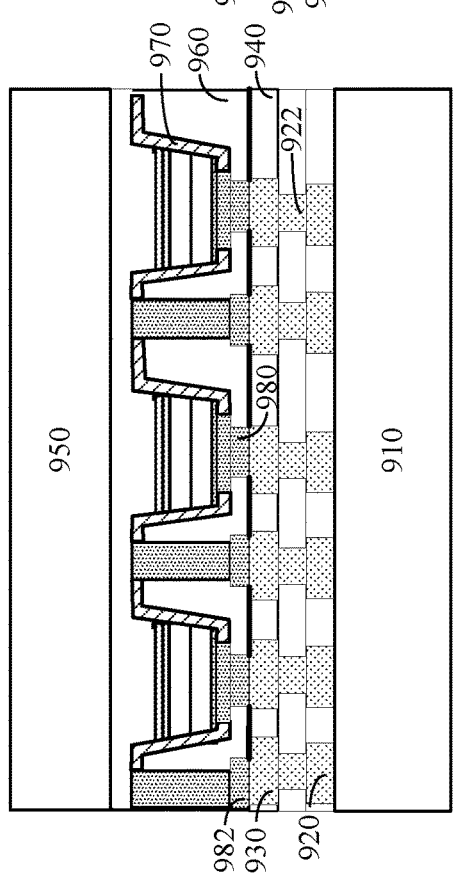

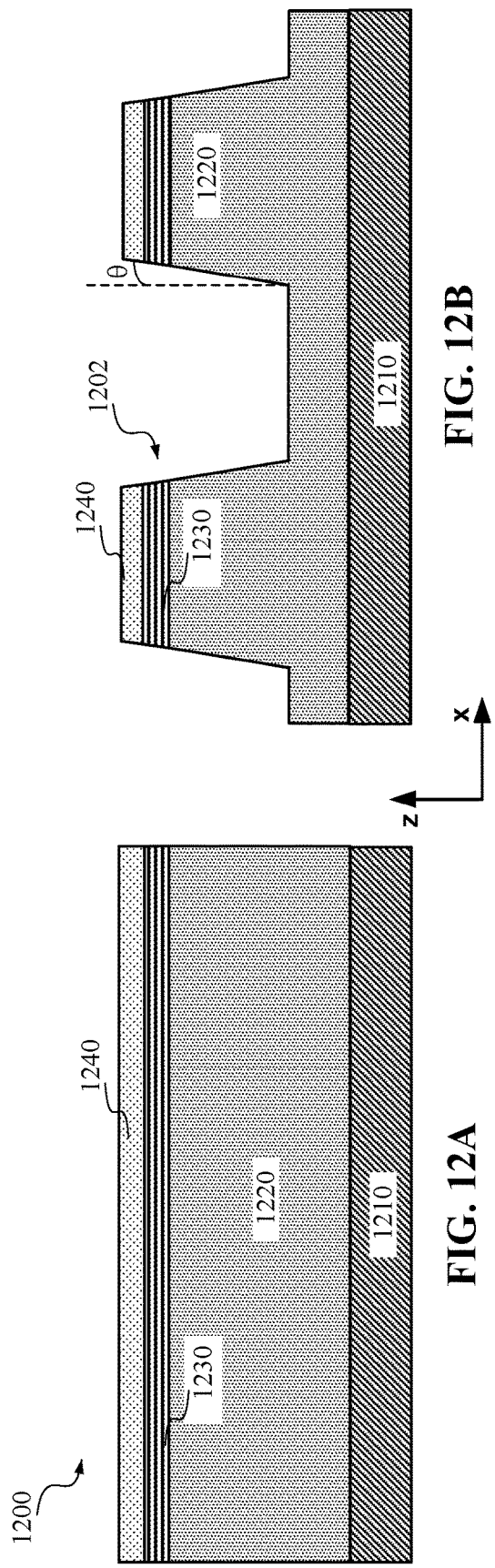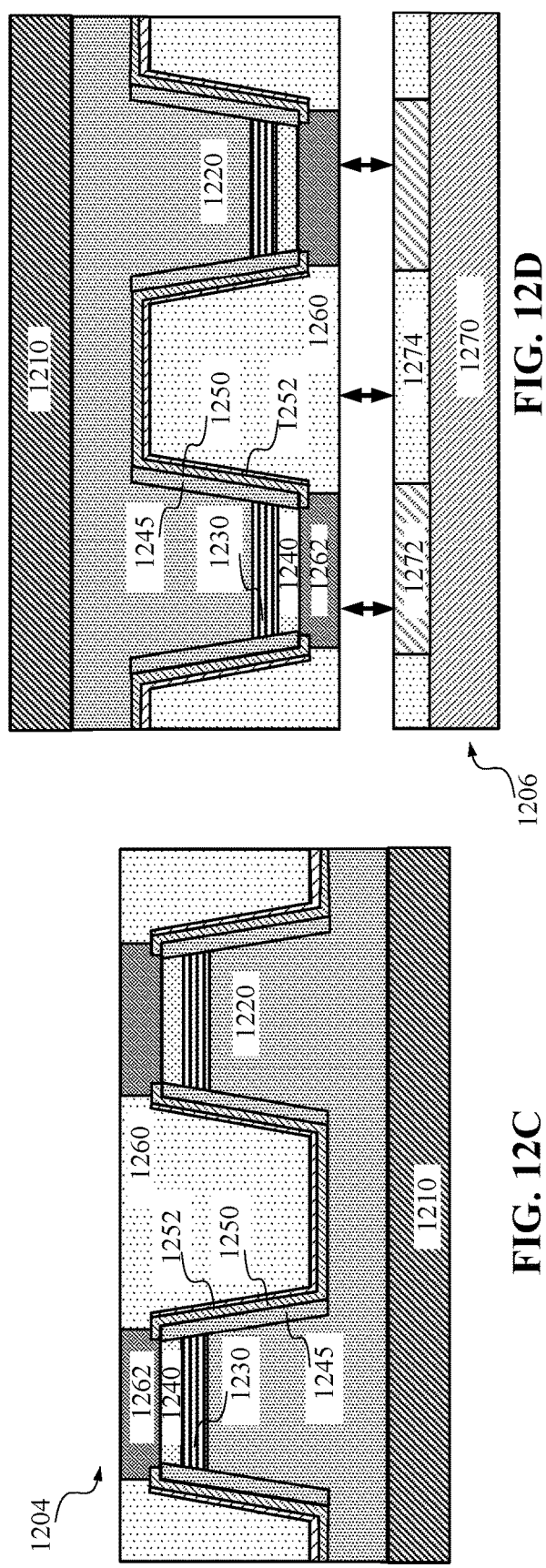
FIG. 12A
FIG. 12B
FIG. 12C
FIG. 12D

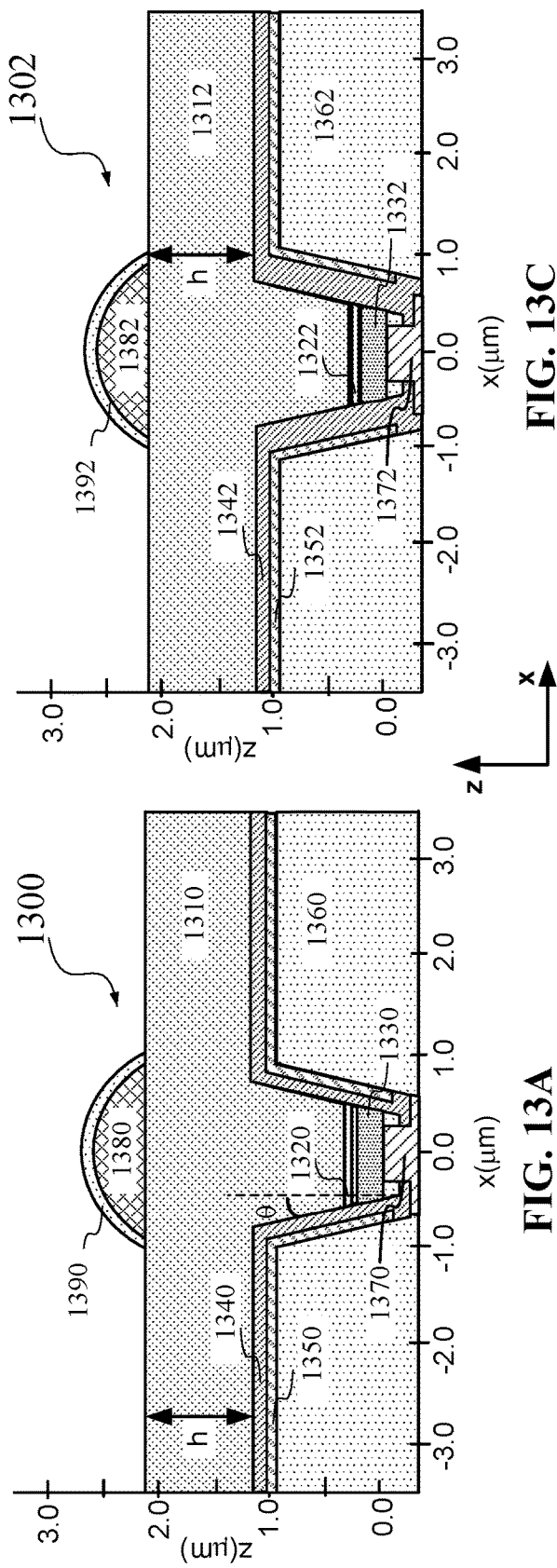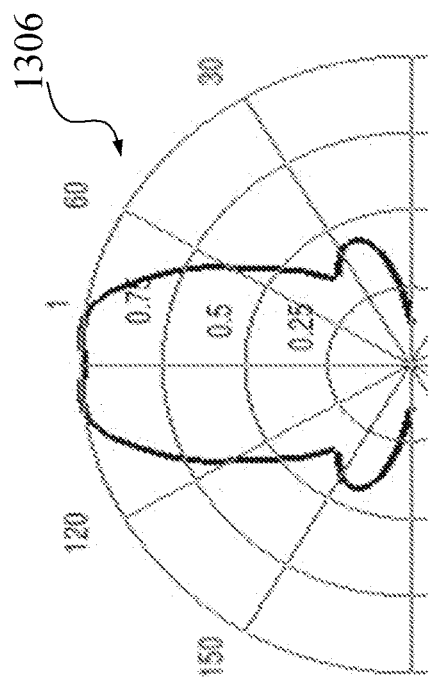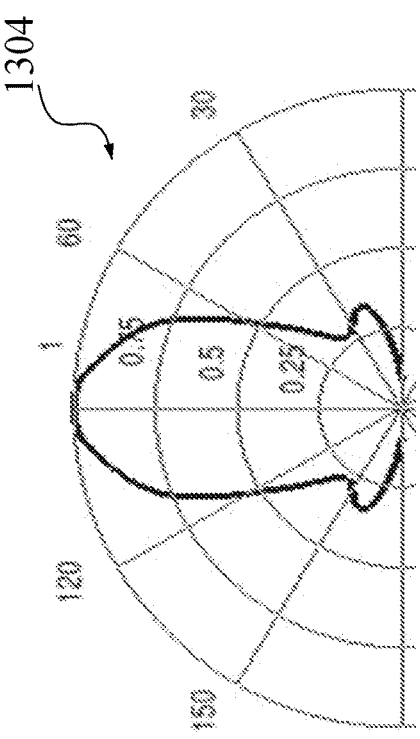
FIG. 13A
FIG. 13B
FIG. 13C
FIG. 13D

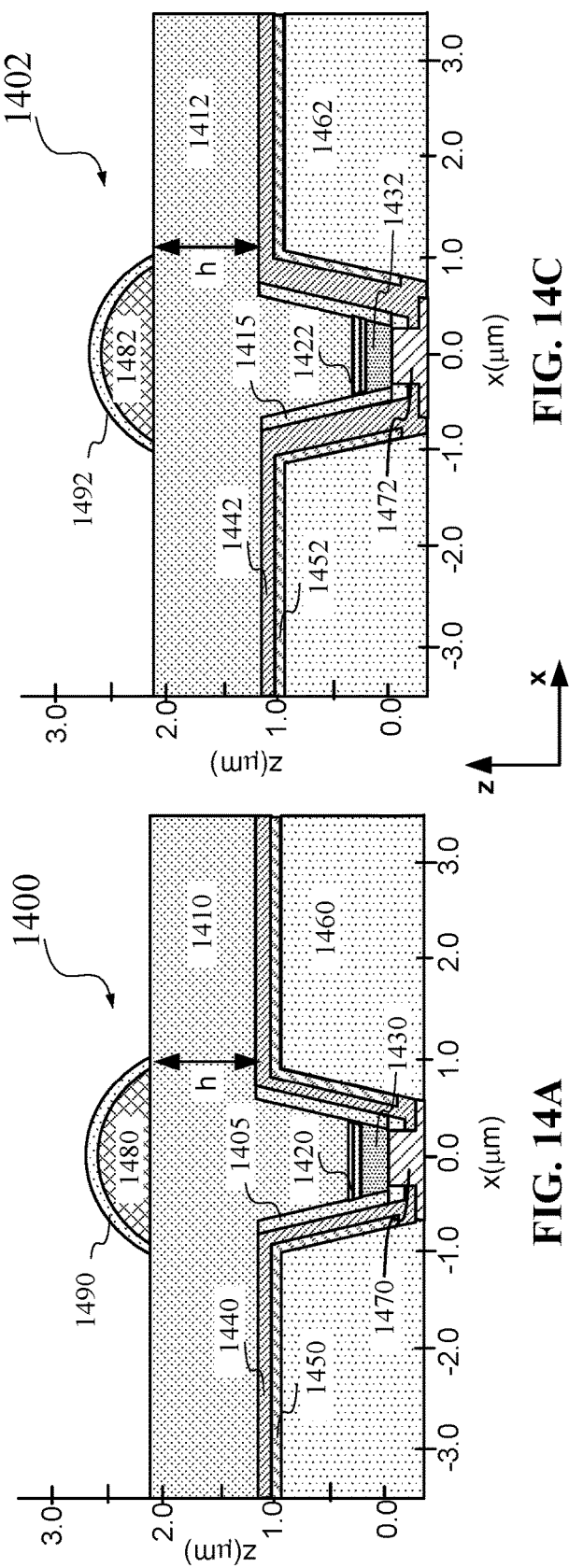
FIG. 14C
FIG. 14A
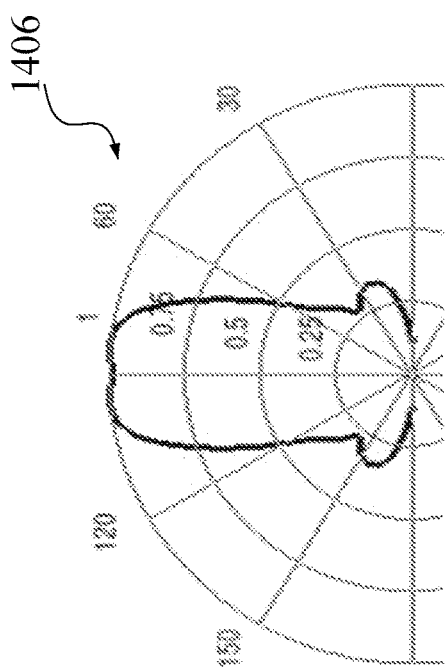
FIG. 14D
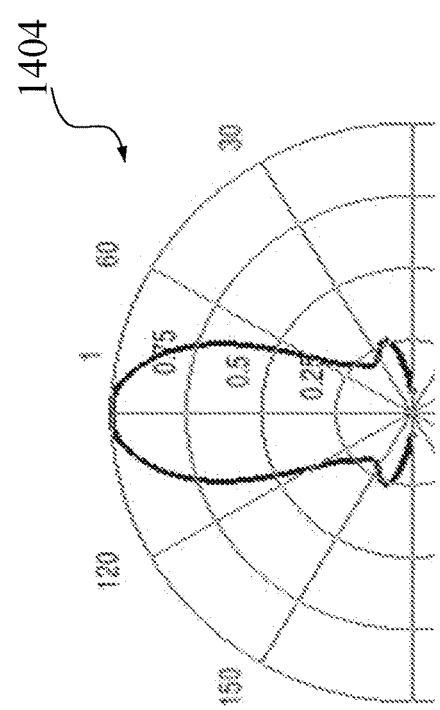
FIG. 14B

DIRECTIONAL LIGHT EXTRACTION FROM MICRO-LED VIA LOCALIZATION OF LIGHT EMITTING AREA USING MESA SIDEWALL EPITAXY

BACKGROUND

Light emitting diodes (LEDs) convert electrical energy into optical energy, and offer many benefits over other light sources, such as reduced size, improved durability, and increased efficiency. LEDs can be used as light sources in many display systems, such as televisions, computer monitors, laptop computers, tablets, smartphones, projection systems, and wearable electronic devices. Micro-LEDs ("μLEDs") based on III-V semiconductors, such as alloys of AlN, GaN, InN, AlGaInP, other ternary and quaternary nitride, phosphide, and arsenide compositions, have begun to be developed for various display applications due to their small size (e.g., with a linear dimension less than 100 μm, less than 50 μm, less than 10 μm, or less than 5 μm), high packing density (and hence higher resolution), and high brightness. For example, micro-LEDs that emit light of different colors (e.g., red, green, and blue) can be used to form the sub-pixels of a display system, such as a television or a near-eye display system.

SUMMARY

This disclosure relates generally to micro-light emitting diodes (micro-LEDs). More specifically, and without limitation, disclosed herein are techniques for improving the collected light extraction efficiencies (LEEs) of micro-LEDs, such as AlGaInP-based red light-emitting micro-LEDs, using reduced quantum well sizes and a combination of high-refractive index and low-refractive index passivation layers. Various inventive embodiments are described herein, including devices, systems, methods, structures, materials, processes, and the like.

According to certain embodiments, a micro-light emitting diode (micro-LED) device may include a semiconductor mesa structure that includes at least a portion of an n-type semiconductor layer, an active region configured to emit visible light, and a p-type semiconductor layer. The micro-LED device may also include an insulator layer that includes an undoped semiconductor passivation layer grown on sidewalls of the semiconductor mesa structure, and a dielectric passivation layer characterized by a refractive index lower than a refractive index of the undoped semiconductor passivation layer. The micro-LED device may further include a reflective metal layer deposited on the dielectric passivation layer, and a micro-lens configured to collimate the visible light emitted by the active region, where a ratio between a width of the micro-lens and a width of the active region may be greater than about 1.5.

In some embodiments of the micro-LED device, the width of the micro-lens may be less than about 3 μm, a thickness of the dielectric passivation layer may be between about 10 nm and about 300 nm (e.g., greater than about 50 nm, such as about 100 nm), and a thickness of the undoped semiconductor passivation layer may be between about 1 nm and about 300 nm. The micro-lens may include a non-native micro-lens that includes a dielectric material. In some embodiments, the ratio between the width of the micro-lens and the width of the active region may be greater than about 2.0. The reflective metal layer may include, for example, Al, Au, Ag, Pt, Ti, Cu, or a combination thereof.

In some embodiments of the micro-LED device, each of the n-type semiconductor layer, the active region, the p-type semiconductor layer, and the undoped semiconductor passivation layer may include a III-P semiconductor material. The sidewalls of the semiconductor mesa structure may be outwardly tilted from the p-type semiconductor layer to the n-type semiconductor layer. The insulator layer may include one or more layers between the undoped semiconductor passivation layer and the dielectric passivation layer, where the one or more layers may include a dielectric material, a doped semiconductor material, an undoped semiconductor material, or a combination thereof. The refractive index of the dielectric passivation layer may be lower than about 2.4, lower than about 2.0, lower than about 1.6, or lower than about 1.5. The micro-LED device may also include a transparent conductive layer on the n-type semiconductor layer.

According to certain embodiments, a micro-LED device may include a backplane wafer, an array of micro-LEDs bonded to the backplane wafer, and an array of micro-lenses on the array of micro-LEDs. Each micro-LED of the array of micro-LEDs may include a semiconductor mesa structure, an insulator layer, and a reflective metal layer. The semiconductor mesa structure may include at least a portion of an n-type semiconductor layer, an active region configured to emit visible light, and a p-type semiconductor layer. The insulator layer may include a first passivation layer on sidewalls of the semiconductor mesa structure and characterized by a refractive index matching a refractive index of active region, and a second passivation layer characterized by a refractive index lower than the refractive index of the first passivation layer. The reflective metal layer may be deposited on the second passivation layer. Each micro-lens of the array of micro-lenses may be configured to collimate the visible light emitted by the active region of a respective micro-LED of the array of micro-LEDs. A ratio between a width of the micro-lens and a width of the active region may be greater than about 1.5.

In some embodiments of the micro-LED device, the first passivation layer may include an undoped semiconductor material layer epitaxially grown on the sidewalls of the semiconductor mesa structure, and the second passivation layer may include a dielectric material. In some embodiments, a pitch of the array of micro-LEDs may be less than about 3 μm, a thickness of the first passivation layer may be between about 1 nm and about 300 nm, and a thickness of the second passivation layer may be between about 10 nm and about 300 nm. In some embodiments, the ratio between the width of the micro-lens and the width of the active region may be greater than about 2.0. The reflective metal layer may include, for example, Al, Au, Ag, Pt, Ti, Cu, or a combination thereof. Each of the n-type semiconductor layer, the active region, the p-type semiconductor layer, and the first passivation layer may include a III-P semiconductor material. In some embodiments, the sidewalls of the semiconductor mesa structure may be outwardly tilted from the p-type semiconductor layer to the n-type semiconductor layer. The refractive index of the second passivation layer may be lower than 2.4, lower than 2.0, lower than 1.6, or lower than 1.5. In some embodiments, the insulator layer may include one or more layers between the first passivation layer and the second passivation layer, the one or more layers including a dielectric material, a doped semiconductor material, an undoped semiconductor material, or a combination thereof. Each micro-LED of the array of micro-LEDs may include a back metal reflector coupled to the p-type semiconductor layer and electrically connected to a drive circuit of the backplane wafer.

This summary is neither intended to identify key or essential features of the claimed subject matter, nor is it intended to be used in isolation to determine the scope of the claimed subject matter. The subject matter should be understood by reference to appropriate portions of the entire specification of this disclosure, any or all drawings, and each claim. The foregoing, together with other features and examples, will be described in more detail below in the following specification, claims, and accompanying drawings.

BRIEF DESCRIPTION OF THE DRAWINGS

Illustrative embodiments are described in detail below with reference to the following figures.

FIGS. 9A-9D illustrate an example of a method of hybrid bonding for arrays of LEDs according to certain embodiments.

FIGS. 12A-12E illustrate an example of a method of fabricating a micro-LED device according to certain embodiments.

FIG. 13A illustrates a simulation model of an example of a micro-LED including a thin, low-refractive index passivation layer.

FIG. 13B illustrates a simulated output beam profile of the example of micro-LED of FIG. 13A.

FIG. 13C illustrates a simulation model of an example of a micro-LED including a thick low-refractive index passivation layer.

FIG. 13D illustrates a simulated output beam profile of the example of micro-LED of FIG. 13C.

FIG. 14A illustrates a simulation model of an example of a micro-LED including a reduced action region, a high-refractive index passivation layer, and a low-refractive index passivation layer according to certain embodiments.

FIG. 14B illustrates a simulated output beam profile of the example of micro-LED of FIG. 14A.

FIG. 14C illustrates a simulation model of an example of a micro-LED including a reduced action region, a high-refractive index passivation layer, and a low-refractive index passivation layer according to certain embodiments.

FIG. 14D illustrates a simulated output beam profile of the example of micro-LED of FIG. 14C.

Figure 1:
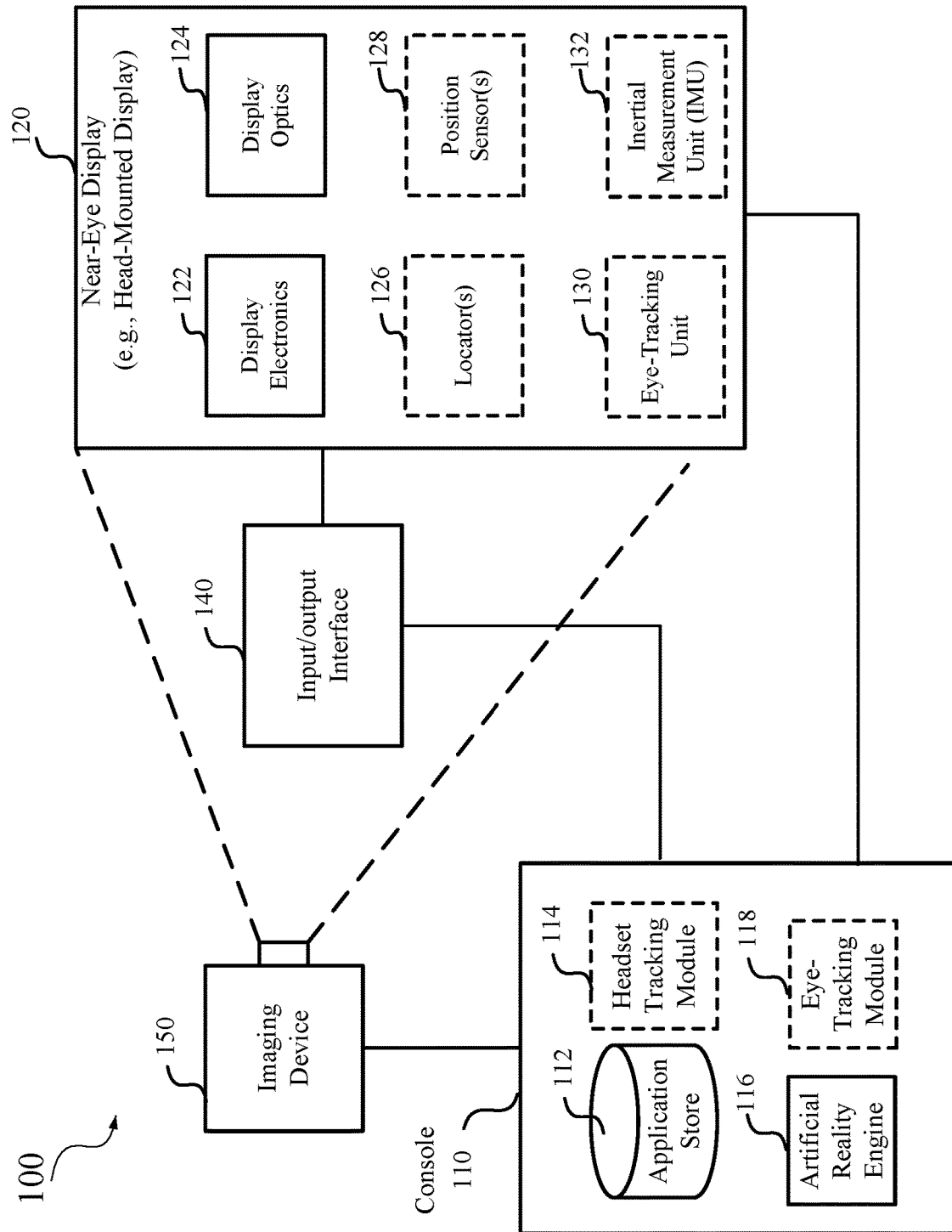
FIG. 1 is a simplified block diagram of an example of an artificial reality system environment including a near-eye display according to certain embodiments.

The figures depict embodiments of the present disclosure for purposes of illustration only. One skilled in the art will readily recognize from the following description that alternative embodiments of the structures and methods illustrated may be employed without departing from the principles, or benefits touted, of this disclosure.

In the appended figures, similar components and/or features may have the same reference label. Further, various components of the same type may be distinguished by following the reference label by a dash and a second label that distinguishes among the similar components. If only the first reference label is used in the specification, the description is applicable to any one of the similar components having the same first reference label irrespective of the second reference label.

DETAILED DESCRIPTION

This disclosure relates generally to micro-light emitting diodes (micro-LEDs). More specifically, and without limitation, disclosed herein are techniques for improving the collected light extraction efficiencies (LEEs) of micro-LEDs, such as AlGaInP-based red light-emitting micro-LEDs, using reduced quantum well (QW) sizes and high-refractive index and low-refractive index passivation layers. Various inventive embodiments are described herein, including devices, systems, methods, structures, materials, processes, and the like.

Augmented reality (AR) and virtual reality (VR) applications may use near-eye displays that include tiny monochrome light emitters, such as mini- or micro-LEDs. In light emitting diodes (LEDs), photons are generated through the recombination of electrons and holes within an active region (e.g., including one or more semiconductor layers that may form one or more quantum wells). The proportion of the carriers (e.g., electrons or holes) injected into the active region of an LED among the carriers that pass through the LED is referred to as the carrier injection efficiency. The ratio between the number of emitted photons and the number of carriers injected into the active region is referred to as the internal quantum efficiency (IQE) of the LED. Light emitted in the active region may be extracted from the LED at a certain light extraction efficiency (LEE). The ratio between the number of emitted photons extracted from the LED and the number of electrons passing through the LED is referred to as the external quantum efficiency (EQE) of the LED, which describes how efficiently the LED converts injected carriers into photons that are extracted from the LED. The EQE may be a product of the carrier injection efficiency, the IQE, and the LEE. In LEDs for ear-eye displays, only light that is emitted from an LED into a certain direction and/or within a certain emission angle range (e.g., within about ±20°) may be collected by the display optics of the near-eye displays. The proportion of the emitted photons that are extracted from the LED and are collected by the display optics may be referred to as the collected LEE. For LEDs with reduced physical dimensions, such as micro-LEDs, the IQEs, collected LEEs, and EQEs may be very low. Improving the efficiencies of the micro-LEDs can be challenging.

The internal quantum efficiency of an LED depends on the relative rates of competitive radiative (light producing) recombination and non-radiative (lossy) recombination that occur in the active region of the LED. Non-radiative recombination processes in the active region include Shockley-Read-Hall (SRH) recombination at defect sites and electron-electron-hole (eeh) and/or electron-hole-hole (ehh) Auger recombination. The Auger recombination is a non-radiative process involving three carriers, which affects all sizes of LEDs. In micro-LEDs, because the lateral size of each micro-LED may be comparable to the minority carrier diffusion length, a larger proportion of the total active region may be within a distance less than the minority carrier diffusion length from the LED sidewall surfaces where the defect density and the defect-induced non-radiative recombination rate may be high. Therefore, a larger proportion of the injected carriers may diffuse to the regions near the sidewall surfaces, where the carriers may be subjected to a higher SRH recombination rate. This may cause the efficiency of the LED to decrease (in particular, at low current injection), cause the peak efficiency of the LED to decrease, and/or cause the peak efficiency operating current to increase. Increasing the injected current may cause the efficiencies of the micro-LEDs to drop due to the higher eeh or ehh Auger recombination rate at a higher current density, and may also cause spectral shift of the emitted light. As the physical sizes of LEDs are further reduced, efficiency losses due to surface recombination near the etched sidewall facets that include surface imperfections may become much more significant. III-phosphide materials, such as AlGaInP, can have a high surface recombination velocity and minority carrier diffusion length. For example, carriers in AlGaInP can have high diffusivity (mobility), and AlGaInP may have an order of magnitude higher surface recombination velocity than III-nitride materials. Thus, the internal and external quantum efficiencies of AlGaInP-based red light-emitting LEDs may drop even more significantly as the device size reduces.

In addition, at the light-emitting surface of an LED, such as the interface between the LED and air, some incident light with incident angles greater than the critical angle may be reflected back to the LED due to total internal reflection (TIR). Because of the geometry of the LED, some light reflected back to the LED may be trapped and eventually be absorbed by the LED. For example, some trapped light may be absorbed by the semiconductor materials to generate electron-hole pairs, which may recombine radiatively or non-radiatively. Some trapped light may be absorbed by metals (e.g., metal contacts or reflectors) at the bottom and/or sidewalls of the LED due to, for example, surface plasmon resonance that may be excited by p-polarized (TM) light at the interface between a metal layer and a dielectric layer (e.g., the passivation layer). In III-phosphide-based LEDs, such as some red light-emitting III-phosphide LEDs, the refractive indices of the III-phosphide semiconductor materials (e.g., GaP, InP, GaInP, or AlGaInP) may be greater than about 3.0 (e.g., about 3.4) for visible light, much higher than the refractive indices of many III-nitride semiconductor materials (e.g., about 2.4 for GaN). Therefore, the critical angle for total internal reflection at the interface between the III-phosphide semiconductor material and an adjacent lower refractive index material (e.g., air or a dielectric) may be much smaller than the critical angle for total internal reflection at the interface between a III-nitride semiconductor material and the lower refractive index material. As such, more light emitted in the active region of a III-phosphide-based LED may be trapped in the LED and may be absorbed eventually. Therefore, the LEE of a red light-emitting III-phosphide LED may be low.

Micro-lenses may be used to collimate light emitted from LEDs to increase the total LEEs (e.g., for extracted light with emission angles within ±90°) and the collected LEEs (e.g., for extracted light with emission angles within ±18.5°) of LEDs in a near-eye display. Micro-LEDs including mesa structures with straight sidewalls and native micro-lenses (e.g., made in semiconductor materials) may have higher collected LEEs, but may be more difficult to fabricate. For example, the etched mesa sidewalls may generally be slanted, for example, with slope angles about 5-30 degrees (e.g., about 15°), which may reduce the collected LEE. Non-native lenses made from, for example, SiN, $SiO_2$, or organic materials, may be easier to fabricate than native lenses, but may exhibit lower collected LEEs compared with native lenses. For example, micro-lenses with large ratios between the widths of the micro-lenses and active region sizes of the micro-LEDs may be needed to improve the collected LEE, but the fabricated non-native micro-lenses may shrink, which may reduce the collected LEE by a factor of about 2 in some cases. In addition, to improve the collected LEE using micro-lenses, a thick layer (e.g., an n-type semiconductor layer with a thickness much greater than about 400 nm) between the active regions of the LEDs and the micro-lenses may be needed for the micro-lenses to collimate the light emitted in the active regions of the LEDs. The thick layer between the active regions and the micro-lenses may guide some emitted light laterally and cause optical crosstalk between adjacent pixels, and may also increase the trapped light by as high as 60%. For red light-emitting devices, multiple QWs are generally used in the active region to increase the intensity of the emitted light, which may significantly reduce the collected LEE because, for example, the light emitted by the multiple QWs at different distances from a lens may not be collimated well by the lens and light emitted by a QW may be absorbed by another QW.

According to certain embodiments, a micro-LED may include a reduced active region, and an insulator layer that may include at least a high-refractive index passivation layer adjacent to the active region and a low-refractive index passivation layer adjacent to sidewall metal reflectors. The high-refractive index passivation layer may include a high-refractive index dielectric material or a semiconductor material, and may increase the optical distance between the active region and the sidewall metal reflector compared with a low-refractive index passivation layer of the same thickness.

Increasing the optical distance between the active region and the sidewall metal reflector may reduce the excitation of surface plasmon resonance by p-polarized (TM) light at the interface between the sidewall metal reflector and the insulator layer. The low-refractive index passivation layer adjacent to the sidewall metal reflector may reduce the amplitudes of the electromagnetic fields induced by the surface plasmon resonance at the interface between the sidewall metal reflector and the insulator layer. Therefore, losses at the sidewall metal reflector may be reduced. In addition, total internal reflection may occur at the interface between the high-refractive index passivation layer and the low-refractive index passivation layer for light incident on this interface at large incidence angles. Therefore, the light incident on this interface at large incidence angles may not even reach the interface between the sidewall metal reflector and the insulator layer and thus may not be partially absorbed by the sidewall metal reflector due to surface plasmon resonance. For at least these reasons, the total LEE for extracted light with emission angles within ±90° may be increased.

In one example, the high-refractive index passivation layer may include a semiconductor material with a refractive index matching the refractive index of the active region. For example, the semiconductor material may be an undoped semiconductor material that has the same base material as the active region, and may be formed on the sidewalls of etched mesa structures through epitaxial growth or deposition, before the low-refractive index passivation layer is formed. The epitaxially grown passivation layer may also reduce defects at the sidewalls of the active region, and thus may reduce non-radiative recombination near the sidewalls of the active region and increase the internal quantum efficiency of the micro-LED. In some embodiments, the low-refractive index passivation layer may have a thickness greater than about 50 nm, such as about 100 nm or thicker. In some embodiments, the insulator layer may include additional (conductive or non-conductive) layers between the high-refractive index passivation layer and the low-refractive index passivation layer.

In addition, the reduction of the active region due to the increase of the thickness of the passivation layers may increase the ratio between the width of the micro-lens and the width of the active region, such that the active region may be closer to a point source at a focal point of the micro-lens and thus the emitted light may be better collimated by the micro-lens. As a result, a higher percentage of the extracted light may have emission angles within a small emission cone (e.g., within ±18.5°) and thus may be collected by the display optics. Therefore, the collected light extraction efficiency (e.g., for extracted light with emission angles within ±18.5°) may be improved. Simulation results show that, for micro-LEDs with sidewall slope angles larger than 90° (i.e., outwardly tilted in the light emitting direction), the collected LEE can be significantly increased. For example, for micro-LEDs with a pitch about 2 μm, reducing the width of the active region by about 150 nm to about 200 nm may improve the collected LEE to about two times. Furthermore, with the reduction of the active region, the tolerance of the LED device to the variation of the lens width may be improved, and thus the reduction of the width of the fabricated micro-lens (e.g., due to the fabrication process or shrinkage) may not cause a large reduction of the collected LEE. Moreover, the thickness of the semiconductor material layer (e.g., the n-type semiconductor layer) between the micro-lens (e.g., a non-native lens) and the active region can be reduced to reduce optical crosstalk, while achieving higher collected LEE (e.g., close to 4% within ±18.5° for red micro-LEDs with three quantum wells).

The micro-LEDs described herein may be used in conjunction with various technologies, such as an artificial reality system. An artificial reality system, such as a head-mounted display (HMD) or heads-up display (HUD) system, generally includes a display configured to present artificial images that depict objects in a virtual environment. The display may present virtual objects or combine images of real objects with virtual objects, as in virtual reality (VR), augmented reality (AR), or mixed reality (MR) applications. For example, in an AR system, a user may view both displayed images of virtual objects (e.g., computer-generated images (CGIs)) and the surrounding environment by, for example, seeing through transparent display glasses or lenses (often referred to as optical see-through) or viewing displayed images of the surrounding environment captured by a camera (often referred to as video see-through). In some AR systems, the artificial images may be presented to users using an LED-based display subsystem.

As used herein, the term "light emitting diode (LED)" refers to a light source that includes at least an n-type semiconductor layer, a p-type semiconductor layer, and a light emitting region (i.e., active region) between the n-type semiconductor layer and the p-type semiconductor layer. The light emitting region may include one or more semiconductor layers that form one or more heterostructures, such as quantum wells. In some embodiments, the light emitting region may include multiple semiconductor layers that form one or more multiple-quantum-wells (MQWs), each including multiple (e.g., about 2 to 6) quantum wells.

As used herein, the term "micro-LED" or "μLED" refers to an LED that has a chip where a linear dimension of the chip is less than about 200 μm, such as less than 100 μm, less than 50 μm, less than 20 μm, less than 10 μm, or smaller. For example, the linear dimension of a micro-LED may be as small as 6 μm, 5 μm, 4 μm, 2 μm, or smaller. Some micro-LEDs may have a linear dimension (e.g., length or diameter) comparable to the minority carrier diffusion length. However, the disclosure herein is not limited to micro-LEDs, and may also be applied to mini-LEDs and large LEDs.

As used herein, the term "LED array precursor" refers to an LED die or wafer that does not have the opposing electrical contacts and/or the associated drive circuitry for each LED such that a driving voltage or current may be applied to the LED for the LED to emit light. For example, an LED array precursor may be a wafer or die with an epitaxial layer stack that may or may not include the light emitting regions, a wafer or die with mesa structures formed in the epitaxial layer stack, a wafer or die with LED arrays and metal contacts formed thereon but without the drive circuitry, and the like. Accordingly, the LED die or wafer is a precursor to a monolithic LED array that may be formed after subsequent processing steps are performed, such as forming mesa structures, forming metal electrodes, bonding to electrical backplane, removing the substrate, forming light-extraction structures, or the like.

As used herein, the term "bonding" may refer to various methods for physically and/or electrically connecting two or more devices and/or wafers, such as adhesive bonding, metal-to-metal bonding, metal oxide bonding, wafer-to-wafer bonding, die-to-wafer bonding, hybrid bonding, soldering, under-bump metallization, and the like. For example, adhesive bonding may use a curable adhesive (e.g., an epoxy) to physically bond two or more devices and/or wafers through adhesion. Metal-to-metal bonding may include, for example, wire bonding or flip chip bonding using soldering interfaces (e.g., pads or balls), conductive adhesive, or welded joints between metals. Metal oxide bonding may form a metal and oxide pattern on each surface, bond the oxide sections together, and then bond the metal sections together to create a conductive path. Wafer-to-wafer bonding may bond two wafers (e.g., silicon wafers or other semiconductor wafers) without any intermediate layers and is based on chemical bonds between the surfaces of the two wafers. Wafer-to-wafer bonding may include wafer cleaning and other preprocessing, aligning and pre-bonding at room temperature, and annealing at elevated temperatures, such as about 250° C. or higher. Die-to-wafer bonding may use bumps on one wafer to align features of a pre-formed chip with drivers of a wafer. Hybrid bonding may include, for example, wafer cleaning, high-precision alignment of contacts of one wafer with contacts of another wafer, dielectric bonding of dielectric materials within the wafers at room temperature, and metal bonding of the contacts by annealing at, for example, 250-300° C. or higher. As used herein, the term "bump" may refer generically to a metal interconnect used or formed during bonding.

In the following description, for the purposes of explanation, specific details are set forth in order to provide a thorough understanding of examples of the disclosure. However, it will be apparent that various examples may be practiced without these specific details. For example, devices, systems, structures, assemblies, methods, and other components may be shown as components in block diagram form in order not to obscure the examples in unnecessary detail. In other instances, well-known devices, processes, systems, structures, and techniques may be shown without necessary detail in order to avoid obscuring the examples. The FIGS. and description are not intended to be restrictive. The terms and expressions that have been employed in this disclosure are used as terms of description and not of limitation, and there is no intention in the use of such terms and expressions of excluding any equivalents of the features shown and described or portions thereof. The word "example" is used herein to mean "serving as an example, instance, or illustration." Any embodiment or design described herein as "example" is not necessarily to be construed as preferred or advantageous over other embodiments or designs.

FIG. 1 is a simplified block diagram of an example of an artificial reality system environment 100 including a near-eye display 120 in accordance with certain embodiments. Artificial reality system environment 100 shown in FIG. 1 may include near-eye display 120, an optional external imaging device 150, and an optional input/output interface 140, each of which may be coupled to an optional console 110. While FIG. 1 shows an example of artificial reality system environment 100 including one near-eye display 120, one external imaging device 150, and one input/output interface 140, any number of these components may be included in artificial reality system environment 100, or any of the components may be omitted. For example, there may be multiple near-eye displays 120 monitored by one or more external imaging devices 150 in communication with console 110. In some configurations, artificial reality system environment 100 may not include external imaging device 150, optional input/output interface 140, and optional console 110. In alternative configurations, different or additional components may be included in artificial reality system environment 100.

Near-eye display 120 may be a head-mounted display that presents content to a user. Examples of content presented by near-eye display 120 include one or more of images, videos, audio, or any combination thereof. In some embodiments, audio may be presented via an external device (e.g., speakers and/or headphones) that receives audio information from near-eye display 120, console 110, or both, and presents audio data based on the audio information. Near-eye display 120 may include one or more rigid bodies, which may be rigidly or non-rigidly coupled to each other. A rigid coupling between rigid bodies may cause the coupled rigid bodies to act as a single rigid entity. A non-rigid coupling between rigid bodies may allow the rigid bodies to move relative to each other. In various embodiments, near-eye display 120 may be implemented in any suitable form-factor, including a pair of glasses. Some embodiments of near-eye display 120 are further described below with respect to FIGS. 2 and 3. Additionally, in various embodiments, the functionality described herein may be used in a headset that combines images of an environment external to near-eye display 120 and artificial reality content (e.g., computer-generated images). Therefore, near-eye display 120 may augment images of a physical, real-world environment external to near-eye display 120 with generated content (e.g., images, video, sound, etc.) to present an augmented reality to a user.

In various embodiments, near-eye display 120 may include one or more of display electronics 122, display optics 124, and an eye-tracking unit 130. In some embodiments, near-eye display 120 may also include one or more locators 126, one or more position sensors 128, and an inertial measurement unit (IMU) 132. Near-eye display 120 may omit any of eye-tracking unit 130, locators 126, position sensors 128, and IMU 132, or include additional elements in various embodiments. Additionally, in some embodiments, near-eye display 120 may include elements combining the function of various elements described in conjunction with FIG. 1.

Display electronics 122 may display or facilitate the display of images to the user according to data received from, for example, console 110. In various embodiments, display electronics 122 may include one or more display panels, such as a liquid crystal display (LCD), an organic light emitting diode (OLED) display, an inorganic light emitting diode (ILED) display, a micro light emitting diode (µLED) display, an active-matrix OLED display (AMOLED), a transparent OLED display (TOLED), or some other display. For example, in one implementation of near-eye display 120, display electronics 122 may include a front TOLED panel, a rear display panel, and an optical component (e.g., an attenuator, polarizer, or diffractive or spectral film) between the front and rear display panels. Display electronics 122 may include pixels to emit light of a predominant color such as red, green, blue, white, or yellow. In some implementations, display electronics 122 may display a three-dimensional (3D) image through stereoscopic effects produced by two-dimensional panels to create a subjective perception of image depth. For example, display electronics 122 may include a left display and a right display positioned in front of a user's left eye and right eye, respectively. The left and right displays may present copies of an image shifted horizontally relative to each other to create a stereoscopic effect (i.e., a perception of image depth by a user viewing the image).

In certain embodiments, display optics 124 may display image content optically (e.g., using optical waveguides and couplers) or magnify image light received from display electronics 122, correct optical errors associated with the image light, and present the corrected image light to a user of near-eye display 120. In various embodiments, display optics 124 may include one or more optical elements, such as, for example, a substrate, optical waveguides, an aperture, a Fresnel lens, a convex lens, a concave lens, a filter, input/output couplers, or any other suitable optical elements that may affect image light emitted from display electronics 122. Display optics 124 may include a combination of different optical elements as well as mechanical couplings to maintain relative spacing and orientation of the optical elements in the combination. One or more optical elements in display optics 124 may have an optical coating, such as an anti-reflective coating, a reflective coating, a filtering coating, or a combination of different optical coatings.

Magnification of the image light by display optics 124 may allow display electronics 122 to be physically smaller, weigh less, and consume less power than larger displays. Additionally, magnification may increase a field of view of the displayed content. The amount of magnification of image light by display optics 124 may be changed by adjusting, adding, or removing optical elements from display optics 124. In some embodiments, display optics 124 may project displayed images to one or more image planes that may be further away from the user's eyes than near-eye display 120.

Display optics 124 may also be designed to correct one or more types of optical errors, such as two-dimensional optical errors, three-dimensional optical errors, or any combination thereof. Two-dimensional errors may include optical aberrations that occur in two dimensions. Example types of two-dimensional errors may include barrel distortion, pincushion distortion, longitudinal chromatic aberration, and transverse chromatic aberration. Three-dimensional errors may include optical errors that occur in three dimensions. Example types of three-dimensional errors may include spherical aberration, comatic aberration, field curvature, and astigmatism.

Locators 126 may be objects located in specific positions on near-eye display 120 relative to one another and relative to a reference point on near-eye display 120. In some implementations, console 110 may identify locators 126 in images captured by external imaging device 150 to determine the artificial reality headset's position, orientation, or both. A locator 126 may be an LED, a corner cube reflector, a reflective marker, a type of light source that contrasts with an environment in which near-eye display 120 operates, or any combination thereof. In embodiments where locators 126 are active components (e.g., LEDs or other types of light emitting devices), locators 126 may emit light in the visible band (e.g., about 380 nm to 750 nm), in the infrared (IR) band (e.g., about 750 nm to 1 mm), in the ultraviolet band (e.g., about 10 nm to about 380 nm), in another portion of the electromagnetic spectrum, or in any combination of portions of the electromagnetic spectrum.

External imaging device 150 may include one or more cameras, one or more video cameras, any other device capable of capturing images including one or more of locators 126, or any combination thereof. Additionally, external imaging device 150 may include one or more filters (e.g., to increase signal to noise ratio). External imaging device 150 may be configured to detect light emitted or reflected from locators 126 in a field of view of external imaging device 150. In embodiments where locators 126 include passive elements (e.g., retroreflectors), external imaging device 150 may include a light source that illuminates some or all of locators 126, which may retro-reflect the light to the light source in external imaging device 150. Slow calibration data may be communicated from external imaging device 150 to console 110, and external imaging device 150 may receive one or more calibration parameters from console 110 to adjust one or more imaging parameters (e.g., focal length, focus, frame rate, sensor temperature, shutter speed, aperture, etc.).

Position sensors 128 may generate one or more measurement signals in response to motion of near-eye display 120. Examples of position sensors 128 may include accelerometers, gyroscopes, magnetometers, other motion-detecting or error-correcting sensors, or any combination thereof. For example, in some embodiments, position sensors 128 may include multiple accelerometers to measure translational motion (e.g., forward/back, up/down, or left/right) and multiple gyroscopes to measure rotational motion (e.g., pitch, yaw, or roll). In some embodiments, various position sensors may be oriented orthogonally to each other.

IMU 132 may be an electronic device that generates fast calibration data based on measurement signals received from one or more of position sensors 128. Position sensors 128 may be located external to IMU 132, internal to IMU 132, or any combination thereof. Based on the one or more measurement signals from one or more position sensors 128, IMU 132 may generate fast calibration data indicating an estimated position of near-eye display 120 relative to an initial position of near-eye display 120. For example, IMU 132 may integrate measurement signals received from accelerometers over time to estimate a velocity vector and integrate the velocity vector over time to determine an estimated position of a reference point on near-eye display 120. Alternatively, IMU 132 may provide the sampled measurement signals to console 110, which may determine the fast calibration data. While the reference point may generally be defined as a point in space, in various embodiments, the reference point may also be defined as a point within near-eye display 120 (e.g., a center of IMU 132).

Eye-tracking unit 130 may include one or more eye-tracking systems. Eye tracking may refer to determining an eye's position, including orientation and location of the eye, relative to near-eye display 120. An eye-tracking system may include an imaging system to image one or more eyes and may optionally include a light emitter, which may generate light that is directed to an eye such that light reflected by the eye may be captured by the imaging system. For example, eye-tracking unit 130 may include a non-coherent or coherent light source (e.g., a laser diode) emitting light in the visible spectrum or infrared spectrum, and a camera capturing the light reflected by the user's eye. As another example, eye-tracking unit 130 may capture reflected radio waves emitted by a miniature radar unit. Eye-tracking unit 130 may use low-power light emitters that emit light at frequencies and intensities that would not injure the eye or cause physical discomfort. Eye-tracking unit 130 may be arranged to increase contrast in images of an eye captured by eye-tracking unit 130 while reducing the overall power consumed by eye-tracking unit 130 (e.g., reducing power consumed by a light emitter and an imaging system included in eye-tracking unit 130). For example, in some implementations, eye-tracking unit 130 may consume less than 100 milliwatts of power.

Near-eye display 120 may use the orientation of the eye to, e.g., determine an inter-pupillary distance (IPD) of the user, determine gaze direction, introduce depth cues (e.g., blur image outside of the user's main line of sight), collect heuristics on the user interaction in the VR media (e.g., time spent on any particular subject, object, or frame as a function of exposed stimuli), some other functions that are based in part on the orientation of at least one of the user's eyes, or any combination thereof. Because the orientation may be determined for both eyes of the user, eye-tracking unit 130 may be able to determine where the user is looking. For example, determining a direction of a user's gaze may include determining a point of convergence based on the determined orientations of the user's left and right eyes. A point of convergence may be the point where the two foveal axes of the user's eyes intersect. The direction of the user's gaze may be the direction of a line passing through the point of convergence and the mid-point between the pupils of the user's eyes.

Input/output interface 140 may be a device that allows a user to send action requests to console 110. An action request may be a request to perform a particular action. For example, an action request may be to start or to end an application or to perform a particular action within the application. Input/output interface 140 may include one or more input devices. Example input devices may include a keyboard, a mouse, a game controller, a glove, a button, a touch screen, or any other suitable device for receiving action requests and communicating the received action requests to console 110. An action request received by the input/output interface 140 may be communicated to console 110, which may perform an action corresponding to the requested action. In some embodiments, input/output interface 140 may provide haptic feedback to the user in accordance with instructions received from console 110. For example, input/output interface 140 may provide haptic feedback when an action request is received, or when console 110 has performed a requested action and communicates instructions to input/output interface 140. In some embodiments, external imaging device 150 may be used to track input/output interface 140, such as tracking the location or position of a controller (which may include, for example, an IR light source) or a hand of the user to determine the motion of the user. In some embodiments, near-eye display 120 may include one or more imaging devices to track input/output interface 140, such as tracking the location or position of a controller or a hand of the user to determine the motion of the user.

Console 110 may provide content to near-eye display 120 for presentation to the user in accordance with information received from one or more of external imaging device 150, near-eye display 120, and input/output interface 140. In the example shown in FIG. 1, console 110 may include an application store 112, a headset tracking module 114, an artificial reality engine 116, and an eye-tracking module 118. Some embodiments of console 110 may include different or additional modules than those described in conjunction with FIG. 1. Functions further described below may be distributed among components of console 110 in a different manner than is described here.

In some embodiments, console 110 may include a processor and a non-transitory computer-readable storage medium storing instructions executable by the processor. The processor may include multiple processing units executing instructions in parallel. The non-transitory computer-readable storage medium may be any memory, such as a hard disk drive, a removable memory, or a solid-state drive (e.g., flash memory or dynamic random access memory (DRAM)). In various embodiments, the modules of console 110 described in conjunction with FIG. 1 may be encoded as instructions in the non-transitory computer-readable storage medium that, when executed by the processor, cause the processor to perform the functions further described below.

Application store 112 may store one or more applications for execution by console 110. An application may include a group of instructions that, when executed by a processor, generates content for presentation to the user. Content generated by an application may be in response to inputs received from the user via movement of the user's eyes or inputs received from the input/output interface 140. Examples of the applications may include gaming applications, conferencing applications, video playback application, or other suitable applications.

Headset tracking module 114 may track movements of near-eye display 120 using slow calibration information from external imaging device 150. For example, headset tracking module 114 may determine positions of a reference point of near-eye display 120 using observed locators from the slow calibration information and a model of near-eye display 120. Headset tracking module 114 may also determine positions of a reference point of near-eye display 120 using position information from the fast calibration information. Additionally, in some embodiments, headset tracking module 114 may use portions of the fast calibration information, the slow calibration information, or any combination thereof, to predict a future location of near-eye display 120. Headset tracking module 114 may provide the estimated or predicted future position of near-eye display 120 to artificial reality engine 116.

Artificial reality engine 116 may execute applications within artificial reality system environment 100 and receive position information of near-eye display 120, acceleration information of near-eye display 120, velocity information of near-eye display 120, predicted future positions of near-eye display 120, or any combination thereof from headset tracking module 114. Artificial reality engine 116 may also receive estimated eye position and orientation information from eye-tracking module 118. Based on the received information, artificial reality engine 116 may determine content to provide to near-eye display 120 for presentation to the user. For example, if the received information indicates that the user has looked to the left, artificial reality engine 116 may generate content for near-eye display 120 that mirrors the user's eye movement in a virtual environment. Additionally, artificial reality engine 116 may perform an action within an application executing on console 110 in response to an action request received from input/output interface 140, and provide feedback to the user indicating that the action has been performed. The feedback may be visual or audible feedback via near-eye display 120 or haptic feedback via input/output interface 140.

Eye-tracking module 118 may receive eye-tracking data from eye-tracking unit 130 and determine the position of the user's eye based on the eye tracking data. The position of the eye may include an eye's orientation, location, or both relative to near-eye display 120 or any element thereof. Because the eye's axes of rotation change as a function of the eye's location in its socket, determining the eye's location in its socket may allow eye-tracking module 118 to determine the eye's orientation more accurately.

Figure 2:
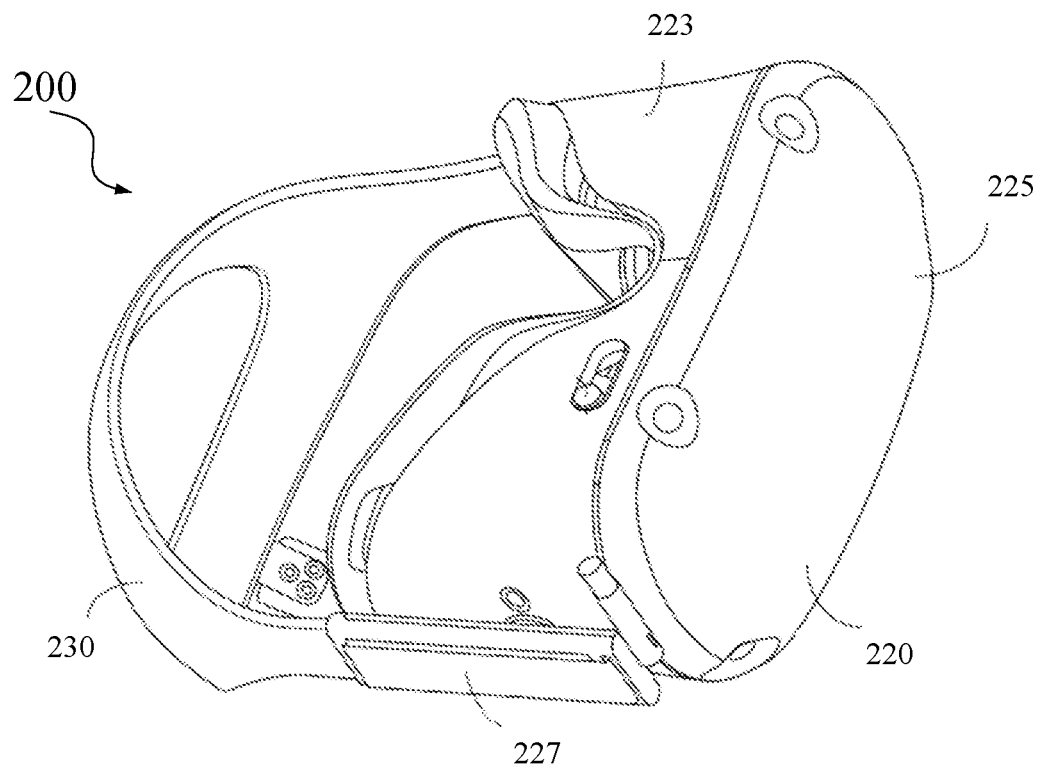
FIG. 2 is a perspective view of an example of a near-eye display in the form of a head-mounted display (HMD) device for implementing some of the examples disclosed herein.

FIG. 2 is a perspective view of an example of a near-eye display in the form of an HMD device 200 for implementing some of the examples disclosed herein. HMD device 200 may be a part of, e.g., a VR system, an AR system, an MR system, or any combination thereof. HMD device 200 may include a body 220 and a head strap 230. FIG. 2 shows a bottom side 223, a front side 225, and a left side 227 of body 220 in the perspective view. Head strap 230 may have an adjustable or extendible length. There may be a sufficient space between body 220 and head strap 230 of HMD device 200 for allowing a user to mount HMD device 200 onto the user's head. In various embodiments, HMD device 200 may include additional, fewer, or different components. For example, in some embodiments, HMD device 200 may include eyeglass temples and temple tips as shown in, for example, FIG. 3 below, rather than head strap 230.

HMD device 200 may present to a user media including virtual and/or augmented views of a physical, real-world environment with computer-generated elements. Examples of the media presented by HMD device 200 may include images (e.g., two-dimensional (2D) or three-dimensional (3D) images), videos (e.g., 2D or 3D videos), audio, or any combination thereof. The images and videos may be presented to each eye of the user by one or more display assemblies (not shown in FIG. 2) enclosed in body 220 of HMD device 200. In various embodiments, the one or more display assemblies may include a single electronic display panel or multiple electronic display panels (e.g., one display panel for each eye of the user). Examples of the electronic display panel(s) may include, for example, an LCD, an OLED display, an ILED display, a µLED display, an AMOLED, a TOLED, some other display, or any combination thereof. HMD device 200 may include two eye box regions.

In some implementations, HMD device 200 may include various sensors (not shown), such as depth sensors, motion sensors, position sensors, and eye tracking sensors. Some of these sensors may use a structured light pattern for sensing. In some implementations, HMD device 200 may include an input/output interface for communicating with a console. In some implementations, HMD device 200 may include a virtual reality engine (not shown) that can execute applications within HMD device 200 and receive depth information, position information, acceleration information, velocity information, predicted future positions, or any combination thereof of HMD device 200 from the various sensors. In some implementations, the information received by the virtual reality engine may be used for producing a signal (e.g., display instructions) to the one or more display assemblies. In some implementations, HMD device 200 may include locators (not shown, such as locators 126) located in fixed positions on body 220 relative to one another and relative to a reference point. Each of the locators may emit light that is detectable by an external imaging device.

Figure 3:
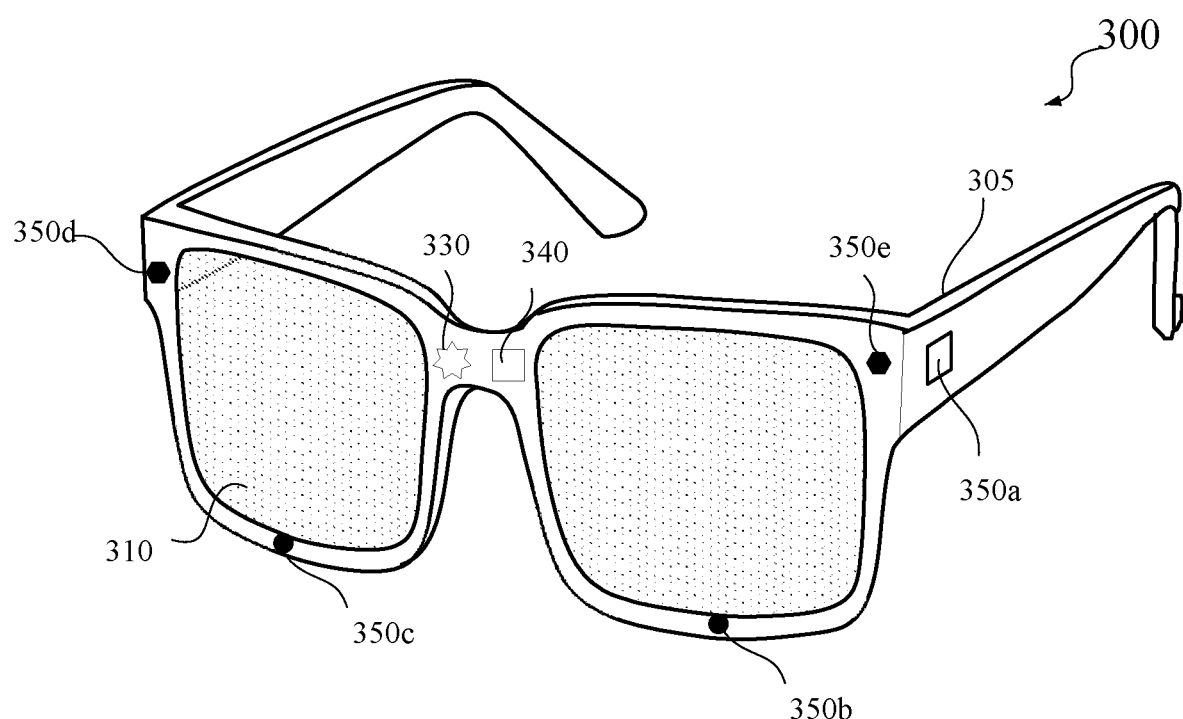
FIG. 3 is a perspective view of an example of a near-eye display in the form of a pair of glasses for implementing some of the examples disclosed herein.

FIG. 3 is a perspective view of an example of a near-eye display 300 in the form of a pair of glasses for implementing some of the examples disclosed herein. Near-eye display 300 may be a specific implementation of near-eye display 120 of FIG. 1, and may be configured to operate as a virtual reality display, an augmented reality display, and/or a mixed reality display. Near-eye display 300 may include a frame 305 and a display 310. Display 310 may be configured to present content to a user. In some embodiments, display 310 may include display electronics and/or display optics. For example, as described above with respect to near-eye display 120 of FIG. 1, display 310 may include an LCD display panel, an LED display panel, or an optical display panel (e.g., a waveguide display assembly).

Near-eye display 300 may further include various sensors 350a, 350b, 350c, 350d, and 350e on or within frame 305. In some embodiments, sensors 350a-350e may include one or more depth sensors, motion sensors, position sensors, inertial sensors, or ambient light sensors. In some embodiments, sensors 350a-350e may include one or more image sensors configured to generate image data representing different fields of views in different directions. In some embodiments, sensors 350a-350e may be used as input devices to control or influence the displayed content of near-eye display 300, and/or to provide an interactive VR/AR/MR experience to a user of near-eye display 300. In some embodiments, sensors 350a-350e may also be used for stereoscopic imaging.

In some embodiments, near-eye display 300 may further include one or more illuminators 330 to project light into the physical environment. The projected light may be associated with different frequency bands (e.g., visible light, infra-red light, ultra-violet light, etc.), and may serve various purposes. For example, illuminator(s) 330 may project light in a dark environment (or in an environment with low intensity of infra-red light, ultra-violet light, etc.) to assist sensors 350a-350e in capturing images of different objects within the dark environment. In some embodiments, illuminator(s) 330 may be used to project certain light patterns onto the objects within the environment. In some embodiments, illuminator(s) 330 may be used as locators, such as locators 126 described above with respect to FIG. 1.

In some embodiments, near-eye display 300 may also include a high-resolution camera 340. Camera 340 may capture images of the physical environment in the field of view. The captured images may be processed, for example, by a virtual reality engine (e.g., artificial reality engine 116 of FIG. 1) to add virtual objects to the captured images or modify physical objects in the captured images, and the processed images may be displayed to the user by display 310 for AR or MR applications.

Figure 4:
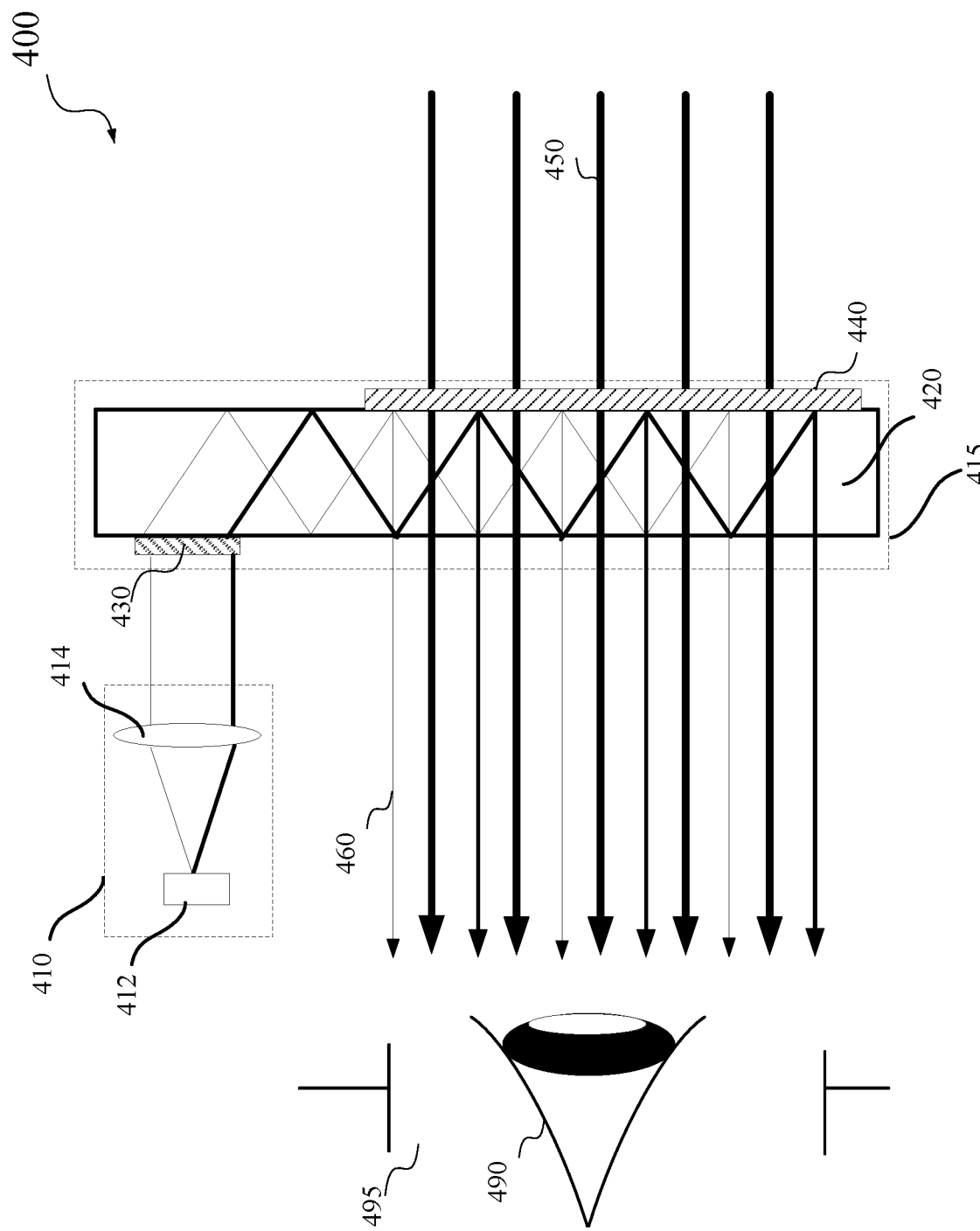
FIG. 4 illustrates an example of an optical see-through augmented reality system including a waveguide display according to certain embodiments.

FIG. 4 illustrates an example of an optical see-through augmented reality system 400 including a waveguide display according to certain embodiments. Augmented reality system 400 may include a projector 410 and a combiner 415. Projector 410 may include a light source or image source 412 and projector optics 414. In some embodiments, light source or image source 412 may include one or more micro-LED devices described above. In some embodiments, image source 412 may include a plurality of pixels that displays virtual objects, such as an LCD display panel or an LED display panel. In some embodiments, image source 412 may include a light source that generates coherent or partially coherent light. For example, image source 412 may include a laser diode, a vertical cavity surface emitting laser, an LED, and/or a micro-LED described above. In some embodiments, image source 412 may include a plurality of light sources (e.g., an array of micro-LEDs described above), each emitting a monochromatic image light corresponding to a primary color (e.g., red, green, or blue). In some embodiments, image source 412 may include three two-dimensional arrays of micro-LEDs, where each two-dimensional array of micro-LEDs may include micro-LEDs configured to emit light of a primary color (e.g., red, green, or blue). In some embodiments, image source 412 may include an optical pattern generator, such as a spatial light modulator. Projector optics 414 may include one or more optical components that can condition the light from image source 412, such as expanding, collimating, scanning, or projecting light from image source 412 to combiner 415. The one or more optical components may include, for example, one or more lenses, liquid lenses, mirrors, apertures, and/or gratings. For example, in some embodiments, image source 412 may include one or more one-dimensional arrays or elongated two-dimensional arrays of micro-LEDs, and projector optics 414 may include one or more one-dimensional scanners (e.g., micro-mirrors or prisms) configured to scan the one-dimensional arrays or elongated two-dimensional arrays of micro-LEDs to generate image frames. In some embodiments, projector optics 414 may include a liquid lens (e.g., a liquid crystal lens) with a plurality of electrodes that allows scanning of the light from image source 412.

Combiner 415 may include an input coupler 430 for coupling light from projector 410 into a substrate 420 of combiner 415. Combiner 415 may transmit at least 50% of light in a first wavelength range and reflect at least 25% of light in a second wavelength range. For example, the first wavelength range may be visible light from about 400 nm to about 650 nm, and the second wavelength range may be in the infrared band, for example, from about 800 nm to about 1000 nm. Input coupler 430 may include a volume holographic grating, a diffractive optical element (DOE) (e.g., a surface-relief grating), a slanted surface of substrate 420, or a refractive coupler (e.g., a wedge or a prism). For example, input coupler 430 may include a reflective volume Bragg grating or a transmissive volume Bragg grating. Input coupler 430 may have a coupling efficiency of greater than 30%, 50%, 75%, 90%, or higher for visible light. Light coupled into substrate 420 may propagate within substrate 420 through, for example, total internal reflection (TIR). Substrate 420 may be in the form of a lens of a pair of eyeglasses. Substrate 420 may have a flat or a curved surface, and may include one or more types of dielectric materials, such as glass, quartz, plastic, polymer, poly(methyl methacrylate) (PMMA), crystal, or ceramic. A thickness of the substrate may range from, for example, less than about 1 mm to about 10 mm or more. Substrate 420 may be transparent to visible light.

Substrate 420 may include or may be coupled to a plurality of output couplers 440, each configured to extract at least a portion of the light guided by and propagating within substrate 420 from substrate 420, and direct extracted light 460 to an eyebox 495 where an eye 490 of the user of augmented reality system 400 may be located when augmented reality system 400 is in use. The plurality of output couplers 440 may replicate the exit pupil to increase the size of eyebox 495 such that the displayed image is visible in a larger area. As input coupler 430, output couplers 440 may include grating couplers (e.g., volume holographic gratings or surface-relief gratings), other diffraction optical elements (DOEs), prisms, etc. For example, output couplers 440 may include reflective volume Bragg gratings or transmissive volume Bragg gratings. Output couplers 440 may have different coupling (e.g., diffraction) efficiencies at different locations. Substrate 420 may also allow light 450 from the environment in front of combiner 415 to pass through with little or no loss. Output couplers 440 may also allow light 450 to pass through with little loss. For example, in some implementations, output couplers 440 may have a very low diffraction efficiency for light 450 such that light 450 may be refracted or otherwise pass through output couplers 440 with little loss, and thus may have a higher intensity than extracted light 460. In some implementations, output couplers 440 may have a high diffraction efficiency for light 450 and may diffract light 450 in certain desired directions (i.e., diffraction angles) with little loss. As a result, the user may be able to view combined images of the environment in front of combiner 415 and images of virtual objects projected by projector 410.

Figure 5B:
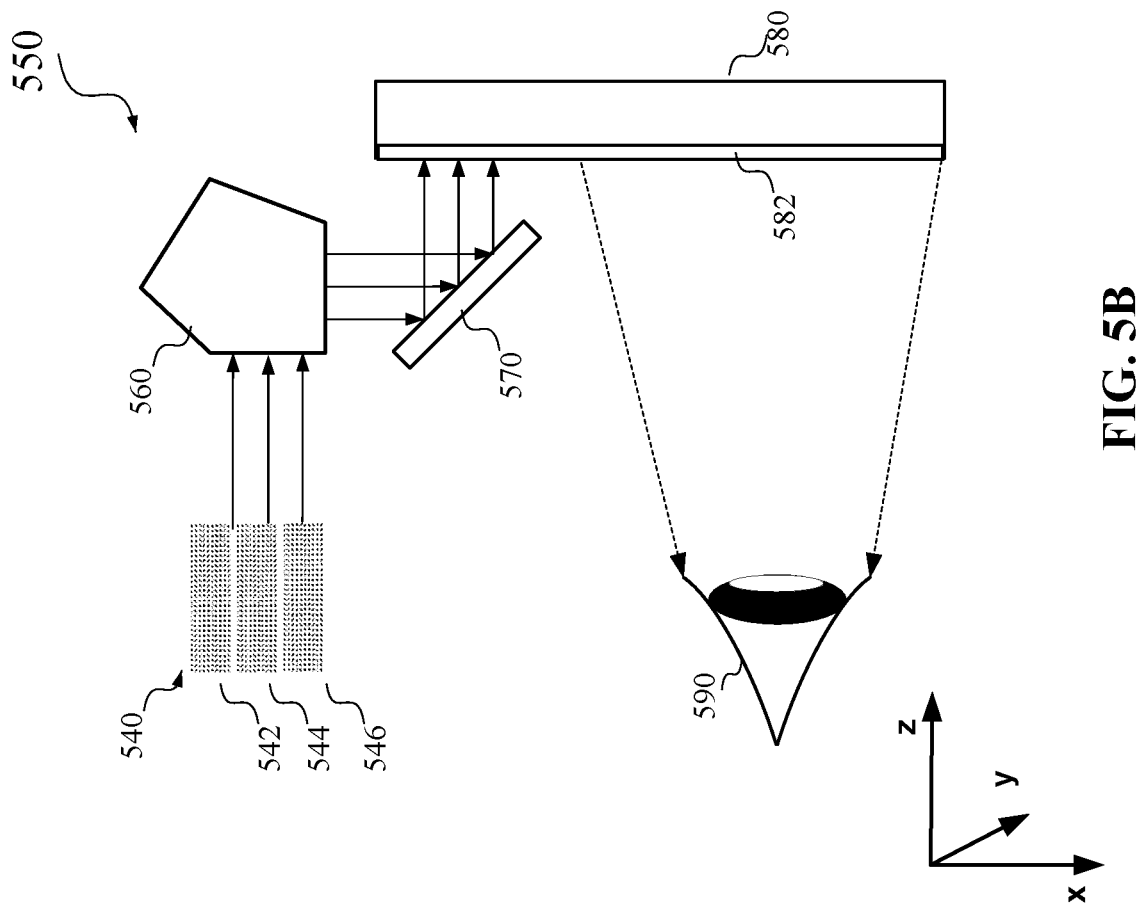
FIG. 5B illustrates an example of a near-eye display device including a waveguide display according to certain embodiments.
Figure 5A:
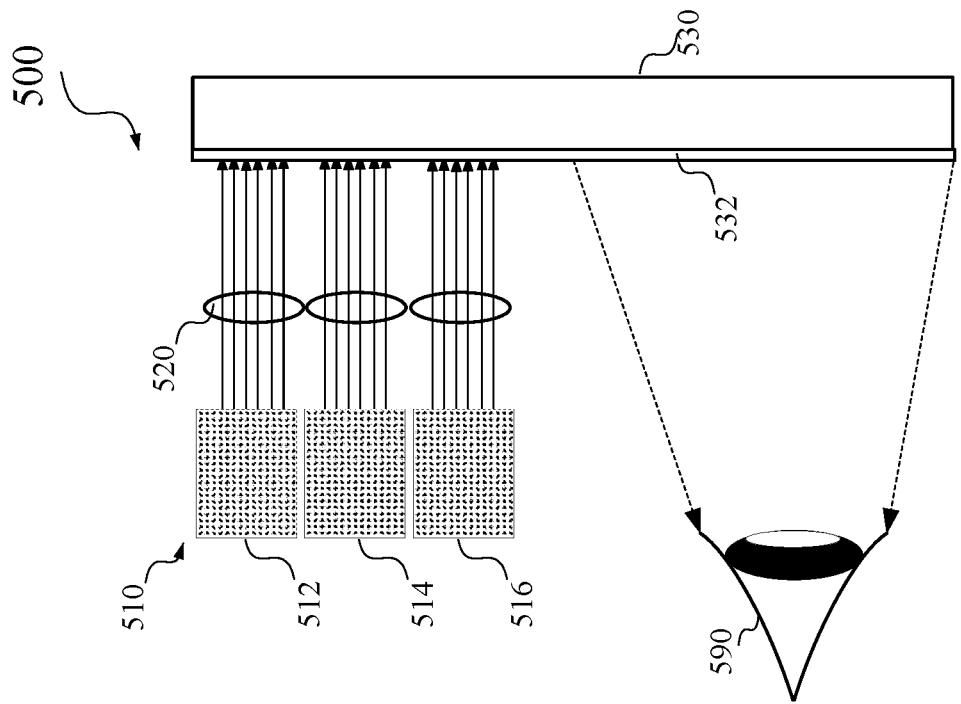
FIG. 5A illustrates an example of a near-eye display device including a waveguide display according to certain embodiments.

FIG. 5A illustrates an example of a near-eye display (NED) device 500 including a waveguide display 530 according to certain embodiments. NED device 500 may be an example of near-eye display 120, augmented reality system 400, or another type of display device. NED device 500 may include a light source 510, projection optics 520, and waveguide display 530. Light source 510 may include multiple panels of light emitters for different colors, such as a panel of red light emitters 512, a panel of green light emitters 514, and a panel of blue light emitters 516. The red light emitters 512 are organized into an array; the green light emitters 514 are organized into an array; and the blue light emitters 516 are organized into an array. The dimensions and pitches of light emitters in light source 510 may be small. For example, each light emitter may have a diameter less than 2 μm (e.g., about 1.2 μm) and the pitch may be less than 2 μm (e.g., about 1.5 μm). As such, the number of light emitters in each red light emitters 512, green light emitters 514, and blue light emitters 516 can be equal to or greater than the number of pixels in a display image, such as 960×720, 1280×720, 1440×1080, 1920×1080, 2160×1080, or 2560×1080 pixels. Thus, a display image may be generated simultaneously by light source 510. A scanning element may not be used in NED device 500.

Before reaching waveguide display 530, the light emitted by light source 510 may be conditioned by projection optics 520, which may include a lens array. Projection optics 520 may collimate or focus the light emitted by light source 510 to waveguide display 530, which may include a coupler 532 for coupling the light emitted by light source 510 into waveguide display 530. The light coupled into waveguide display 530 may propagate within waveguide display 530 through, for example, total internal reflection as described above with respect to FIG. 4. Coupler 532 may also couple portions of the light propagating within waveguide display 530 out of waveguide display 530 and towards user's eye 590.

FIG. 5B illustrates an example of a near-eye display (NED) device 550 including a waveguide display 580 according to certain embodiments. In some embodiments, NED device 550 may use a scanning mirror 570 to project light from a light source 540 to an image field where a user's eye 590 may be located. NED device 550 may be an example of near-eye display 120, augmented reality system 400, or another type of display device. Light source 540 may include one or more rows or one or more columns of light emitters of different colors, such as multiple rows of red light emitters 542, multiple rows of green light emitters 544, and multiple rows of blue light emitters 546. For example, red light emitters 542, green light emitters 544, and blue light emitters 546 may each include N rows, each row including, for example, 2560 light emitters (pixels). The red light emitters 542 are organized into an array; the green light emitters 544 are organized into an array; and the blue light emitters 546 are organized into an array. In some embodiments, light source 540 may include a single line of light emitters for each color. In some embodiments, light source 540 may include multiple columns of light emitters for each of red, green, and blue colors, where each column may include, for example, 1080 light emitters. In some embodiments, the dimensions and/or pitches of the light emitters in light source 540 may be relatively large (e.g., about 3-5 μm) and thus light source 540 may not include sufficient light emitters for simultaneously generating a full display image. For example, the number of light emitters for a single color may be fewer than the number of pixels (e.g., 2560×1080 pixels) in a display image. The light emitted by light source 540 may be a set of collimated or diverging beams of light.

Before reaching scanning mirror 570, the light emitted by light source 540 may be conditioned by various optical devices, such as collimating lenses or a freeform optical element 560. Freeform optical element 560 may include, for example, a multi-facet prism or another light folding element that may direct the light emitted by light source 540 towards scanning mirror 570, such as changing the propagation direction of the light emitted by light source 540 by, for example, about 90° or larger. In some embodiments, freeform optical element 560 may be rotatable to scan the light. Scanning mirror 570 and/or freeform optical element 560 may reflect and project the light emitted by light source 540 to waveguide display 580, which may include a coupler 582 for coupling the light emitted by light source 540 into waveguide display 580. The light coupled into waveguide display 580 may propagate within waveguide display 580 through, for example, total internal reflection as described above with respect to FIG. 4. Coupler 582 may also couple portions of the light propagating within waveguide display 580 out of waveguide display 580 and towards user's eye 590.

Scanning mirror 570 may include a microelectromechanical system (MEMS) mirror or any other suitable mirrors. Scanning mirror 570 may rotate to scan in one or two dimensions. As scanning mirror 570 rotates, the light emitted by light source 540 may be directed to a different area of waveguide display 580 such that a full display image may be projected onto waveguide display 580 and directed to user's eye 590 by waveguide display 580 in each scanning cycle. For example, in embodiments where light source 540 includes light emitters for all pixels in one or more rows or columns, scanning mirror 570 may be rotated in the column or row direction (e.g., x or y direction) to scan an image. In embodiments where light source 540 includes light emitters for some but not all pixels in one or more rows or columns, scanning mirror 570 may be rotated in both the row and column directions (e.g., both x and y directions) to project a display image (e.g., using a raster-type scanning pattern).

NED device 550 may operate in predefined display periods. A display period (e.g., display cycle) may refer to a duration of time in which a full image is scanned or projected. For example, a display period may be a reciprocal of the desired frame rate. In NED device 550 that includes scanning mirror 570, the display period may also be referred to as a scanning period or scanning cycle. The light generation by light source 540 may be synchronized with the rotation of scanning mirror 570. For example, each scanning cycle may include multiple scanning steps, where light source 540 may generate a different light pattern in each respective scanning step.

In each scanning cycle, as scanning mirror 570 rotates, a display image may be projected onto waveguide display 580 and user's eye 590. The actual color value and light intensity (e.g., brightness) of a given pixel location of the display image may be an average of the light beams of the three colors (e.g., red, green, and blue) illuminating the pixel location during the scanning period. After completing a scanning period, scanning mirror 570 may revert back to the initial position to project light for the first few rows of the next display image or may rotate in a reverse direction or scan pattern to project light for the next display image, where a new set of driving signals may be fed to light source 540. The same process may be repeated as scanning mirror 570 rotates in each scanning cycle. As such, different images may be projected to user's eye 590 in different scanning cycles.

Figure 6:
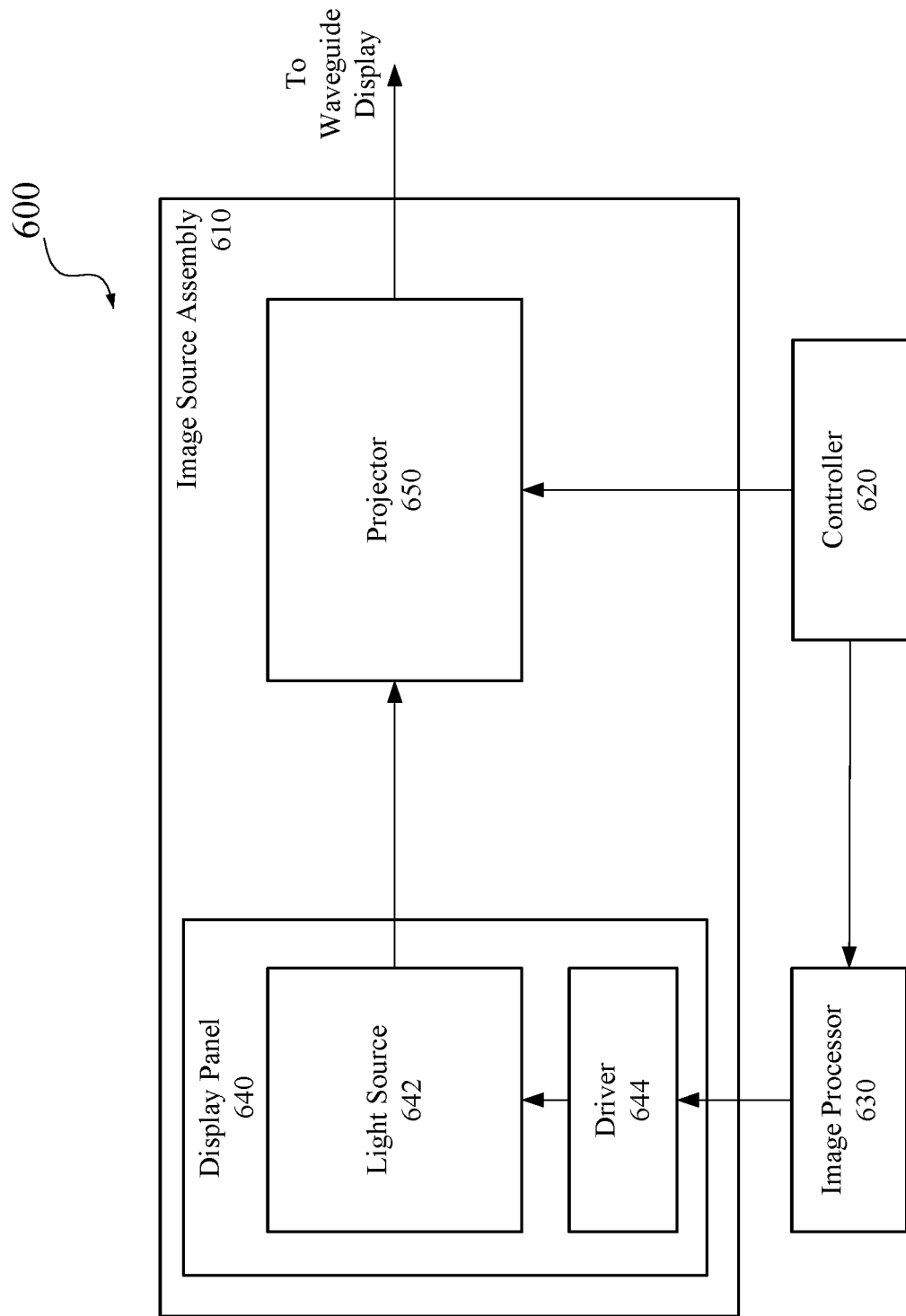
FIG. 6 illustrates an example of an image source assembly in an augmented reality system according to certain embodiments.

FIG. 6 illustrates an example of an image source assembly 610 in a near-eye display system 600 according to certain embodiments. Image source assembly 610 may include, for example, a display panel 640 that may generate display images to be projected to the user's eyes, and a projector 650 that may project the display images generated by display panel 640 to a waveguide display as described above with respect to FIGS. 4-5B. Display panel 640 may include a light source 642 and a drive circuit 644 for light source 642. Light source 642 may include, for example, light source 510 or 540. Projector 650 may include, for example, freeform optical element 560, scanning mirror 570, and/or projection optics 520 described above. Near-eye display system 600 may also include a controller 620 that synchronously controls light source 642 and projector 650 (e.g., scanning mirror 570). Image source assembly 610 may generate and output an image light to a waveguide display (not shown in FIG. 6), such as waveguide display 530 or 580. As described above, the waveguide display may receive the image light at one or more input-coupling elements, and guide the received image light to one or more output-coupling elements. The input and output coupling elements may include, for example, a diffraction grating, a holographic grating, a prism, or any combination thereof. The input-coupling element may be chosen such that total internal reflection occurs with the waveguide display. The output-coupling element may couple portions of the total internally reflected image light out of the waveguide display.

As described above, light source 642 may include a plurality of light emitters arranged in an array or a matrix. Each light emitter may emit monochromatic light, such as red light, blue light, green light, infra-red light, and the like. While RGB colors are often discussed in this disclosure, embodiments described herein are not limited to using red, green, and blue as primary colors. Other colors can also be used as the primary colors of near-eye display system 600. In some embodiments, a display panel in accordance with an embodiment may use more than three primary colors. Each pixel in light source 642 may include three subpixels that include a red micro-LED, a green micro-LED, and a blue micro-LED. A semiconductor LED generally includes an active light emitting layer within multiple layers of semiconductor materials. The multiple layers of semiconductor materials may include different compound materials or a same base material with different dopants and/or different doping densities. For example, the multiple layers of semiconductor materials may include an n-type material layer, an active region that may include hetero-structures (e.g., one or more quantum wells), and a p-type material layer. The multiple layers of semiconductor materials may be grown on a surface of a substrate having a certain orientation. In some embodiments, to increase light extraction efficiency, a mesa that includes at least some of the layers of semiconductor materials may be formed.

Controller 620 may control the image rendering operations of image source assembly 610, such as the operations of light source 642 and/or projector 650. For example, controller 620 may determine instructions for image source assembly 610 to render one or more display images. The instructions may include display instructions and scanning instructions. In some embodiments, the display instructions may include an image file (e.g., a bitmap file). The display instructions may be received from, for example, a console, such as console 110 described above with respect to FIG. 1. The scanning instructions may be used by image source assembly 610 to generate image light. The scanning instructions may specify, for example, a type of a source of image light (e.g., monochromatic or polychromatic), a scanning rate, an orientation of a scanning apparatus, one or more illumination parameters, or any combination thereof. Controller 620 may include a combination of hardware, software, and/or firmware not shown here so as not to obscure other aspects of the present disclosure.

In some embodiments, controller 620 may be a graphics processing unit (GPU) of a display device. In other embodiments, controller 620 may be other kinds of processors. The operations performed by controller 620 may include taking content for display and dividing the content into discrete sections. Controller 620 may provide to light source 642 scanning instructions that include an address corresponding to an individual source element of light source 642 and/or an electrical bias applied to the individual source element. Controller 620 may instruct light source 642 to sequentially present the discrete sections using light emitters corresponding to one or more rows of pixels in an image ultimately displayed to the user. Controller 620 may also instruct projector 650 to perform different adjustments of the light. For example, controller 620 may control projector 650 to scan the discrete sections to different areas of a coupling element of the waveguide display (e.g., waveguide display 580) as described above with respect to FIG. 5B. As such, at the exit pupil of the waveguide display, each discrete portion is presented in a different respective location. While each discrete section is presented at a different respective time, the presentation and scanning of the discrete sections occur fast enough such that a user's eye may integrate the different sections into a single image or series of images.

Image processor 630 may be a general-purpose processor and/or one or more application-specific circuits that are dedicated to performing the features described herein. In one embodiment, a general-purpose processor may be coupled to a memory to execute software instructions that cause the processor to perform certain processes described herein. In another embodiment, image processor 630 may be one or more circuits that are dedicated to performing certain features. While image processor 630 in FIG. 6 is shown as a stand-alone unit that is separate from controller 620 and drive circuit 644, image processor 630 may be a sub-unit of controller 620 or drive circuit 644 in other embodiments. In other words, in those embodiments, controller 620 or drive circuit 644 may perform various image processing functions of image processor 630. Image processor 630 may also be referred to as an image processing circuit.

In the example shown in FIG. 6, light source 642 may be driven by drive circuit 644, based on data or instructions (e.g., display and scanning instructions) sent from controller 620 or image processor 630. In one embodiment, drive circuit 644 may include a circuit panel that connects to and mechanically holds various light emitters of light source 642. Light source 642 may emit light in accordance with one or more illumination parameters that are set by the controller 620 and potentially adjusted by image processor 630 and drive circuit 644. An illumination parameter may be used by light source 642 to generate light. An illumination parameter may include, for example, source wavelength, pulse rate, pulse amplitude, beam type (continuous or pulsed), other parameter(s) that may affect the emitted light, or any combination thereof. In some embodiments, the source light generated by light source 642 may include multiple beams of red light, green light, and blue light, or any combination thereof.

Projector 650 may perform a set of optical functions, such as focusing, combining, conditioning, or scanning the image light generated by light source 642. In some embodiments, projector 650 may include a combining assembly, a light conditioning assembly, or a scanning mirror assembly. Projector 650 may include one or more optical components that optically adjust and potentially re-direct the light from light source 642. One example of the adjustment of light may include conditioning the light, such as expanding, collimating, correcting for one or more optical errors (e.g., field curvature, chromatic aberration, etc.), some other adjustments of the light, or any combination thereof. The optical components of projector 650 may include, for example, lenses, mirrors, apertures, gratings, or any combination thereof.

Projector 650 may redirect image light via its one or more reflective and/or refractive portions so that the image light is projected at certain orientations toward the waveguide display. The location where the image light is redirected toward the waveguide display may depend on specific orientations of the one or more reflective and/or refractive portions. In some embodiments, projector 650 includes a single scanning mirror that scans in at least two dimensions. In other embodiments, projector 650 may include a plurality of scanning mirrors that each scan in directions orthogonal to each other. Projector 650 may perform a raster scan (horizontally or vertically), a bi-resonant scan, or any combination thereof. In some embodiments, projector 650 may perform a controlled vibration along the horizontal and/or vertical directions with a specific frequency of oscillation to scan along two dimensions and generate a two-dimensional projected image of the media presented to user's eyes. In other embodiments, projector 650 may include a lens or prism that may serve similar or the same function as one or more scanning mirrors. In some embodiments, image source assembly 610 may not include a projector, where the light emitted by light source 642 may be directly incident on the waveguide display.

The overall efficiency of a photonic integrated circuit or a waveguide-based display (e.g., in augmented reality system 400 or NED device 500 or 550) may be a product of the efficiency of individual components and may also depend on how the components are connected. For example, the overall efficiency $\eta_{tot}$ of the waveguide-based display in augmented reality system 400 may depend on the light emitting efficiency of image source 412, the light coupling efficiency from image source 412 into combiner 415 by projector optics 414 and input coupler 430, and the output coupling efficiency of output coupler 440, and thus may be determined as:

$$\eta_{tot} = \eta_{EQE} \times \eta_{in} \times \eta_{out}, \qquad (1)$$

where $\eta_{EQE}$ is the external quantum efficiency of image source 412, $\eta_{in}$ is the in-coupling efficiency of light from image source 412 into the waveguide (e.g., substrate 420), and $\eta_{out}$ is the outcoupling efficiency of light from the waveguide towards the user's eye by output coupler 440. Thus, the overall efficiency $\eta_{tot}$ of the waveguide-based display can be improved by improving one or more of $\eta_{EQE}$, $\eta_{in}$, and $\eta_{out}$.

The optical coupler (e.g., input coupler 430 or coupler 532) that couples the emitted light from a light source to a waveguide may include, for example, a grating, a lens, a micro-lens, and/or a prism. In some embodiments, light from a small light source (e.g., a micro-LED) can be directly (e.g., end-to-end) coupled from the light source to a waveguide, without using an optical coupler. In some embodiments, the optical coupler (e.g., a lens or a parabolic-shaped reflector) may be manufactured on the light source.

The light sources, image sources, or other displays described above may include one or more LEDs. For example, each pixel in a display may include three subpixels that include a red micro-LED, a green micro-LED, and a blue micro-LED. A semiconductor light emitting diode generally includes an active light emitting layer within multiple layers of semiconductor materials. The multiple layers of semiconductor materials may include different compound materials or a same base material with different dopants and/or different doping densities. For example, the multiple layers of semiconductor materials may generally include an n-type material layer, an active layer that may include hetero-structures (e.g., one or more quantum wells), and a p-type material layer. The multiple layers of semiconductor materials may be grown on a surface of a substrate having a certain orientation.

Photons can be generated in a semiconductor LED (e.g., a micro-LED) at a certain internal quantum efficiency through the recombination of electrons and holes within the active layer (e.g., including one or more semiconductor layers). The generated light may then be extracted from the LEDs. The ratio between the number of emitted photons extracted from the LED and the number of electrons passing through the LED is referred to as the external quantum efficiency, which describes how efficiently the LED converts injected electrons to photons that are extracted from the device. The external quantum efficiency may be proportional to the carrier injection efficiency, the internal quantum efficiency, and the light extraction efficiency. The carrier injection efficiency refers to the proportion of electrons passing through the device that are injected into the active region. The light extraction efficiency is the proportion of photons generated in the active region that escape from the device. For LEDs, and in particular, micro-LEDs with reduced physical dimensions, improving the internal and external quantum efficiency can be challenging. In some embodiments, to increase the light extraction efficiency of an LED, a mesa structure may be etched in semiconductor epitaxial layers, and light extraction structures (e.g., reflectors, lenses, and/or rough surfaces) may be formed on the mesa structure.

Figure 7A:
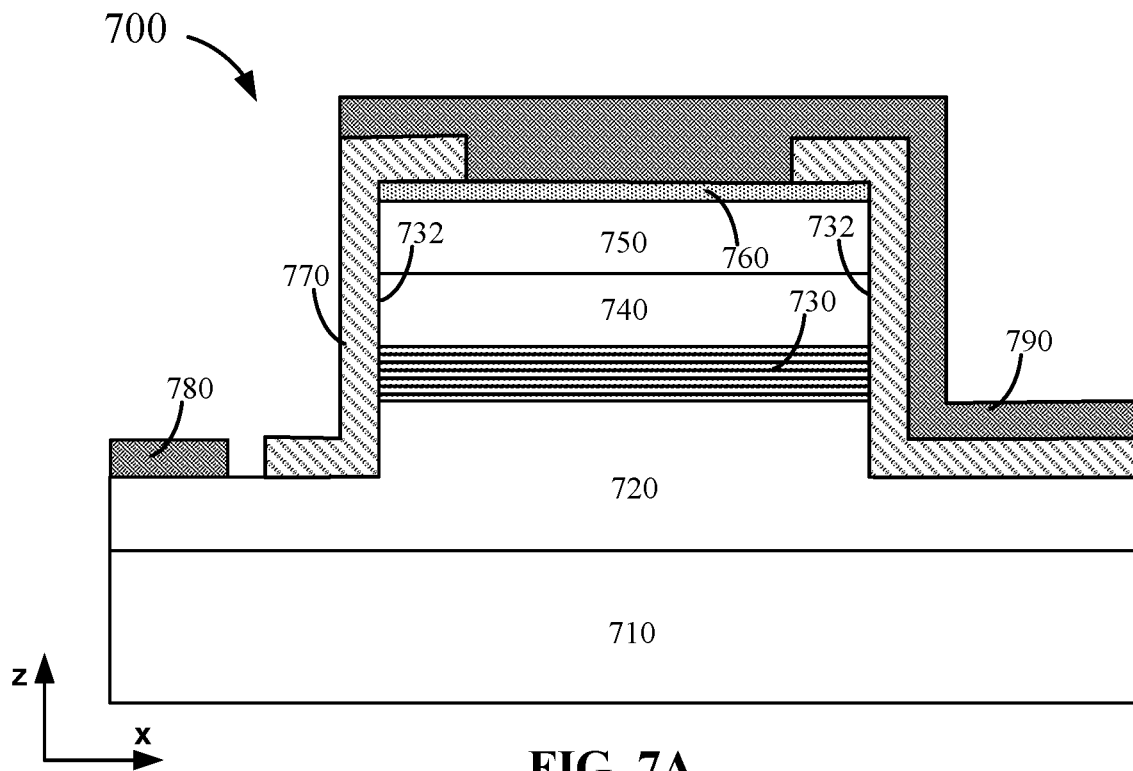
FIG. 7A illustrates an example of a light emitting diode (LED) having a vertical mesa structure according to certain embodiments.

FIG. 7A illustrates an example of an LED 700 having a vertical mesa structure. LED 700 may be a light emitter in light source 510, 540, or 642. LED 700 may be a micro-LED made of inorganic materials, such as multiple layers of semiconductor materials. The layered semiconductor light emitting device may include multiple layers of III-V semiconductor materials. A III-V semiconductor material may include one or more Group III elements, such as aluminum (Al), gallium (Ga), or indium (In), in combination with a Group V element, such as nitrogen (N), phosphorus (P), arsenic (As), or antimony (Sb). When the Group V element of the III-V semiconductor material includes nitrogen, the III-V semiconductor material is referred to as a III-nitride material. The layered semiconductor light emitting device may be manufactured by growing multiple epitaxial layers on a substrate using techniques such as vapor-phase epitaxy (VPE), liquid-phase epitaxy (LPE), molecular beam epitaxy (MBE), or metalorganic chemical vapor deposition (MOCVD). For example, the layers of the semiconductor materials may be grown layer-by-layer on a substrate with a certain crystal lattice orientation (e.g., polar, nonpolar, or semi-polar orientation), such as a GaN, GaAs, or GaP substrate, or a substrate including, but not limited to, sapphire, silicon carbide, silicon, zinc oxide, boron nitride, lithium aluminate, lithium niobate, germanium, aluminum nitride, lithium gallate, partially substituted spinels, or quaternary tetragonal oxides sharing the beta-LiAlO$_2$ structure, where the substrate may be cut in a specific direction to expose a specific plane as the growth surface.

In the example shown in FIG. 7A, LED 700 may include a substrate 710, which may include, for example, a sapphire substrate or a GaN substrate. A semiconductor layer 720 may be grown on substrate 710. Semiconductor layer 720 may include a III-V material, such as GaN, and may be p-doped (e.g., with Mg, Ca, Zn, or Be) or n-doped (e.g., with Si or Ge). One or more active layers 730 may be grown on semiconductor layer 720 to form an active region. Active layer 730 may include III-V materials, such as one or more InGaN layers, one or more AlGaInP layers, and/or one or more GaN layers, which may form one or more heterostructures, such as one or more quantum wells or MQWs. A semiconductor layer 740 may be grown on active layer 730. Semiconductor layer 740 may include a III-V material, such as GaN, and may be p-doped (e.g., with Mg, Ca, Zn, or Be) or n-doped (e.g., with Si or Ge). One of semiconductor layer 720 and semiconductor layer 740 may be a p-type layer and the other one may be an n-type layer. Semiconductor layer 720 and semiconductor layer 740 sandwich active layer 730 to form the light emitting region. For example, LED 700 may include a layer of InGaN situated between a layer of p-type GaN doped with magnesium and a layer of n-type GaN doped with silicon or oxygen. In some embodiments, LED 700 may include a layer of AlGaInP situated between a layer of p-type AlGaInP doped with zinc or magnesium and a layer of n-type AlGaInP doped with selenium, silicon, or tellurium.

In some embodiments, an electron-blocking layer (EBL) (not shown in FIG. 7A) may be grown to form a layer between active layer 730 and at least one of semiconductor layer 720 or semiconductor layer 740. The EBL may reduce the electron leakage current and improve the efficiency of the LED. In some embodiments, a heavily-doped semiconductor layer 750, such as a $P^+$ or $P^{++}$ semiconductor layer, may be formed on semiconductor layer 740 and act as a contact layer for forming an ohmic contact and reducing the contact impedance of the device. In some embodiments, a conductive layer 760 may be formed on heavily-doped semiconductor layer 750. Conductive layer 760 may include, for example, an indium tin oxide (ITO) or Al/Ni/Au film. In one example, conductive layer 760 may include a transparent ITO layer.

To make contact with semiconductor layer 720 (e.g., an n-GaN layer) and to more efficiently extract light emitted by active layer 730 from LED 700, the semiconductor material layers (including heavily-doped semiconductor layer 750, semiconductor layer 740, active layer 730, and semiconductor layer 720) may be etched to expose semiconductor layer 720 and to form a mesa structure that includes layers 720-760. The mesa structure may confine the carriers within the device. Etching the mesa structure may lead to the formation of mesa sidewalls 732 that may be orthogonal to the growth planes. A passivation layer 770 may be formed on mesa sidewalls 732 of the mesa structure. Passivation layer 770 may include an oxide layer, such as a SiO$_2$ layer, and may act as a reflector to reflect emitted light out of LED 700. A contact layer 780, which may include a metal layer, such as Al, Au, Ni, Ti, or any combination thereof, may be formed on semiconductor layer 720 and may act as an electrode of LED 700. In addition, another contact layer 790, such as an Al/Ni/Au metal layer, may be formed on conductive layer 760 and may act as another electrode of LED 700.

When a voltage signal is applied to contact layers 780 and 790, electrons and holes may recombine in active layer 730, where the recombination of electrons and holes may cause photon emission. The wavelength and energy of the emitted photons may depend on the energy bandgap between the valence band and the conduction band in active layer 730. For example, InGaN active layers may emit green or blue light, AlGaN active layers may emit blue to ultraviolet light, while AlGaInP active layers may emit red, orange, yellow, or green light. The emitted photons may be reflected by passivation layer 770 and may exit LED 700 from the top (e.g., conductive layer 760 and contact layer 790) or bottom (e.g., substrate 710).

In some embodiments, LED 700 may include one or more other components, such as a lens, on the light emission surface, such as substrate 710, to focus or collimate the emitted light or couple the emitted light into a waveguide. In some embodiments, an LED may include a mesa of another shape, such as planar, conical, semi-parabolic, or parabolic, and a base area of the mesa may be circular, rectangular, hexagonal, or triangular. For example, the LED may include a mesa of a curved shape (e.g., paraboloid shape) and/or a non-curved shape (e.g., conic shape). The mesa may be truncated or non-truncated.

Figure 7B:
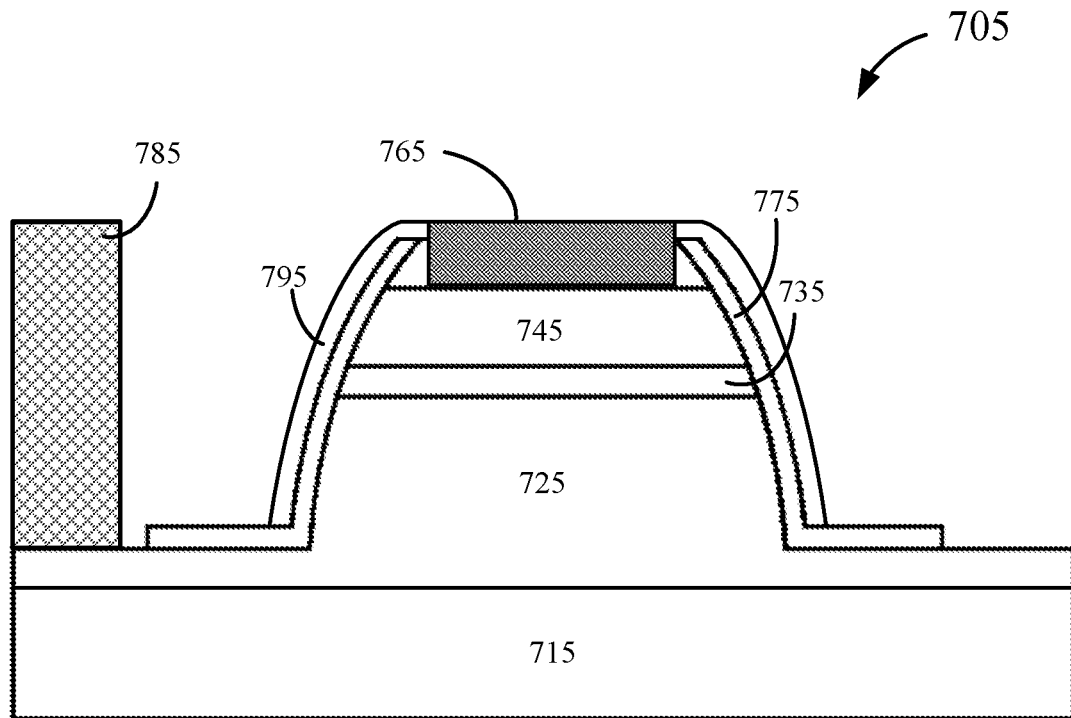
FIG. 7B is a cross-sectional view of an example of an LED having a parabolic mesa structure according to certain embodiments.

FIG. 7B is a cross-sectional view of an example of an LED 705 having a parabolic mesa structure. Similar to LED 700, LED 705 may include multiple layers of semiconductor materials, such as multiple layers of III-V semiconductor materials. The semiconductor material layers may be epitaxially grown on a substrate 715, such as a GaN substrate or a sapphire substrate. For example, a semiconductor layer 725 may be grown on substrate 715. Semiconductor layer 725 may include a III-V material, such as GaN, and may be p-doped (e.g., with Mg, Ca, Zn, or Be) or n-doped (e.g., with Si or Ge). One or more active layer 735 may be grown on semiconductor layer 725. Active layer 735 may include III-V materials, such as one or more InGaN layers, one or more AlGaInP layers, and/or one or more GaN layers, which may form one or more heterostructures, such as one or more quantum wells. A semiconductor layer 745 may be grown on active layer 735. Semiconductor layer 745 may include a III-V material, such as GaN, and may be p-doped (e.g., with Mg, Ca, Zn, or Be) or n-doped (e.g., with Si or Ge). One of semiconductor layer 725 and semiconductor layer 745 may be a p-type layer and the other one may be an n-type layer.

To make contact with semiconductor layer 725 (e.g., an n-type GaN layer) and to more efficiently extract light emitted by active layer 735 from LED 705, the semiconductor layers may be etched to expose semiconductor layer 725 and to form a mesa structure that includes layers 725-745. The mesa structure may confine carriers within the injection area of the device. Etching the mesa structure may lead to the formation of mesa side walls (also referred to herein as facets) that may be non-parallel with, or in some cases, orthogonal, to the growth planes associated with crystalline growth of layers 725-745.

As shown in FIG. 7B, LED 705 may have a mesa structure that includes a flat top. A dielectric layer 775 (e.g., SiO₂ or SiN) may be formed on the facets of the mesa structure. In some embodiments, dielectric layer 775 may include multiple layers of dielectric materials. In some embodiments, a metal layer 795 may be formed on dielectric layer 775. Metal layer 795 may include one or more metal or metal alloy materials, such as aluminum (Al), silver (Ag), gold (Au), platinum (Pt), titanium (Ti), copper (Cu), or any combination thereof. Dielectric layer 775 and metal layer 795 may form a mesa reflector that can reflect light emitted by active layer 735 toward substrate 715. In some embodiments, the mesa reflector may be parabolic-shaped to act as a parabolic reflector that may at least partially collimate the emitted light.

Electrical contact 765 and electrical contact 785 may be formed on semiconductor layer 745 and semiconductor layer 725, respectively, to act as electrodes. Electrical contact 765 and electrical contact 785 may each include a conductive material, such as Al, Au, Pt, Ag, Ni, Ti, Cu, or any combination thereof (e.g., Ag/Pt/Au or Al/Ni/Au), and may act as the electrodes of LED 705. In the example shown in FIG. 7B, electrical contact 785 may be an n-contact, and electrical contact 765 may be a p-contact. Electrical contact 765 and semiconductor layer 745 (e.g., a p-type semiconductor layer) may form a back reflector for reflecting light emitted by active layer 735 back toward substrate 715. In some embodiments, electrical contact 765 and metal layer 795 include same material(s) and can be formed using the same processes. In some embodiments, an additional conductive layer (not shown) may be included as an intermediate conductive layer between the electrical contacts 765 and 785 and the semiconductor layers.

When a voltage signal is applied across electrical contacts 765 and 785, electrons and holes may recombine in active layer 735. The recombination of electrons and holes may cause photon emission, thus producing light. The wavelength and energy of the emitted photons may depend on the energy bandgap between the valence band and the conduction band in active layer 735. For example, InGaN active layers may emit green or blue light, while AlGaInP active layers may emit red, orange, yellow, or green light. The emitted photons may propagate in many different directions, and may be reflected by the mesa reflector and/or the back reflector and may exit LED 705, for example, from the bottom side (e.g., substrate 715) shown in FIG. 7B. One or more other secondary optical components, such as a lens or a grating, may be formed on the light emission surface, such as substrate 715, to focus or collimate the emitted light and/or couple the emitted light into a waveguide.

When the mesa structure is formed (e.g., etched), the facets of the mesa structure, such as mesa sidewalls 732, may have high defect densities due to the abrupt ending of the lattice structure, chemical contamination, and/or structural damages (e.g., due to dry etch). For example, in plasma etching, high-energy ions may be used to bombard the exposed surfaces of semiconductor layers. Due to the bombardment by high-energy particles, the surfaces created by the etching may be highly damaged, where the damages may include alterations to the crystal structure or other modifications to the surfaces, such as dangling-bonds, surface oxides, surfaces modified by plasma atoms, lattice dislocations, vacancies, interstitial defects, and substitutional defects. The damages may extend into the interior of the mesa structure, such as about 50 nm to about 500 nm below the new surfaces formed by the etching. Therefore, the active region in proximity to the exposed sidewalls may have a higher density of defects, such as dislocations, dangling bonds, pores, grain boundaries, vacancies, inclusion of precipitates, and the like. The defects may introduce energy states having deep or shallow energy levels in the bandgap that otherwise would not exist within the bandgap of the semiconductor material. Carriers may be trapped by these energy states until they recombine non-radiatively. Thus, these imperfections may become the recombination centers where electrons and holes may be confined until they combine non-radiatively. Therefore, the active region in proximity to the exposed sidewalls may have a higher rate of SRH recombination, thereby reducing the efficiency of the resulting LED.

Figures 8A, 8B:
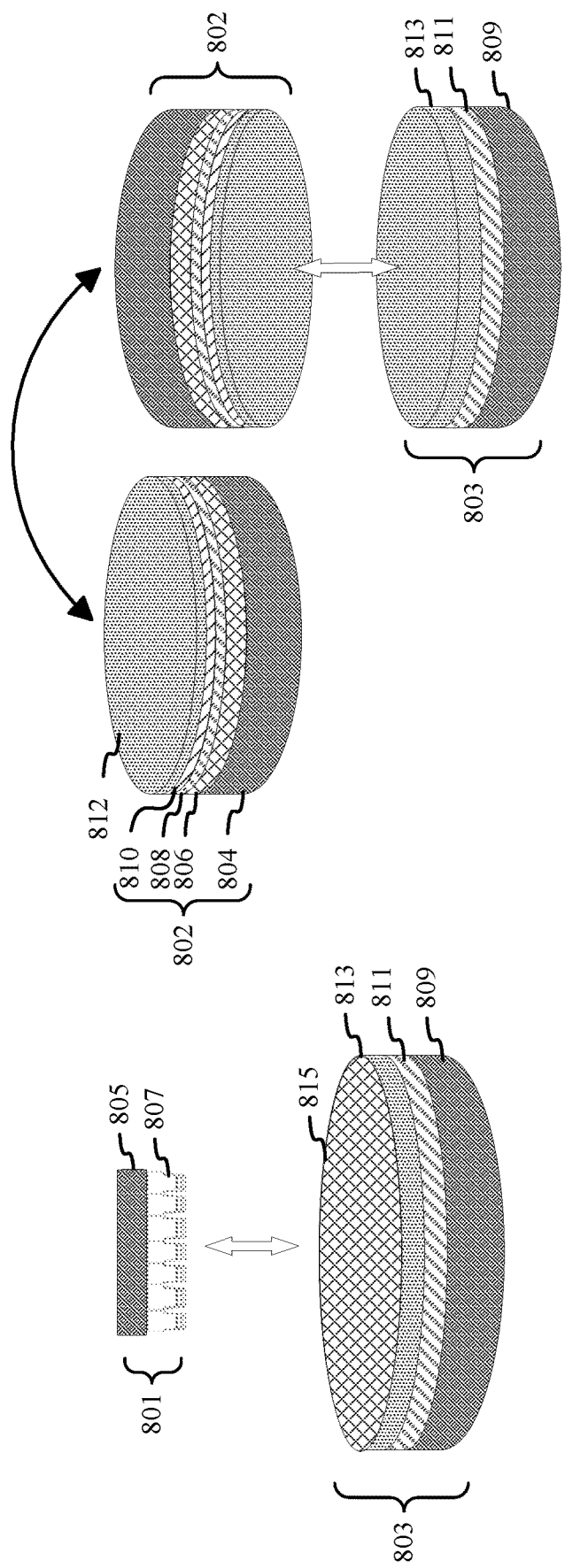
FIG. 8A illustrates an example of a method of die-to-wafer bonding for arrays of LEDs according to certain embodiments.
FIG. 8B illustrates an example of a method of wafer-to-wafer bonding for arrays of LEDs according to certain embodiments.

FIG. 8A illustrates an example of a method of die-to-wafer bonding for arrays of LEDs according to certain embodiments. In the example shown in FIG. 8A, an LED array 801 may include a plurality of LEDs 807 on a carrier substrate 805. Carrier substrate 805 may include various materials, such as GaAs, InP, GaN, AlN, sapphire, SiC, Si, or the like. LEDs 807 may be fabricated by, for example, growing various epitaxial layers, forming mesa structures, and forming electrical contacts or electrodes, before performing the bonding. The epitaxial layers may include various materials, such as GaN, InGaN, (AlGaIn)P, (AlGaIn)AsP, (AlGaIn)AsN, (Eu:InGa)N, (AlGaIn)N, or the like, and may include an n-type layer, a p-type layer, and an active layer that includes one or more heterostructures, such as one or more quantum wells or MQWs. The electrical contacts may include various conductive materials, such as a metal, a metal alloy, a conductive nitride (e.g., a nitride of a transitional metal), or a transparent conductive coating (e.g., an oxide such as ITO).

A wafer 803 may include a base layer 809 having passive or active integrated circuits (e.g., drive circuits 811) fabricated thereon. Base layer 809 may include, for example, a silicon wafer. Drive circuits 811 may be used to control the operations of LEDs 807. For example, the drive circuit for each LED 807 may include a 2T1C pixel structure that has two transistors and one capacitor. Wafer 803 may also include a bonding layer 813. Bonding layer 813 may include various materials, such as a metal, an oxide, a dielectric, CuSn, AuTi, and the like. In some embodiments, a patterned layer 815 may be formed on a surface of bonding layer 813, where patterned layer 815 may include a metallic grid made of a conductive material, such as Cu, Ag, Au, Al, or the like.

LED array 801 may be bonded to wafer 803 via bonding layer 813 or patterned layer 815. For example, patterned layer 815 may include metal pads or bumps made of various materials, such as CuSn, AuSn, or nanoporous Au, that may be used to align LEDs 807 of LED array 801 with corresponding drive circuits 811 on wafer 803. In one example, LED array 801 may be brought toward wafer 803 until LEDs 807 come into contact with respective metal pads or bumps corresponding to drive circuits 811. Some or all of LEDs 807 may be aligned with drive circuits 811, and may then be bonded to wafer 803 via patterned layer 815 by various bonding techniques, such as metal-to-metal bonding. After LEDs 807 have been bonded to wafer 803, carrier substrate 805 may be removed from LEDs 807.

FIG. 8B illustrates an example of a method of wafer-to-wafer bonding for arrays of LEDs according to certain embodiments. As shown in FIG. 8B, a first wafer 802 may include a substrate 804, a first semiconductor layer 806, active layers 808, and a second semiconductor layer 810. Substrate 804 may include various materials, such as GaAs, InP, GaN, AlN, sapphire, SiC, Si, or the like. First semiconductor layer 806, active layers 808, and second semiconductor layer 810 may include various semiconductor materials, such as GaN, InGaN, (AlGaIn)P, (AlGaIn)AsP, (AlGaIn)AsN, (Eu:InGa)N, (AlGaIn)N, or the like. In some embodiments, first semiconductor layer 806 may be an n-type layer, and second semiconductor layer 810 may be a p-type layer. For example, first semiconductor layer 806 may be an n-doped GaN layer (e.g., doped with Si or Ge), and second semiconductor layer 810 may be a p-doped GaN layer (e.g., doped with Mg, Ca, Zn, or Be). Active layers 808 may include, for example, one or more GaN layers, one or more InGaN layers, one or more AlInGaP layers, and the like, which may form one or more heterostructures, such as one or more quantum wells or MQWs.

In some embodiments, first wafer 802 may also include a bonding layer. Bonding layer 812 may include various materials, such as a metal, an oxide, a dielectric, CuSn, AuTi, or the like. In one example, bonding layer 812 may include p-contacts and/or n-contacts (not shown). In some embodiments, other layers may also be included on first wafer 802, such as a buffer layer between substrate 804 and first semiconductor layer 806. The buffer layer may include various materials, such as polycrystalline GaN or AlN. In some embodiments, a contact layer may be between second semiconductor layer 810 and bonding layer 812. The contact layer may include any suitable material for providing an electrical contact to second semiconductor layer 810 and/or first semiconductor layer 806.

First wafer 802 may be bonded to wafer 803 that includes drive circuits 811 and bonding layer 813 as described above, via bonding layer 813 and/or bonding layer 812. Bonding layer 812 and bonding layer 813 may be made of the same material or different materials. Bonding layer 813 and bonding layer 812 may be substantially flat. First wafer 802 may be bonded to wafer 803 by various methods, such as metal-to-metal bonding, eutectic bonding, metal oxide bonding, anodic bonding, thermo-compression bonding, ultraviolet (UV) bonding, and/or fusion bonding.

As shown in FIG. 8B, first wafer 802 may be bonded to wafer 803 with the p-side (e.g., second semiconductor layer 810) of first wafer 802 facing down (i.e., toward wafer 803). After bonding, substrate 804 may be removed from first wafer 802, and first wafer 802 may then be processed from the n-side. The processing may include, for example, the formation of certain mesa shapes for individual LEDs, as well as the formation of optical components corresponding to the individual LEDs.

FIGS. 9A-9D illustrate an example of a method of hybrid bonding for arrays of LEDs according to certain embodiments. The hybrid bonding may generally include wafer cleaning and activation, high-precision alignment of contacts of one wafer with contacts of another wafer, dielectric bonding of dielectric materials at the surfaces of the wafers at room temperature, and metal bonding of the contacts by annealing at elevated temperatures. FIG. 9A shows a substrate 910 with passive or active circuits 920 manufactured thereon. As described above with respect to FIGS. 8A-8B, substrate 910 may include, for example, a silicon wafer. Circuits 920 may include drive circuits for the arrays of LEDs. A bonding layer may include dielectric regions 940 and contact pads 930 connected to circuits 920 through electrical interconnects 922. Contact pads 930 may include, for example, Cu, Ag, Au, Al, W, Mo, Ni, Ti, Pt, Pd, or the like. Dielectric materials in dielectric regions 940 may include SiCN, $SiO_2$, SiN, $Al_2O_3$, $HfO_2$, $ZrO_2$, $Ta_2O_5$, or the like. The bonding layer may be planarized and polished using, for example, chemical mechanical polishing, where the planarization or polishing may cause dishing (a bowl like profile) in the contact pads. The surfaces of the bonding layers may be cleaned and activated by, for example, an ion (e.g., plasma) or fast atom (e.g., Ar) beam 905. The activated surface may be atomically clean and may be reactive for formation of direct bonds between wafers when they are brought into contact, for example, at room temperature.

FIG. 9B illustrates a wafer 950 including an array of micro-LEDs 970 fabricated thereon as described above. Wafer 950 may be a carrier wafer and may include, for example, GaAs, InP, GaN, AlN, sapphire, SiC, Si, or the like. Micro-LEDs 970 may include an n-type layer, an active region, and a p-type layer epitaxially grown on wafer 950. The epitaxial layers may include various III-V semiconductor materials described above, and may be processed from the p-type layer side to etch mesa structures in the epitaxial layers, such as substantially vertical structures, parabolic structures, conic structures, or the like. Passivation layers and/or reflection layers may be formed on the sidewalls of the mesa structures. P-contacts 980 and n-contacts 982 may be formed in a dielectric material layer 960 deposited on the mesa structures and may make electrical contacts with the p-type layer and the n-type layers, respectively. Dielectric materials in dielectric material layer 960 may include, for example, SiCN, $SiO_2$, SiN, $Al_2O_3$, $HfO_2$, $ZrO_2$, $Ta_2O_5$, or the like. P-contacts 980 and n-contacts 982 may include, for example, Cu, Ag, Au, Al, W, Mo, Ni, Ti, Pt, Pd, or the like. The top surfaces of p-contacts 980, n-contacts 982, and dielectric material layer 960 may form a bonding layer. The bonding layer may be planarized and polished using, for example, chemical mechanical polishing, where the polishing may cause dishing in p-contacts 980 and n-contacts 982. The bonding layer may then be cleaned and activated by, for example, an ion (e.g., plasma) or fast atom (e.g., Ar) beam 915. The activated surface may be atomically clean and reactive for formation of direct bonds between wafers when they are brought into contact, for example, at room temperature.

FIG. 9C illustrates a room temperature bonding process for bonding the dielectric materials in the bonding layers. For example, after the bonding layer that includes dielectric regions 940 and contact pads 930 and the bonding layer that includes p-contacts 980, n-contacts 982, and dielectric material layer 960 are surface activated, wafer 950 and micro-LEDs 970 may be turned upside down and brought into contact with substrate 910 and the circuits formed thereon. In some embodiments, compression pressure 925 may be applied to substrate 910 and wafer 950 such that the bonding layers are pressed against each other. Due to the surface activation and the dishing in the contacts, dielectric regions 940 and dielectric material layer 960 may be in direct contact because of the surface attractive force, and may react and form chemical bonds between them because the surface atoms may have dangling bonds and may be in unstable energy states after the activation. Thus, the dielectric materials in dielectric regions 940 and dielectric material layer 960 may be bonded together with or without heat treatment or pressure.

FIG. 9D illustrates an annealing process for bonding the contacts in the bonding layers after bonding the dielectric materials in the bonding layers. For example, contact pads 930 and p-contacts 980 or n-contacts 982 may be bonded together by annealing at, for example, about 90-400° C. or higher. During the annealing process, heat 935 may cause the contacts to expand more than the dielectric materials (due to different coefficients of thermal expansion), and thus may close the dishing gaps between the contacts such that contact pads 930 and p-contacts 980 or n-contacts 982 may be in contact and may form direct metallic bonds at the activated surfaces.

In some embodiments where the two bonded wafers include materials having different coefficients of thermal expansion (CTEs), the dielectric materials bonded at room temperature may help to reduce or prevent misalignment of the contact pads caused by the different thermal expansions. In some embodiments, to further reduce or avoid the misalignment of the contact pads at a high temperature during annealing, trenches may be formed between micro-LEDs, between groups of micro-LEDs, through part or all of the substrate, or the like, before bonding.

After the micro-LEDs are bonded to the drive circuits, the substrate on which the micro-LEDs are fabricated may be thinned or removed, and various secondary optical components may be fabricated on the light emitting surfaces of the micro-LEDs to, for example, extract, collimate, and redirect the light emitted from the active regions of the micro-LEDs. In one example, micro-lenses may be formed on the micro-LEDs, where each micro-lens may correspond to a respective micro-LED and may help to improve the light extraction efficiency and collimate the light emitted by the micro-LED. In some embodiments, the secondary optical components may be fabricated in the substrate or the n-type layer of the micro-LEDs. In some embodiments, the secondary optical components may be fabricated in a dielectric layer deposited on the n-type side of the micro-LEDs. Examples of the secondary optical components may include a lens, a grating, an antireflection (AR) coating, a prism, a photonic crystal, or the like.

Figure 10:
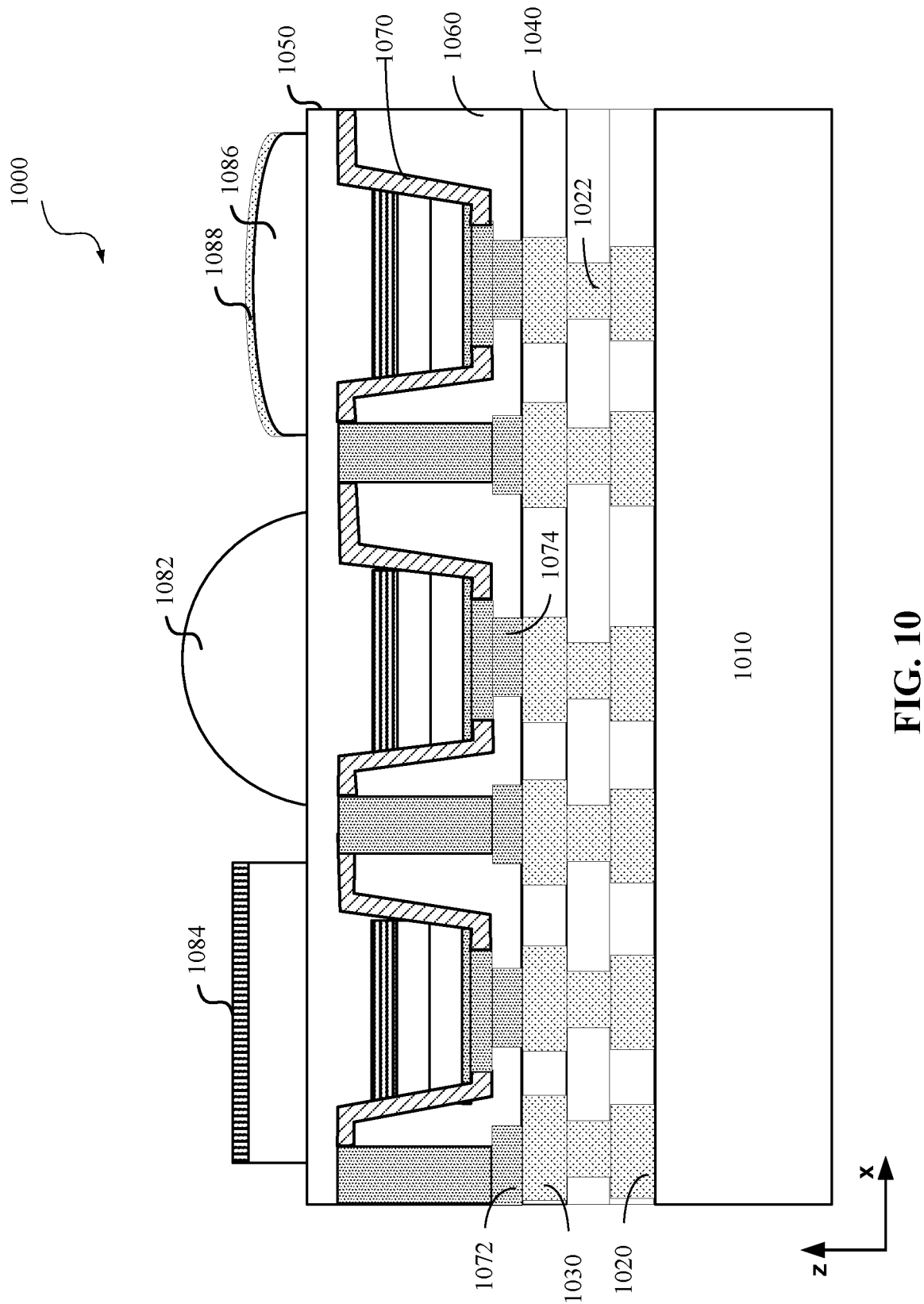
FIG. 10 illustrates an example of an LED array with secondary optical components fabricated thereon according to certain embodiments.

FIG. 10 illustrates an example of an LED array 1000 with secondary optical components fabricated thereon according to certain embodiments. LED array 1000 may be made by bonding an LED chip or wafer with a silicon wafer including electrical circuits fabricated thereon, using any suitable bonding techniques described above with respect to, for example, FIGS. 8A-9D. In the example shown in FIG. 10, LED array 1000 may be bonded using a wafer-to-wafer hybrid bonding technique as described above with respect to FIG. 9A-9D. LED array 1000 may include a substrate 1010, which may be, for example, a silicon wafer. Integrated circuits 1020, such as LED drive circuits, may be fabricated on substrate 1010. Integrated circuits 1020 may be connected to p-contacts 1074 and n-contacts 1072 of micro-LEDs 1070 through interconnects 1022 and contact pads 1030, where contact pads 1030 may form metallic bonds with p-contacts 1074 and n-contacts 1072. Dielectric layer 1040 on substrate 1010 may be bonded to dielectric layer 1060 through fusion bonding.

The substrate (not shown) of the LED chip or wafer may be thinned or may be removed to expose the n-type layer 1050 of micro-LEDs 1070. Various secondary optical components, such as a spherical micro-lens 1082, a grating 1084, a micro-lens 1086, an antireflection layer 1088, and the like, may be formed in or on top of n-type layer 1050. For example, spherical micro-lens arrays may be etched in the semiconductor materials of micro-LEDs 1070 using a grayscale mask and a photoresist with a linear response to exposure light, or using an etch mask formed by thermal reflowing of a patterned photoresist layer. The secondary optical components may also be etched in a dielectric layer deposited on n-type layer 1050 using similar photolithographic techniques or other techniques. For example, micro-lens arrays may be formed in a polymer layer through thermal reflowing of the polymer layer that is patterned using a binary mask. The micro-lens arrays in the polymer layer may be used as the secondary optical components or may be used as the etch mask for transferring the profiles of the micro-lens arrays into a dielectric layer or a semiconductor layer. The dielectric layer may include, for example, SiCN, $SiO_2$, SiN, $Al_2O_3$, $HfO_2$, $ZrO_2$, $Ta_2O_5$, or the like. In some embodiments, a micro-LED 1070 may have multiple corresponding secondary optical components, such as a micro-lens and an anti-reflection coating, a micro-lens etched in the semiconductor material and a micro-lens etched in a dielectric material layer, a micro-lens and a grating, a spherical lens and an aspherical lens, and the like. Three different secondary optical components are illustrated in FIG. 10 to show some examples of secondary optical components that can be formed on micro-LEDs 1070, which does not necessary imply that different secondary optical components are used simultaneously for every LED array.

As described above, the internal quantum efficiency of an LED depends on the relative rates of competitive radiative (light producing) recombination and non-radiative (lossy) recombination that occur in the active region of the LED. Non-radiative recombination processes in the active region include Shockley-Read-Hall (SRH) recombination at defect sites and electron-electron-hole (eeh) and/or electron-hole-hole (ehh) Auger recombination. The Auger recombination is a non-radiative process involving three carriers, which affects all sizes of LEDs. In micro-LEDs, because the lateral size of each micro-LED may be comparable to the minority carrier diffusion length, a larger proportion of the total active region may be within a distance less than the minority carrier diffusion length from the LED sidewall surfaces where the defect density and the defect-induced non-radiative recombination rate may be high. Therefore, a larger proportion of the injected carriers may diffuse to the regions near the sidewall surfaces, where the carriers may be subjected to a higher SRH recombination rate. This may cause the efficiency of the LED to decrease (in particular, at low current injection), cause the peak efficiency of the LED to decrease, and/or cause the peak efficiency operating current to increase. Increasing the injected current may cause the efficiencies of the micro-LEDs to drop due to the higher eeh or ehh Auger recombination rate at a higher current density, and may also cause spectral shift of the emitted light. As the physical sizes of LEDs are further reduced, efficiency losses due to surface recombination near the etched sidewall facets that include surface imperfections may become much more significant. III-phosphide materials, such as AlGaInP, can have a high surface recombination velocity and minority carrier diffusion length. For example, carriers in AlGaInP can have high diffusivity (mobility), and AlGaInP may have an order of magnitude higher surface recombination velocity than III-nitride materials. Thus, the internal and external quantum efficiencies of AlGaInP-based red light-emitting LEDs may drop even more significantly as the device size reduces.

At the light-emitting surface of an LED, such as the interface between the LED and air, some incident light with incident angles less than the critical angle for total internal reflection (TIR) may be refracted to exit the LED, but some incident light with incident angles greater than the critical angle may be reflected back to the LED due to total internal reflection. Light incident on the back reflector and mesa sidewall reflectors may be specularly reflected. Some light may be reflected by the back reflector and mesa sidewall reflectors to the light-emitting surface, but some light may be trapped in the LED. Because of the specular reflection and the geometry of the LED mesa structure, there may be no light mixing within the LED, which may result in closed orbits for light within the LED.

In large LEDs, the light extraction efficiency may be improved using, for example, thin film technology or patterned sapphire substrates with dense, periodic patterns on the substrate surfaces. For example, patterned sapphire substrate techniques may cause light randomization in the semiconductor layer, such that the propagation directions of the photons that may otherwise be trapped in the mesa structure may be randomized to increase the possibility of being released from the confinement and exiting the mesa structure. Therefore, the overall light extraction efficiency may be improved.

However, these techniques may not be used in micro-LEDs with linear dimensions less than, for example, about 20 μm or about 10 μm, due to the small sizes and high aspect ratios (height vs width) of these micro-LEDs. Therefore, in micro-LEDs, some light reflected back to the LED may be trapped in the micro-LED and may eventually be absorbed by the LED. For example, some trapped light may be absorbed by the semiconductor materials to generate electron-hole pairs, which may recombine radiatively or non-radiatively. Some trapped light may be absorbed by metals (e.g., metal contacts or reflectors) at the bottom and/or sidewalls of the LED due to, for example, surface plasmon resonance that may be excited by p-polarized (TM) light at the interface between a metal layer and a dielectric layer (e.g., the passivation layer).

Figures 11A, 11B:
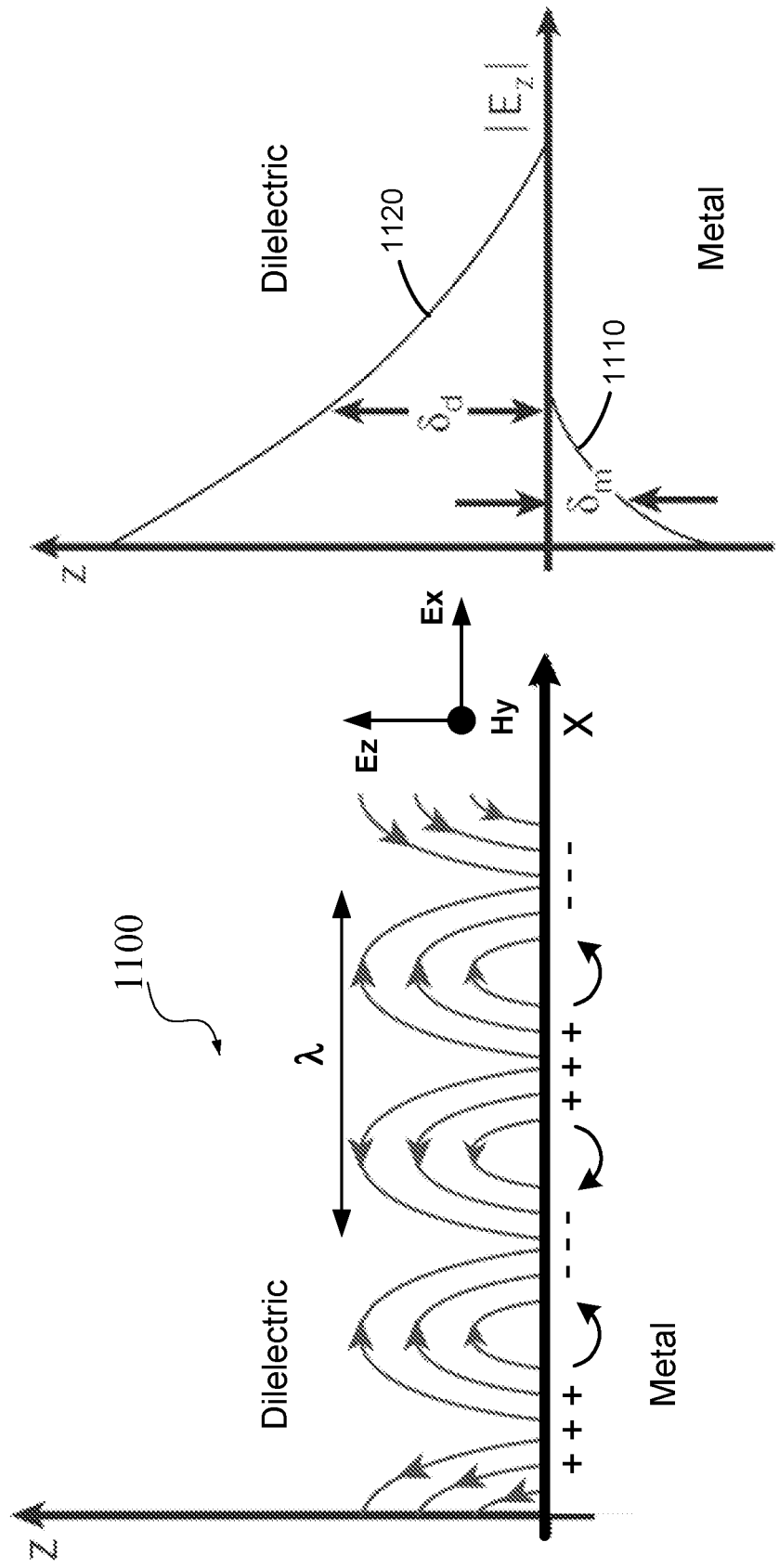
FIG. 11A illustrates an example of surface plasmon resonance at an interface between a metal and a dielectric material.
FIG. 11B illustrates evanescent electromagnetic fields in the metal and dielectric material in the example shown in FIG. 11A.

FIG. 11A includes a diagram 1100 illustrating an example of surface plasmon resonance at an interface between a metal and a dielectric material. Surface plasmons (also referred to as surface plasmon polaritons) are coherent delocalized electron oscillations that propagate along an interface between a conductive material (e.g., a metal) and a dielectric material. Surface plasmon resonance may occur when the real part of the permittivity of a first material is negative and is higher in magnitude than both its own imaginary part and the permittivity of a second material adjacent to the first material. Therefore, surface plasmons may exist at the interface between a metal ($Re[\varepsilon]<0$) and a dielectric material ($\varepsilon>0$), where the free electrons in the metal may be induced to oscillate collectively by the electric component of an impinging wave, such as p-polarized (TM) light. As illustrated in FIG. 11A, surface plasmon resonance may cause an electromagnetic wave in the dielectric material and an oscillating electron plasma in the metal, and may result in a strong extinction of light due to light absorption and scattering.

FIG. 11B illustrates examples of evanescent electromagnetic fields in a metal and a dielectric material generated by surface plasmon resonance at the interface between the metal and the dielectric material. As shown by curves 1110 and 1120, the evanescent electromagnetic fields at the interface between the metal and the dielectric material may decay exponentially in both direction perpendicular to the interface. Although surface plasmon resonance may be highly confined to the surface, the existence of the evanescent field protruding into the metal may result in considerable loss along the propagation length. The exponential decay length of the evanescent fields may vary from tens of nanometers in metals to hundreds of nanometers in dielectric materials. For example, the penetration depth of the electromagnetic field into the dielectric material may be on the order of a half of the wavelength λ in the dielectric material, whereas the penetration depth of the electromagnetic field into the metal may be a function of the skin depth of the metal. The loss at a particular interface may depend on several factors, such as the materials, the geometry, the frequency, and the quality of the surface. In general, the amplitude of the evanescent electromagnetic field in the dielectric material at the metal/dielectric interface may be inversely proportional to the dielectric constant of the dielectric material. Thus, when the dielectric constant of the dielectric material is high, the electromagnetic field generated by the surface plasmon resonance may be high, and the loss at the interface between the dielectric material and the metal may be high.

In III-phosphide-based LEDs, such as some red light-emitting III-phosphide LEDs, the refractive indices of the III-phosphide semiconductor materials (e.g., GaP, InP, GaInP, or AlGaInP) may be greater than about 3.0 (e.g., about 3.4) for visible light, much higher than the refractive indices of many III-nitride semiconductor materials (e.g., about 2.4 for GaN). Therefore, the critical angle for total internal reflection at the interface between the III-phosphide semiconductor material and an adjacent lower refractive index material (e.g., air or a dielectric) may be much smaller than the critical angle for total internal reflection at the interface between a III-nitride semiconductor material and the lower refractive index material. As such, more light emitted in the active region of a III-phosphide-based LED may be trapped in the LED and may be absorbed eventually. Therefore, the LEE of a red light-emitting III-phosphide LED may be low.

As described above, micro-lenses may be used to collimate light emitted from LEDs to increase the total LEEs (e.g., for extracted light with emission angles within ±90°) and the collected LEEs (e.g., for extracted light with emission angles within ±18.5°) of LEDs in a near-eye display. Micro-LEDs including mesa structures with straight sidewalls and native micro-lenses (e.g., made in semiconductor materials) may have higher collected LEEs, but may be more difficult to fabricate. For example, the etched mesa sidewalls may generally be slanted, for example, with slope angles about 5-30° (e.g., about 15°), which may reduce the collected LEE. Non-native lenses made from, for example, SiN, $SiO_2$, or organic materials, may be easier to fabricate than native lenses, but may exhibit lower collected LEEs compared with native lenses. For example, micro-lenses with large ratios between the widths of the micro-lenses and active region sizes of the micro-LEDs may be needed to improve the collected LEE, but the fabricated non-native micro-lenses may shrink, which may reduce the collected LEE by a factor of about 2 in some cases. In addition, to improve the collected LEE using micro-lenses, a thick layer (e.g., an n-type semiconductor layer with a thickness much greater than about 400 nm) between the active regions of the LEDs and the micro-lenses may be needed for the micro-lenses to collimate the light emitted in the active regions of the LEDs. The thick layer between the active regions and the micro-lenses may guide some emitted light laterally and cause optical crosstalk between adjacent pixels, and may also increase the trapped light by as high as 60%. For red light-emitting devices, multiple QWs are generally used in the active region to increase the intensity of the emitted light, which may significantly reduce the collected LEE because, for example, the light emitted by the multiple QWs at different distances from a lens may not be collimated well by the lens and light emitted by a QW may be absorbed by another QW.

According to certain embodiments, a micro-LED may include a reduced active region, and an insulator layer that may include at least a high-refractive index passivation layer adjacent to the active region and a low-refractive index passivation layer adjacent to sidewall metal reflectors. The high-refractive index passivation layer may include a high-refractive index dielectric material or a semiconductor material, and may increase the optical distance between the active region and the sidewall metal reflector compared with a low-refractive index passivation layer of the same thickness. Increasing the optical distance between the active region and the sidewall metal reflector may reduce the excitation of surface plasmon resonance by p-polarized (TM) light at the interface between the sidewall metal reflector and the insulator layer. For micro-LEDs with pitches less than about 3 μm (e.g., about 2 μm), the high-refractive index passivation layer may have a thickness, for example, between about 1 nm and about 300 nm, or between about 50 nm and about 200 nm, such as about 100 nm. The low-refractive index passivation layer may have a thickness, for example, between about 1 nm and about 300 nm, or between about 50 nm and about 200 nm, such as about 100 nm. The low-refractive index passivation layer adjacent to the sidewall metal reflector may reduce the amplitudes of the electromagnetic fields induced by the surface plasmon resonance at the interface between the sidewall metal reflector and the insulator layer. Therefore, losses at the sidewall metal reflector may be reduced. In addition, total internal reflection may occur at the interface between the high-refractive index passivation layer and the low-refractive index passivation layer for light incident on this interface at large incidence angles. Therefore, the light incident on this interface at large incidence angles may not even reach the interface between the sidewall metal reflector and the insulator layer and thus may not be partially absorbed by the sidewall metal reflector due to surface plasmon resonance. For at least these reasons, the total LEE for extracted light with emission angles within ±90° may be increased.

In one example, the high-refractive index passivation layer may include a semiconductor material with a refractive index matching the refractive index of the active region. For example, the semiconductor material may be an undoped semiconductor material that has the same base material as the active region, and may be formed on the sidewalls of etched mesa structures through epitaxial growth, after the mesa structures are etched in epitaxial layers and are treated (e.g., using KOH or an acid) to remove damages at the etched surfaces. The epitaxially grown high-refractive index passivation layer may also reduce defects at the sidewalls of the active region, and thus may reduce non-radiative recombination at the sidewalls of the active region and increase the internal quantum efficiency of the micro-LED. In some embodiments, the insulator layer may include additional (conductive or non-conductive) layers between the high-refractive index passivation layer and the low-refractive index passivation layer.

In addition, the reduction of the active region due to the increase of the thickness of the passivation layers may increase the ratio between the width of the micro-lens and the width of the active region, such that the active region may be closer to a point source at a focal point of the micro-lens and thus the emitted light may be better collimated by the micro-lens. As a result, a higher percentage of the extracted light may have emission angles within a small emission cone (e.g., within ±18.5°) and thus may be collected by the display optics. Therefore, the collected light extraction efficiency (e.g., for extracted light with emission angles within ±18.5°) may be improved. Simulation results show that, for micro-LEDs with sidewall slope angles larger than 90° (i.e., outwardly tilted in the light emitting direction), the collected LEE can be significantly increased. For example, for micro-LEDs with a pitch about 2 μm, reducing the width of the active region by about 150 nm to about 200 nm may improve the collected LEE to about two times. Furthermore, with the reduction of the active region, the tolerance of the LED device to the variation of the lens width may be improved, and thus the reduction of the width of the fabricated micro-lens (e.g., due to the fabrication process or shrinkage) may not cause a large reduction of the collected LEE. Moreover, the thickness of the semiconductor material layer (e.g., the n-type semiconductor layer) between the micro-lens (e.g., a non-native lens) and the active region can be reduced to reduce optical crosstalk, while achieving higher collected LEE (e.g., close to 4% within ±18.5° for red micro-LEDs with three quantum wells).

Figure 12E:
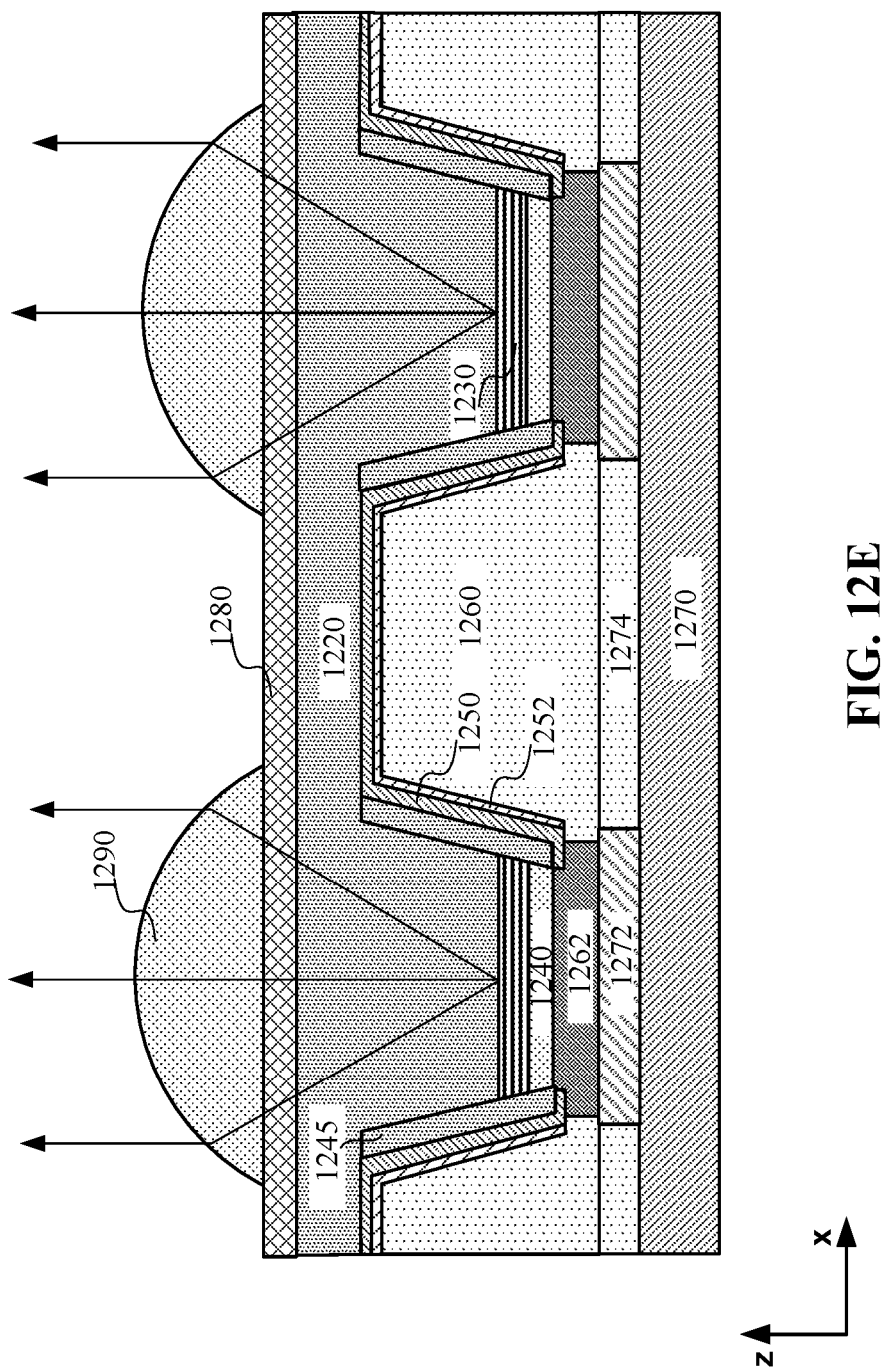

FIGS. 12A-12E illustrate an example of a method of fabricating a micro-LED device according to certain embodiments. FIG. 12A shows a micro-LED wafer 1200 including epitaxial layers grown on a substrate 1210. As described above, substrate 1210 may include, for example, a GaN, GaAs, or GaP substrate, or a substrate including, but not limited to, sapphire, silicon carbide, silicon, zinc oxide, boron nitride, lithium aluminate, lithium niobate, germanium, aluminum nitride, lithium gallate, partially substituted spinels, or quaternary tetragonal oxides sharing the beta- LiAlO$_2$ structure, where the substrate may be cut in a specific direction to expose a specific plane (e.g., a c-plane or a semipolar plane) as the growth surface. In some embodiments, a buffer layer may be formed on substrate 1210 to improve the lattice matching between the growth substrate and the epitaxial layers, thereby reducing stress and defects in the epitaxial layers. The epitaxial layers may include an n-type semiconductor layer 1220 (e.g., an n-doped GaN, AlInP, or AlGaInP layer), an active region 1230, and a p-type semiconductor layer 1240 (e.g., a p-doped GaN, AlInP, or AlGaInP layer). Active region 1230 may include multiple quantum wells or an MQW formed by thin quantum well layers (e.g., InGaN layers or GaInP layers) sandwiched by barrier layers (e.g., GaN layers, AlInP layers, or AlGaInP layers) as described above. The epitaxial layers may be grown layer-by-layer on substrate 1210 or the buffer layer using techniques such as VPE, LPE, MBE, or MOCVD. In some embodiments, n-type semiconductor layer 1220 may be much thicker than p-type semiconductor layer 1240.

FIG. 12B shows that micro-LED wafer 1200 may be etched from the side of p-type semiconductor layer 1240 to form semiconductor mesa structures 1202 for individual micro-LEDs. As shown in FIG. 12B, the etching may include etching through p-type semiconductor layer 1240, active region 1230, and at least a portion of n-type semiconductor layer 1220. Thus, each semiconductor mesa structure 1202 may include p-type semiconductor layer 1240, active region 1230, and a portion of n-type semiconductor layer 1220. To perform the etching, an etch mask layer may be formed on p-type semiconductor layer 1240, and dry or wet etching may be performed from the side of p-type semiconductor layer 1240. Due to the etching from p-type semiconductor layer 1240, semiconductor mesa structure 1202 may have sidewalls that are inwardly tilted in the z direction. For example, the angle between the sidewalls and the surface-normal direction (the z direction) of micro-LED wafer 1200 may be between about 0° to about 30°, such as about 15°. In some embodiments, semiconductor mesa structures 1202 may have a conical shape, a parabolic shape, a truncated pyramid shape, or another shape. In some embodiments, after the etching, sidewalls of the etched semiconductor mesa structures 1202 may be treated, for example, using KOH or an acid, to remove regions that may be damaged by high-energy ions during the dry etching.

FIG. 12C shows that micro-LED wafer 1200 may be further processed from the side of p-type semiconductor layer 1240 to form a wafer 1204 that includes an array of micro-LEDs. In the illustrated example, a semiconductor layer 1245 that may include the same base material (e.g., a III-P material) as p-type semiconductor layer 1240, active region 1230, and n-type semiconductor layer 1220 may be formed on sidewalls of semiconductor mesa structures 1202. Semiconductor layer 1245 may be undoped and may be formed on sidewalls of semiconductor mesa structures 1202 through, for example, a regrow process that epitaxially grows semiconductor layer 1245 on sidewalls of semiconductor mesa structures 1202. Semiconductor layer 1245 may be grown only on sidewalls of semiconductor mesa structures 1202 by using a mask layer on top of semiconductor mesa structures 1202 and in regions between semiconductor mesa structures 1202. The undoped semiconductor layer 1245 may function as a passivation layer that electrically isolate adjacent semiconductor mesa structures 1202. The high-refractive index semiconductor layer 1245 that has the same base material as active region 1230 (e.g., with a refractive index greater than about 3.0, such as 3.4, for red light) may increase the optical distance from active region 1230 to a sidewall metal reflector. Epitaxially growing semiconductor layer 1245 that has the same base material as active region 1230 on sidewalls of active region 1230 may also reduce the defects at the etched sidewalls of active region 1230, and thus may reduce non-radiative recombination at the sidewall regions of active region 1230 and improve the internal quantum efficiency of the micro-LEDs. In some embodiments, additional layers (e.g., including dielectric, doped semiconductor material, undoped semiconductor material, or a combination) may be formed on semiconductor layer 1245. The additional layers may have refractive indices lower than the refractive index of semiconductor layer 1245.

After the growth of semiconductor layer 1245, a passivation layer 1250 may be formed on surfaces of micro-LED wafer 1200, including surfaces of semiconductor layer 1245, to further electrically isolate semiconductor mesa structures 1202. Passivation layer 1250 may include a dielectric material, such as SiO$_2$, Al$_2$O$_3$, or Si$_3$N$_4$. In some embodiments, passivation layer 1250 may have a thickness greater than about 50 nm, such as about 100 nm or thicker. A reflective metal layer 1252 (e.g., Al, Au, Ag, Cu, Ti, Ni, Pt, or a combination thereof) may be formed on passivation layer 1250 to optically isolate individual micro-LEDs and improve the light extraction efficiency. A dielectric material 1260 (e.g., SiO$_2$) may be deposited on reflective metal layer 1252 and regions between semiconductor mesa structures 1202. Passivation layer 1250, reflective metal layer 1252, and dielectric material 1260 may be formed using suitable deposition techniques, such as chemical vapor deposition (CVD), physical vapor deposition (PVD), plasma-enhanced chemical vapor deposition (PECVD), atomic-layer deposition (ALD), laser metal deposition (LIVID), or sputtering. A back reflector and p-contact 1262 may be form in dielectric material 1260 and may contact p-type semiconductor layer 1240 of a corresponding semiconductor mesa structure 1202. Back reflector and p-contact 1262 may include, for example, Au, Ag, Al, Ti, Cu, Ni, ITO, or a combination thereof. Even though not shown in FIG. 12C, in some embodiments, one or more metal interconnect layers may be formed on back reflector and p-contact 1262. The one or more metal interconnect layers may include a bonding layer that includes metal bonding pads in a dielectric layer as described above with respect to, for example, FIG. 9B.

FIG. 12D shows that wafer 1204 may be bonded to a backplane wafer 1206 in a hybrid bonding process. Backplane wafer 1206 may include a substrate 1270 with electrical circuits formed thereon. The electrical circuits may include digital and analog pixel drive circuits for driving individual micro-LEDs. A plurality of metal pads 1272 (e.g., copper or tungsten pads) may be formed in a dielectric layer 1274 (e.g., including SiO$_2$ or SiN). In some embodiments, each metal pad 1272 may be an electrode (e.g., anode or cathode) for a micro-LED. Even though FIG. 12D only shows metal pads 1272 formed in one metal layer in one dielectric layer 1274, backplane wafer 1206 may include two or more metal layers formed in dielectric materials and interconnected by, for example, metal vias, as in many CMOS integrated circuits.

As described above with respect to, for example, FIGS. 9A-9D, the bonding surfaces of wafer 1204 and backplane wafer 1206 may be planarized, cleaned, and activated before the bonding. Wafer 1204 may be turned upside down and brought into contact with backplane wafer 1206 such that dielectric layer 1274 and dielectric material 1260 may be in direct contact and may be bonded together with or without heat treatment due to the surface activation. In some embodiments, a compression pressure may be applied to wafer 1204 and backplane wafer 1206 such that the bonding layers are pressed against each other. After the bonding of the dielectric materials, an annealing process may be performed at an elevated temperature to bond the metal pads (e.g., back reflector and p-contacts 1262 and metal pads 1272) at the bonding surfaces.

FIG. 12E shows that, after the bonding of wafer 1204 and backplane wafer 1206, substrate 1210 of wafer 1204 may be removed, and a transparent conductive oxide (TCO) layer 1280 (e.g., such as an ITO layer) may be formed on the exposed n-type semiconductor layer 1220. TCO layer 1280 may form a common cathode for the micro-LEDs. In the illustrated example, non-native lenses 1290 may be fabricated in a dielectric material (e.g., SiN or $SiO_2$) or an organic material, and may be bonded to TCO layer 1280. In some embodiments, non-native lenses 1290 may be fabricated in a dielectric material deposited on TCO layer 1280. In some embodiments, native lenses may be fabricated in n-type semiconductor layer 1220, and the common cathode may be formed on the native lenses and/or may be the portion of n-type semiconductor layer 1220 that has not been etched (which may be heavily doped to reduce the resistance). As shown in FIGS. 12D and 12E, since wafer 1204 is turned upside down and bonded to backplane wafer 1206 and light may exit the micro-LEDs from the side of n-type semiconductor layer 1220, the semiconductor mesa structures of the micro-LEDs may have sidewalls that are outwardly tilted in the light emitting direction (e.g., the z direction).

FIG. 13A illustrates a simulation model of an example of a micro-LED 1300 including a thin, low-refractive index passivation layer. Micro-LED 1300 may be configured to emit red light. In the illustrated example, micro-LED 1300 may include a semiconductor mesa structure that includes a portion of an n-type semiconductor layer 1310 (e.g., including n-dope AlGaInP), an active region 1320 (e.g., including one or more QWs formed by GaInP quantum well layers and AlGaInP quantum barrier layers), and a p-type semiconductor layer 1330 (e.g., including p-dope AlGaInP). A passivation layer 1340 may be formed on sidewalls of the semiconductor mesa structure. Passivation layer 1340 may include a dielectric material that may have a refractive index much lower than the refractive indices of n-type semiconductor layer 1310, active region 1320, and p-type semiconductor layer 1330. A reflective metal layer 1350 (e.g., including Al) may then be formed on passivation layer 1340. Regions surrounding the semiconductor mesa structure may be filled with a dielectric material 1360 (e.g., $SiO_2$). A back reflector and p-contact 1370 may be at the bottom of the semiconductor mesa structure and may be coupled to p-type semiconductor layer 1330. A non-native micro-lens 1380 may be bonded to n-type semiconductor layer 1310. Non-native micro-lens 1380 may include an antireflective coating 1390.

In the simulation model shown in FIG. 13A, the sidewalls of the semiconductor mesa structure of micro-LED 1300 may be tilted at an angle θ about 15° with respect to the z direction. The base of the semiconductor mesa structure (e.g., p-type semiconductor layer 1330) at z=0 may have a width about 900 nm. The height of the semiconductor mesa structure may be about 1.1 µm. Active region 1320 may include three QWs, where the thickness of each quantum barrier layer may be about 5 nm, and the thickness of each quantum well layer may be about 3.5 nm. A distance between the bottom QW and back reflector and p-contact 1370 may be about 387.75 nm. The refractive index of the active region may be about 3.4. The height h of n-type semiconductor layer 1310 on top of the semiconductor mesa structure may be about 1 µm. Back reflector and p-contact 1370 may include Au. Passivation layer 1340 may include SiN, which may have a refractive index about 2.0 for red light. Passivation layer 1340 may have a thickness about 90 nm at the sidewalls of the semiconductor mesa structure of micro-LED 1300. Non-native micro-lens 1380 may include SiN and may have a height about 500 nm and a width about 1.8 µm. Antireflective coating 1390 may include $SiO_2$ and may have a thickness about 100 nm.

FIG. 13B illustrates a simulated output beam profile 1304 of the example of micro-LED 1300 shown in FIG. 13A. The simulation results show that the total LEE for extracted light with emission angles within ±90° is about 21%, whereas the collected LEE for extracted light with emission angles within ±18.5° is about 2.8%.

FIG. 13C illustrates a simulation model of an example of a micro-LED 1302 including a thicker, low-refractive index passivation layer. Micro-LED 1302 may be similar to micro-LED 1300, but may have a passivation layer that is thicker than the passivation layer of micro-LED 1300. Micro-LED 1302 may be configured to emit red light. In the illustrated example, micro-LED 1302 may include a semiconductor mesa structure that includes a portion of an n-type semiconductor layer 1312 (e.g., including n-dope AlGaInP), an active region 1322 (e.g., including one or more QWs formed by GaInP quantum well layers and AlGaInP quantum barrier layers), and a p-type semiconductor layer 1332 (e.g., including p-dope AlGaInP). A passivation layer 1342 may be formed on sidewalls of the semiconductor mesa structure. Passivation layer 1342 may include a dielectric material that may have a refractive index much lower than the refractive indices of n-type semiconductor layer 1312, active region 1322, and p-type semiconductor layer 1332. A reflective metal layer 1352 (e.g., including Al) may be formed on passivation layer 1342. Regions surrounding the semiconductor mesa structure may be filled with a dielectric material 1362 (e.g., $SiO_2$). A back reflector and p-contact 1372 may be at the bottom of the semiconductor mesa structure and may be coupled to p-type semiconductor layer 1332. A non-native micro-lens 1382 may be bonded to n-type semiconductor layer 1312. Non-native micro-lens 1382 may include an antireflective coating 1392.

In the simulation model shown in FIG. 13C, the sidewalls of the semiconductor mesa structure of micro-LED 1302 may be tilted at an angle θ about 15° with respect to the z direction. The base of the semiconductor mesa structure (e.g., p-type semiconductor layer 1332) at z=0 may have a width about 900 nm. The height of the semiconductor mesa structure may be about 1.1 Active region 1322 may include three QWs, where the thickness of each quantum barrier layer may be about 5 nm, and the thickness of each quantum well layer may be about 3.5 nm. A distance between the bottom QW and back reflector and p-contact 1372 may be about 387.75 nm. The refractive index of the active region may be about 3.4. The height h of n-type semiconductor layer 1312 on top of the semiconductor mesa structure may be about 1 µm. The back reflector and p-contact 1372 may include Au. Passivation layer 1342 may include SiN, which may have a refractive index about 2.0 for red light. Passivation layer 1342 may have a thickness about 200 nm at the sidewalls of the semiconductor mesa structure of micro-LED 1302. Non-native micro-lens 1382 may include SiN and may have a height about 500 nm and a width about 1.8 µm. Antireflective coating 1392 may include $SiO_2$ and may have a thickness about 100 nm.

FIG. 13D illustrates a simulated output beam profile 1306 of the example of micro-LED 1302 of FIG. 13C. The simulation results show that, in micro-LED 1302, the total LEE for extracted light with emission angles within ±90° is about 26%, whereas the collected LEE for extracted light with emission angles within ±18.5° is about 2.9%. Thus, the total LEE and the collected LEE of micro-LED 1302 may be slightly higher than those of micro-LED 1300. The higher LEEs may be caused by the lower surface plasmon resonance and thus lower loss at the interface between passivation layer 1342 and reflective metal layer 1352, because of the thicker passivation layer 1342 and thus a longer optical distance between active region 1322 and reflective metal layer 1352. However, increasing the thickness of the low-refractive index passivation layer may only increase the collected LEE slightly, and the collected LEE of micro-LED 1302 may still be very low.

FIG. 14A illustrates a simulation model of an example of a micro-LED 1400 including a reduced action region, a high-refractive index passivation layer, and a low-refractive index passivation layer according to certain embodiments. Micro-LED 1400 may be similar to micro-LED 1300, but may include a smaller active region and an additional high-refractive index passivation layer between the active region and the low-refractive index passivation layer (e.g., a dielectric passivation layer). Micro-LED 1400 may be configured to emit red light. In the illustrated example, micro-LED 1400 may include a semiconductor mesa structure that includes a portion of an n-type semiconductor layer 1410 (e.g., including n-dope AlGaInP), an active region 1420 (e.g., including one or more QWs formed by GaInP quantum well layers and AlGaInP quantum barrier layers), and a p-type semiconductor layer 1430 (e.g., including p-dope AlGaInP). A high-refractive index passivation layer 1405 may be formed on sidewalls of the semiconductor mesa structure. High-refractive index passivation layer 1405 may have a refractive index matching the refractive indices of n-type semiconductor layer 1410, active region 1420, and p-type semiconductor layer 1430. A low-refractive index passivation layer 1440 may be formed on high-refractive index passivation layer 1405. Low-refractive index passivation layer 1440 may include a dielectric material that may have a refractive index much lower than the refractive indices of n-type semiconductor layer 1410, active region 1420, and p-type semiconductor layer 1430. A reflective metal layer 1450 (e.g., including Al) may be formed on low-refractive index passivation layer 1440. Regions surrounding the semiconductor mesa structure may be filled with a dielectric material 1460 (e.g., $SiO_2$). A back reflector and p-contact 1470 may be at the bottom of the semiconductor mesa structure and may be coupled to p-type semiconductor layer 1430. A non-native micro-lens 1480 may be bonded to n-type semiconductor layer 1410. Non-native micro-lens 1480 may include an antireflective coating 1490.

In the simulation model shown in FIG. 14A, the sidewalls of the semiconductor mesa structure of micro-LED 1400 may be tilted at an angle θ about 15° with respect to the z direction. The base of the semiconductor mesa structure (e.g., p-type semiconductor layer 1430) at z=0 may have a width about 700 nm. The height of the semiconductor mesa structure may be about 1.1 μm. Active region 1420 may include three QWs, where the thickness of each quantum barrier layer may be about 5 nm, and the thickness of each quantum well layer may be about 3.5 nm. A distance between the bottom QW and back reflector and p-contact 1470 may be about 387.75 nm. The refractive index of the active region may be about 3.4. The height h of n-type semiconductor layer 1410 on top of the semiconductor mesa structure may be about 1 μm. The back reflector and p-contact 1470 may include Au. High-refractive index passivation layer 1405 may include an undoped semiconductor layer (e.g., InP, GaP, GaInP, or AlGaInP) grown on sidewalls of the semiconductor mesa structure, and may have a refractive index similar to the refractive index of active region 1420, such as about 3.4 for red light. The thickness of high-refractive index passivation layer 1405 on sidewalls of the semiconductor mesa structure may be about 100 nm. Low-refractive index passivation layer 1440 may include SiN, which may have a refractive index about 2.0 for red light. Low-refractive index passivation layer 1440 may have a thickness about 90 nm at the mesa sidewalls of micro-LED 1400. Non-native micro-lens 1480 may include SiN and may have a height about 500 nm and a width about 1.8 μm. Antireflective coating 1490 may include $SiO_2$ and may have a thickness about 100 nm.

FIG. 14B illustrates a simulated output beam profile 1404 of the example of micro-LED 1400 of FIG. 14A. The simulation results show that, in micro-LED 1400, the total LEE for extracted light with emission angles within ±90° is about 22.3%, but the collected LEE for extracted light with emission angles within ±18.5° is about 3.6%. The higher collected LEE may be caused by (1) the smaller active region 1420 (closer to a point source) with respect to non-native micro-lens 1480, and (2) lower surface plasmon resonance and thus lower loss at the interface between low-refractive index passivation layer 1440 and reflective metal layer 1450. The lower surface plasmon resonance may be due to (1) the longer total optical distance between active region 1420 and reflective metal layer 1450 and (2) the low refractive index (and dielectric constant) of low-refractive index passivation layer 1440 adjacent to reflective metal layer 1450. In addition, as described above, due to the large difference between the refractive indices of high-refractive index passivation layer 1405 and low-refractive index passivation layer 1440, total internal reflection may occur at the interface between high-refractive index passivation layer 1405 and low-refractive index passivation layer 1440 for light incident on this interface at large incidence angles. Therefore, the light incident on this interface at large incidence angles may not reach the interface between reflective metal layer 1450 and low-refractive index passivation layer 1440 and thus may not be partially absorbed by reflective metal layer 1450 due to surface plasmon resonance.

FIG. 14C illustrates a simulation model of an example of a micro-LED 1402 including a reduced action region, a high-refractive index passivation layer, and a low-refractive index passivation layer according to certain embodiments. Micro-LED 1402 may be similar to micro-LED 1400, but may include a thicker low-refractive index passivation layer. Micro-LED 1402 may be configured to emit red light. In the illustrated example, micro-LED 1402 may include a semiconductor mesa structure that includes a portion of an n-type semiconductor layer 1412 (e.g., including n-dope AlGaInP), an active region 1422 (e.g., including one or more QWs formed by GaInP quantum well layers and AlGaInP quantum barrier layers), and a p-type semiconductor layer 1432 (e.g., including p-dope AlGaInP). A high-refractive index passivation layer 1415 may be formed on sidewalls of the semiconductor mesa structure. High-refractive index passivation layer 1415 may have a refractive index matching the refractive indices of n-type semiconductor layer 1412, active region 1422, and p-type semiconductor layer 1432. A low-refractive index passivation layer 1442 may be formed on high-refractive index passivation layer 1415. Low-refractive index passivation layer 1442 may include a dielectric material that may have a refractive index much lower than the refractive indices of n-type semiconductor layer 1412, active region 1422, and p-type semiconductor layer 1432. A reflective metal layer 1452 (e.g., including Al) may be formed on low-refractive index passivation layer 1442. Regions surrounding the semiconductor mesa structure may be filled with a dielectric material 1462 (e.g., $SiO_2$). A back reflector and p-contact 1472 may be at the bottom of the semiconductor mesa structure and may be coupled to p-type semiconductor layer 1432. A non-native micro-lens 1482 may be bonded to n-type semiconductor layer 1412. Non-native micro-lens 1482 may include an antireflective coating 1492.

In the simulation model shown in FIG. 14C, the sidewalls of the semiconductor mesa structure of micro-LED 1402 may be tilted at an angle θ about 15° with respect to the z direction. The base of the semiconductor mesa structure (e.g., p-type semiconductor layer 1432) at z=0 may have a width about 700 nm. The height of the semiconductor mesa structure may be about 1.1 μm. Active region 1422 may include three QWs, where the thickness of each quantum barrier layer may be about 5 nm, and the thickness of each quantum well layer may be about 3.5 nm. A distance between the bottom QW and back reflector and p-contact 1472 may be about 387.75 nm. The refractive index of the active region may be about 3.4. The height h of n-type semiconductor layer 1412 on top of the semiconductor mesa structure may be about 1 μm. The back reflector and p-contact 1472 may include Au. High-refractive index passivation layer 1415 may include an undoped semiconductor layer (e.g., InP, GaP, GaInP, or AlGaInP) grown on sidewalls of the semiconductor mesa structure, and may have a refractive index similar to the refractive index of active region 1422, such as about 3.4 for red light. The thickness of high-refractive index passivation layer 1415 on sidewalls of the semiconductor mesa structure may be about 100 nm. Low-refractive index passivation layer 1442 may include SiN, which may have a refractive index about 2.0 for red light. Low-refractive index passivation layer 1442 may have a thickness about 200 nm at the mesa sidewalls of micro-LED 1402. Non-native micro-lens 1482 may include SiN and may have a height about 500 nm and a width about 1.8 μm. Antireflective coating 1492 may include $SiO_2$ and may have a thickness about 100 nm.

FIG. 14D illustrates a simulated output beam profile 1406 of the example of micro-LED 1402 of FIG. 14C. The simulation results show that, in micro-LED 1402, the total LEE for extracted light with emission angles within ±90° is about 28%, and the collected LEE for extracted light with emission angles within ±18.5° is about 3.8%. The higher total LEE and collected LEE may be caused by (1) the smaller active region 1422 (closer to a point source) with respect to non-native micro-lens 1482, and (2) lower surface plasmon resonance and thus lower loss at the interface between low-refractive index passivation layer 1442 and reflective metal layer 1452. The lower surface plasmon resonance may be because of (1) the longer total optical distance between active region 1422 and reflective metal layer 1452 and (2) the low refractive index (and dielectric constant) of low-refractive index passivation layer 1442 adjacent to reflective metal layer 1452. In addition, due to the large difference between the refractive indices of high-refractive index passivation layer 1415 and low-refractive index passivation layer 1442, total internal reflection may occur at the interface between high-refractive index passivation layer 1415 and low-refractive index passivation layer 1442 for light incident on this interface at large incidence angles. Therefore, the light incident on this interface at large incidence angles may not even reach the interface between reflective metal layer 1452 and low-refractive index passivation layer 1442 and thus may not be partially absorbed by reflective metal layer 1452 due to surface plasmon resonance.

Figure 15A:
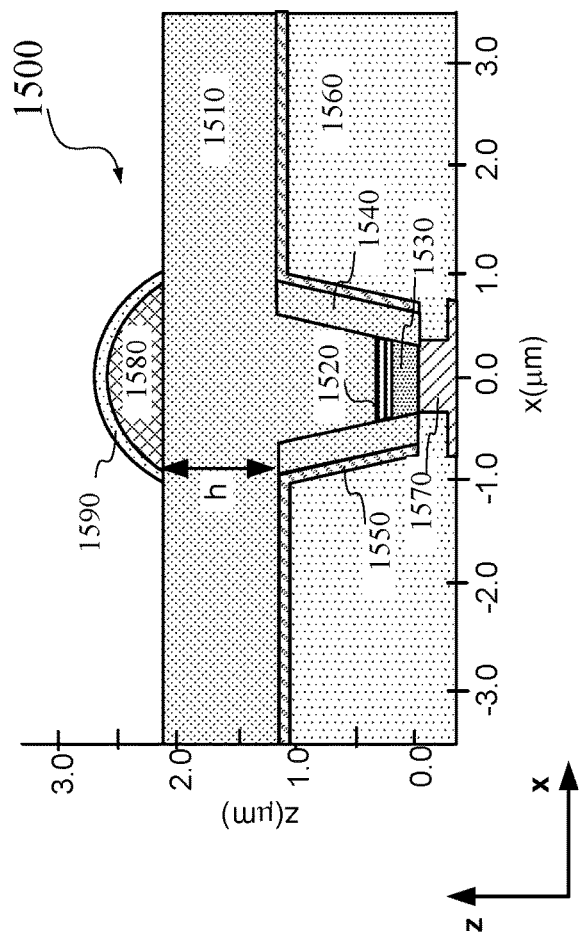
FIG. 15A illustrates a simulation model of an example of a micro-LED including a reduced active region and a high-refractive index passivation layer.

FIG. 15A illustrates a simulation model of an example of a micro-LED 1500 including a reduced active region and a high-refractive index passivation layer. Micro-LED 1500 may be similar to micro-LED 1400, but may not include a low-refractive index passivation layer adjacent to the reflective metal layer at the mesa sidewalls. Micro-LED 1500 may be configured to emit red light. In the illustrated example, micro-LED 1500 may include a semiconductor mesa structure that includes a portion of an n-type semiconductor layer 1510 (e.g., including n-dope AlGaInP), an active region 1520 (e.g., including one or more QWs formed by GaInP quantum well layers and AlGaInP quantum barrier layers), and a p-type semiconductor layer 1530 (e.g., including p-dope AlGaInP). A high-refractive index passivation layer 1540 may be formed on sidewalls of the semiconductor mesa structure. High-refractive index passivation layer 1540 may have a refractive index matching the refractive indices of n-type semiconductor layer 1510, active region 1520, and p-type semiconductor layer 1530. A reflective metal layer 1550 (e.g., including Al) may be formed on high-refractive index passivation layer 1540. Regions surrounding the semiconductor mesa structure may be filled with a dielectric material 1560 (e.g., $SiO_2$). A back reflector and p-contact 1570 may be at the bottom of the semiconductor mesa structure and may be coupled to p-type semiconductor layer 1530. A non-native micro-lens 1580 may be bonded to n-type semiconductor layer 1510. Non-native micro-lens 1580 may include an antireflective coating 1590.

In the simulation model shown in FIG. 15A, the sidewalls of the semiconductor mesa structure of micro-LED 1500 may be tilted at an angle θ about 15° with respect to the z direction. The base of the semiconductor mesa structure (e.g., p-type semiconductor layer 1530) at z=0 may have a width about 700 nm. The height of the semiconductor mesa structure may be about 1.1 μm. Active region 1520 may include three QWs, where the thickness of each quantum barrier layer may be about 5 nm, and the thickness of each quantum well layer may be about 3.5 nm. A distance between the bottom QW and back reflector and p-contact 1570 may be about 387.75 nm. The refractive index of the active region may be about 3.4. The height h of n-type semiconductor layer 1510 on top of the semiconductor mesa structure may be about 1 μm. The back reflector and p-contact 1570 may include Au. High-refractive index passivation layer 1540 may include an undoped semiconductor layer (e.g., InP, GaP, GaInP, or AlGaInP) grown on sidewalls of the semiconductor mesa structure, and may have a refractive index similar to the refractive index of active region 1520, such as about 3.4 for red light. The thickness of high-refractive index passivation layer 1540 on sidewalls of the semiconductor mesa structure may be about 190 nm. Non-native micro-lens 1580 may include SiN and may have a height about 500 nm and a width about 1.8 μm. Antireflective coating 1590 may include $SiO_2$ and may have a thickness about 100 nm.

Thus, compared with micro-LED 1400, micro-LED 1500 may have the same active region size and other parameters, but may have a high-refractive index passivation layer (e.g., a III-P semiconductor layer) with a thickness about 190 nm, rather than a combination of a high-refractive index passivation layer (e.g., a III-P semiconductor layer) with a thickness about 100 nm and a low-refractive index passivation layer (e.g., a SiN layer) with a thickness about 90 nm. The total optical distance between active region 1520 and reflective metal layer 1550 may be longer than the total optical distance between active region 1420 and reflective metal layer 1450, due to the high refractive index of high-refractive index passivation layer 1540.

Figure 15B:
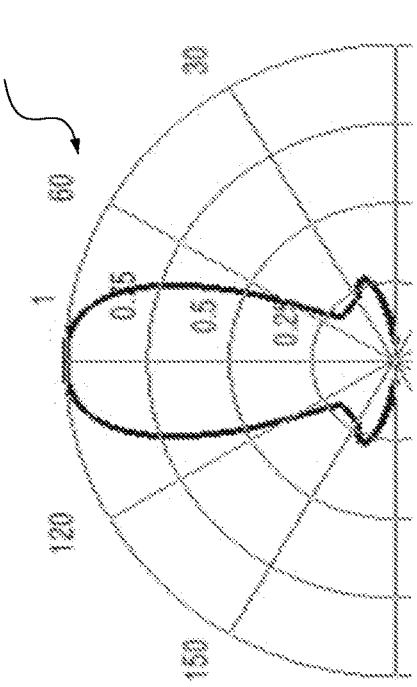
FIG. 15B illustrates a simulated output beam profile of the example of micro-LED of FIG. 15A.

FIG. 15B illustrates a simulated output beam profile 1502 of the example of micro-LED 1500 of FIG. 15A. The simulation results show that, in micro-LED 1500, the total LEE for extracted light with emission angles within ±90° is about 20.1%, and the collected LEE for extracted light with emission angles within ±18.5° is about 3.4%. Compared with micro-LED 1400, micro-LED 1500 may have a much lower total LEE and a lower collected LEE, which may be due to the high surface plasmon resonance caused by the high refractive index (and dielectric constant) of high-refractive index passivation layer 1540 adjacent to reflective metal layer 1550, even though the total optical distance between active region 1520 and reflective metal layer 1550 is longer than the total optical distance between active region 1420 and reflective metal layer 1450. In addition, because there is no low-refractive index passivation layer between high-refractive index passivation layer 1540 and reflective metal layer 1550, total internal reflection may not occur at the sidewalls of the micro-LED. Therefore, light incident on the sidewalls of the semiconductor mesa structure may reach the interface between reflective metal layer 1550 and high-refractive index passivation layer 1540 and thus may be partially absorbed by reflective metal layer 1550 due to surface plasmon resonance.

Table 1 below summarizes the simulation results for the micro-LEDs shown in FIGS. 13A, 13C, 14A, 14C, and 15A. The simulation results in Table 1 show that increasing the total optical thickness of the passivation layer(s) may increase the total LEE and collected LEE due to the reduction of the loss caused by surface plasmon resonance at the interface between the reflective metal layer and the passivation layer(s). But increasing the total optical thickness of the passivation layer(s) using a high-refractive index passivation layer adjacent to the reflective metal layer may increase the loss caused by surface plasmon resonance at the interface between the reflective metal layer and the passivation layer(s), due to (1) the high refractive index of the material adjacent to the reflective metal layer and (2) the lack of total internal reflection that may otherwise occur at the interface between the high-refractive index passivation layer and the low-refractive index passivation layer. Thus, the total LEE and collected LEE may be improved by using a combination of a high-refractive index passivation layer adjacent to the active region and a low-refractive index passivation layer adjacent to the reflective metal layer. The simulation results in Table 1 also show that reducing the size of the active region with respect to the size of the collimation lens may significantly increase the collected LEE because light emitted by the active region may be better collimated by the collimation lens.

TABLE 1

Simulation results for micro-LEDs with different active region sizes and passivation layer configurations

| Device configuration | Micro-LED 1300 | Micro-LED 1302 | Micro-LED 1400 | Micro-LED 1402 | Micro-LED 1500 |
|---|---|---|---|---|---|
| Width of micro-lens (μm) | 1.8 | 1.8 | 1.8 | 1.8 | 1.8 |
| Width of pixel base (p-type layer) (μm) | 0.9 | 0.9 | 0.7 | 0.7 | 0.7 |
| Thickness of low-index passivation layer (nm) | 90 | 200 | 90 | 200 | 0 |
| Thickness of high-index passivation layer (nm) | 0 | 0 | 100 | 100 | 190 |
| Total LEE (±90°) | 21% | 26% | 22.3% | 28% | 20.1% |
| Collected LEE (±18.5°) | 2.8% | 2.9% | 3.6% | 3.8% | 3.4% |

Embodiments disclosed herein may be used to implement components of an artificial reality system or may be implemented in conjunction with an artificial reality system. Artificial reality is a form of reality that has been adjusted in some manner before presentation to a user, which may include, for example, a virtual reality, an augmented reality, a mixed reality, a hybrid reality, or some combination and/or derivatives thereof. Artificial reality content may include completely generated content or generated content combined with captured (e.g., real-world) content. The artificial reality content may include video, audio, haptic feedback, or some combination thereof, and any of which may be presented in a single channel or in multiple channels (such as stereo video that produces a three-dimensional effect to the viewer). Additionally, in some embodiments, artificial reality may also be associated with applications, products, accessories, services, or some combination thereof, that are used to, for example, create content in an artificial reality and/or are otherwise used in (e.g., perform activities in) an artificial reality. The artificial reality system that provides the artificial reality content may be implemented on various platforms, including an HMD connected to a host computer system, a standalone HMD, a mobile device or computing system, or any other hardware platform capable of providing artificial reality content to one or more viewers.

Figure 16:
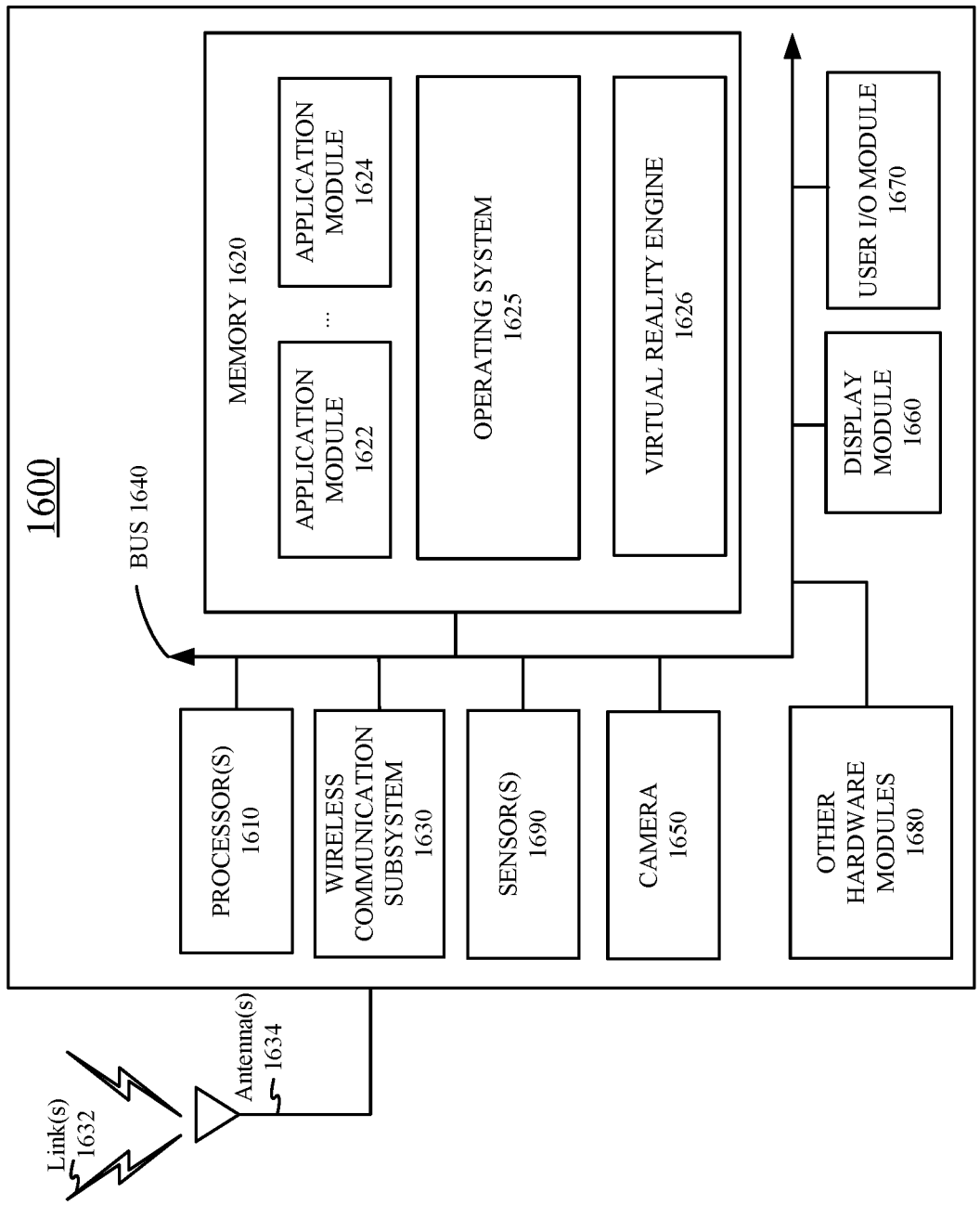
FIG. 16 is a simplified block diagram of an electronic system of an example of a near-eye display according to certain embodiments.

FIG. 16 is a simplified block diagram of an example electronic system 1600 of an example near-eye display (e.g., HMD device) for implementing some of the examples disclosed herein. Electronic system 1600 may be used as the electronic system of an HMD device or other near-eye displays described above. In this example, electronic system 1600 may include one or more processor(s) 1610 and a memory 1620. Processor(s) 1610 may be configured to execute instructions for performing operations at a number of components, and can be, for example, a general-purpose processor or microprocessor suitable for implementation within a portable electronic device. Processor(s) 1610 may be communicatively coupled with a plurality of components within electronic system 1600. To realize this communicative coupling, processor(s) 1610 may communicate with the other illustrated components across a bus 1640. Bus 1640 may be any subsystem adapted to transfer data within electronic system 1600. Bus 1640 may include a plurality of computer buses and additional circuitry to transfer data.

Memory 1620 may be coupled to processor(s) 1610. In some embodiments, memory 1620 may offer both short-term and long-term storage and may be divided into several units. Memory 1620 may be volatile, such as static random access memory (SRAM) and/or dynamic random access memory (DRAM) and/or non-volatile, such as read-only memory (ROM), flash memory, and the like. Furthermore, memory 1620 may include removable storage devices, such as secure digital (SD) cards. Memory 1620 may provide storage of computer-readable instructions, data structures, program modules, and other data for electronic system 1600. In some embodiments, memory 1620 may be distributed into different hardware modules. A set of instructions and/or code might be stored on memory 1620. The instructions might take the form of executable code that may be executable by electronic system 1600, and/or might take the form of source and/or installable code, which, upon compilation and/or installation on electronic system 1600 (e.g., using any of a variety of generally available compilers, installation programs, compression/decompression utilities, etc.), may take the form of executable code.

In some embodiments, memory 1620 may store a plurality of application modules 1622 through 1624, which may include any number of applications. Examples of applications may include gaming applications, conferencing applications, video playback applications, or other suitable applications. The applications may include a depth sensing function or eye tracking function. Application modules 1622-1624 may include particular instructions to be executed by processor(s) 1610. In some embodiments, certain applications or parts of application modules 1622-1624 may be executable by other hardware modules 1680. In certain embodiments, memory 1620 may additionally include secure memory, which may include additional security controls to prevent copying or other unauthorized access to secure information.

In some embodiments, memory 1620 may include an operating system 1625 loaded therein. Operating system 1625 may be operable to initiate the execution of the instructions provided by application modules 1622-1624 and/or manage other hardware modules 1680 as well as interfaces with a wireless communication subsystem 1630 which may include one or more wireless transceivers. Operating system 1625 may be adapted to perform other operations across the components of electronic system 1600 including threading, resource management, data storage control and other similar functionality.

Wireless communication subsystem 1630 may include, for example, an infrared communication device, a wireless communication device and/or chipset (such as a Bluetooth® device, an IEEE 802.11 device, a Wi-Fi device, a WiMax device, cellular communication facilities, etc.), and/or similar communication interfaces. Electronic system 1600 may include one or more antennas 1634 for wireless communication as part of wireless communication subsystem 1630 or as a separate component coupled to any portion of the system. Depending on desired functionality, wireless communication subsystem 1630 may include separate transceivers to communicate with base transceiver stations and other wireless devices and access points, which may include communicating with different data networks and/or network types, such as wireless wide-area networks (WWANs), wireless local area networks (WLANs), or wireless personal area networks (WPANs). A WWAN may be, for example, a WiMax (IEEE 802.16) network. A WLAN may be, for example, an IEEE 802.11x network. A WPAN may be, for example, a Bluetooth network, an IEEE 802.15x, or some other types of network. The techniques described herein may also be used for any combination of WWAN, WLAN, and/or WPAN. Wireless communications subsystem 1630 may permit data to be exchanged with a network, other computer systems, and/or any other devices described herein. Wireless communication subsystem 1630 may include a means for transmitting or receiving data, such as identifiers of HMD devices, position data, a geographic map, a heat map, photos, or videos, using antenna(s) 1634 and wireless link(s) 1632. Wireless communication subsystem 1630, processor(s) 1610, and memory 1620 may together comprise at least a part of one or more of a means for performing some functions disclosed herein.

Embodiments of electronic system 1600 may also include one or more sensors 1690. Sensor(s) 1690 may include, for example, an image sensor, an accelerometer, a pressure sensor, a temperature sensor, a proximity sensor, a magnetometer, a gyroscope, an inertial sensor (e.g., a module that combines an accelerometer and a gyroscope), an ambient light sensor, or any other similar module operable to provide sensory output and/or receive sensory input, such as a depth sensor or a position sensor. For example, in some implementations, sensor(s) 1690 may include one or more inertial measurement units (IMUs) and/or one or more position sensors. An IMU may generate calibration data indicating an estimated position of the HMD device relative to an initial position of the HMD device, based on measurement signals received from one or more of the position sensors. A position sensor may generate one or more measurement signals in response to motion of the HMD device. Examples of the position sensors may include, but are not limited to, one or more accelerometers, one or more gyroscopes, one or more magnetometers, another suitable type of sensor that detects motion, a type of sensor used for error correction of the IMU, or any combination thereof. The position sensors may be located external to the IMU, internal to the IMU, or any combination thereof. At least some sensors may use a structured light pattern for sensing.

Electronic system 1600 may include a display module 1660. Display module 1660 may be a near-eye display, and may graphically present information, such as images, videos, and various instructions, from electronic system 1600 to a user. Such information may be derived from one or more application modules 1622-1624, virtual reality engine 1626, one or more other hardware modules 1680, a combination thereof, or any other suitable means for resolving graphical content for the user (e.g., by operating system 1625). Display module 1660 may use LCD technology, LED technology (including, for example, OLED, ILED, µ-LED, AMOLED, TOLED, etc.), light emitting polymer display (LPD) technology, or some other display technology.

Electronic system 1600 may include a user input/output module 1670. User input/output module 1670 may allow a user to send action requests to electronic system 1600. An action request may be a request to perform a particular action. For example, an action request may be to start or end an application or to perform a particular action within the application. User input/output module 1670 may include one or more input devices. Example input devices may include a touchscreen, a touch pad, microphone(s), button(s), dial(s), switch(es), a keyboard, a mouse, a game controller, or any other suitable device for receiving action requests and communicating the received action requests to electronic system 1600. In some embodiments, user input/output module 1670 may provide haptic feedback to the user in accordance with instructions received from electronic system 1600. For example, the haptic feedback may be provided when an action request is received or has been performed.

Electronic system 1600 may include a camera 1650 that may be used to take photos or videos of a user, for example, for tracking the user's eye position. Camera 1650 may also be used to take photos or videos of the environment, for example, for VR, AR, or MR applications. Camera 1650 may include, for example, a complementary metal-oxide-semiconductor (CMOS) image sensor with a few millions or tens of millions of pixels. In some implementations, camera 1650 may include two or more cameras that may be used to capture 3-D images.

In some embodiments, electronic system 1600 may include a plurality of other hardware modules 1680. Each of other hardware modules 1680 may be a physical module within electronic system 1600. While each of other hardware modules 1680 may be permanently configured as a structure, some of other hardware modules 1680 may be temporarily configured to perform specific functions or temporarily activated. Examples of other hardware modules 1680 may include, for example, an audio output and/or input module (e.g., a microphone or speaker), a near field communication (NFC) module, a rechargeable battery, a battery management system, a wired/wireless battery charging system, etc. In some embodiments, one or more functions of other hardware modules 1680 may be implemented in software.

In some embodiments, memory 1620 of electronic system 1600 may also store a virtual reality engine 1626. Virtual reality engine 1626 may execute applications within electronic system 1600 and receive position information, acceleration information, velocity information, predicted future positions, or any combination thereof of the HMD device from the various sensors. In some embodiments, the information received by virtual reality engine 1626 may be used for producing a signal (e.g., display instructions) to display module 1660. For example, if the received information indicates that the user has looked to the left, virtual reality engine 1626 may generate content for the HMD device that mirrors the user's movement in a virtual environment. Additionally, virtual reality engine 1626 may perform an action within an application in response to an action request received from user input/output module 1670 and provide feedback to the user. The provided feedback may be visual, audible, or haptic feedback. In some implementations, processor(s) 1610 may include one or more GPUs that may execute virtual reality engine 1626.

In various implementations, the above-described hardware and modules may be implemented on a single device or on multiple devices that can communicate with one another using wired or wireless connections. For example, in some implementations, some components or modules, such as GPUs, virtual reality engine 1626, and applications (e.g., tracking application), may be implemented on a console separate from the head-mounted display device. In some implementations, one console may be connected to or support more than one HMD.

In alternative configurations, different and/or additional components may be included in electronic system 1600. Similarly, functionality of one or more of the components can be distributed among the components in a manner different from the manner described above. For example, in some embodiments, electronic system 1600 may be modified to include other system environments, such as an AR system environment and/or an MR environment.

The methods, systems, and devices discussed above are examples. Various embodiments may omit, substitute, or add various procedures or components as appropriate. For instance, in alternative configurations, the methods described may be performed in an order different from that described, and/or various stages may be added, omitted, and/or combined. Also, features described with respect to certain embodiments may be combined in various other embodiments. Different aspects and elements of the embodiments may be combined in a similar manner. Also, technology evolves and, thus, many of the elements are examples that do not limit the scope of the disclosure to those specific examples.

Specific details are given in the description to provide a thorough understanding of the embodiments. However, embodiments may be practiced without these specific details. For example, well-known circuits, processes, systems, structures, and techniques have been shown without unnecessary detail in order to avoid obscuring the embodiments. This description provides example embodiments only, and is not intended to limit the scope, applicability, or configuration of the invention. Rather, the preceding description of the embodiments will provide those skilled in the art with an enabling description for implementing various embodiments. Various changes may be made in the function and arrangement of elements without departing from the spirit and scope of the present disclosure.

Also, some embodiments were described as processes depicted as flow diagrams or block diagrams. Although each may describe the operations as a sequential process, many of the operations may be performed in parallel or concurrently. In addition, the order of the operations may be rearranged. A process may have additional steps not included in the figure. Furthermore, embodiments of the methods may be implemented by hardware, software, firmware, middleware, microcode, hardware description languages, or any combination thereof. When implemented in software, firmware, middleware, or microcode, the program code or code segments to perform the associated tasks may be stored in a computer-readable medium such as a storage medium. Processors may perform the associated tasks.

It will be apparent to those skilled in the art that substantial variations may be made in accordance with specific requirements. For example, customized or special-purpose hardware might also be used, and/or particular elements might be implemented in hardware, software (including portable software, such as applets, etc.), or both. Further, connection to other computing devices such as network input/output devices may be employed.

With reference to the appended figures, components that can include memory can include non-transitory machine-readable media. The term "machine-readable medium" and "computer-readable medium" may refer to any storage medium that participates in providing data that causes a machine to operate in a specific fashion. In embodiments provided hereinabove, various machine-readable media might be involved in providing instructions/code to processing units and/or other device(s) for execution. Additionally or alternatively, the machine-readable media might be used to store and/or carry such instructions/code. In many implementations, a computer-readable medium is a physical and/or tangible storage medium. Such a medium may take many forms, including, but not limited to, non-volatile media, volatile media, and transmission media. Common forms of computer-readable media include, for example, magnetic and/or optical media such as compact disk (CD) or digital versatile disk (DVD), punch cards, paper tape, any other physical medium with patterns of holes, a RAM, a programmable read-only memory (PROM), an erasable programmable read-only memory (EPROM), a FLASH-EPROM, any other memory chip or cartridge, a carrier wave as described hereinafter, or any other medium from which a computer can read instructions and/or code. A computer program product may include code and/or machine-executable instructions that may represent a procedure, a function, a subprogram, a program, a routine, an application (App), a subroutine, a module, a software package, a class, or any combination of instructions, data structures, or program statements.

Those of skill in the art will appreciate that information and signals used to communicate the messages described herein may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof.

Terms, "and" and "or" as used herein, may include a variety of meanings that are also expected to depend at least in part upon the context in which such terms are used. Typically, "or" if used to associate a list, such as A, B, or C, is intended to mean A, B, and C, here used in the inclusive sense, as well as A, B, or C, here used in the exclusive sense. In addition, the term "one or more" as used herein may be used to describe any feature, structure, or characteristic in the singular or may be used to describe some combination of features, structures, or characteristics. However, it should be noted that this is merely an illustrative example and claimed subject matter is not limited to this example. Furthermore, the term "at least one of" if used to associate a list, such as A, B, or C, can be interpreted to mean A, B, C, or any combination of A, B, and/or C, such as AB, AC, BC, AA, ABC, AAB, AABBCCC, or the like.

Further, while certain embodiments have been described using a particular combination of hardware and software, it should be recognized that other combinations of hardware and software are also possible. Certain embodiments may be implemented only in hardware, or only in software, or using combinations thereof. In one example, software may be implemented with a computer program product containing computer program code or instructions executable by one or more processors for performing any or all of the steps, operations, or processes described in this disclosure, where the computer program may be stored on a non-transitory computer readable medium. The various processes described herein can be implemented on the same processor or different processors in any combination.

Where devices, systems, components or modules are described as being configured to perform certain operations or functions, such configuration can be accomplished, for example, by designing electronic circuits to perform the operation, by programming programmable electronic circuits (such as microprocessors) to perform the operation such as by executing computer instructions or code, or processors or cores programmed to execute code or instructions stored on a non-transitory memory medium, or any combination thereof. Processes can communicate using a variety of techniques, including, but not limited to, conventional techniques for inter-process communications, and different pairs of processes may use different techniques, or the same pair of processes may use different techniques at different times.

The specification and drawings are, accordingly, to be regarded in an illustrative rather than a restrictive sense. It will, however, be evident that additions, subtractions, deletions, and other modifications and changes may be made thereunto without departing from the broader spirit and scope as set forth in the claims. Thus, although specific embodiments have been described, these are not intended to be limiting. Various modifications and equivalents are within the scope of the following claims.

What is claimed is:

1. A micro-light emitting diode (micro-LED) device comprising:
a semiconductor mesa structure including:
at least a portion of an n-type semiconductor layer;
an active region configured to emit visible light; and
a p-type semiconductor layer;
an insulator layer including:
an undoped semiconductor passivation layer grown on sidewalls of the semiconductor mesa structure; and
a dielectric passivation layer characterized by a refractive index lower than a refractive index of the undoped semiconductor passivation layer;
a reflective metal layer deposited on the dielectric passivation layer; and
a micro-lens configured to collimate the visible light emitted by the active region,
wherein a ratio between a width of the micro-lens and a width of the active region is greater than 1.5.

2. The micro-LED device of claim 1, wherein:
the width of the micro-lens is less than 3 μm;
a thickness of the dielectric passivation layer is between 10 nm and 300 nm; and
a thickness of the undoped semiconductor passivation layer is between 1 nm and 300 nm.

3. The micro-LED device of claim 1, wherein the micro-lens includes a dielectric micro-lens.

4. The micro-LED device of claim 1, wherein the ratio between the width of the micro-lens and the width of the active region is greater than 2.0.

5. The micro-LED device of claim 1, wherein the reflective metal layer includes Al, Au, Ag, Pt, Ti, Cu, or a combination thereof.

6. The micro-LED device of claim 1, wherein each of the n-type semiconductor layer, the active region, the p-type semiconductor layer, and the undoped semiconductor passivation layer includes a III-P semiconductor material.

7. The micro-LED device of claim 1, wherein the sidewalls of the semiconductor mesa structure are outwardly tilted from the p-type semiconductor layer to the n-type semiconductor layer.

8. The micro-LED device of claim 1, wherein the insulator layer includes one or more layers between the undoped semiconductor passivation layer and the dielectric passivation layer, the one or more layers including a dielectric material, a doped semiconductor material, an undoped semiconductor material, or a combination thereof.

9. The micro-LED device of claim 1, wherein the refractive index of the dielectric passivation layer is lower than 2.4.

10. The micro-LED device of claim 1, further comprising a transparent conductive layer on the n-type semiconductor layer.

11. A micro-light emitting diode (micro-LED) device comprising:
a backplane wafer;
an array of micro-LEDs bonded to the backplane wafer, each micro-LED of the array of micro-LEDs including:
a semiconductor mesa structure including:
at least a portion of an n-type semiconductor layer;
an active region configured to emit visible light; and
a p-type semiconductor layer;
an insulator layer including:
a first passivation layer on sidewalls of the semiconductor mesa structure and characterized by a refractive index matching a refractive index of active region; and a second passivation layer characterized by a refractive index lower than the refractive index of the first passivation layer; and
a reflective metal layer deposited on the second passivation layer; and
an array of micro-lenses on the array of micro-LEDs, wherein:
each micro-lens of the array of micro-lenses is configured to collimate the visible light emitted by the active region of a respective micro-LED of the array of micro-LEDs, and
a ratio between a width of the micro-lens and a width of the active region is greater than 1.5.

12. The micro-LED device of claim 11, wherein:
the first passivation layer includes an undoped semiconductor material layer epitaxially grown on the sidewalls of the semiconductor mesa structure; and
the second passivation layer includes a dielectric material.

13. The micro-LED device of claim 11, wherein:
a pitch of the array of micro-LEDs is less than 3 μm;
a thickness of the first passivation layer is between 1 nm and 300 nm; and
a thickness of the second passivation layer is between 10 nm and 300 nm.

14. The micro-LED device of claim 11, wherein the ratio between the width of the micro-lens and the width of the active region is greater than 2.0.

15. The micro-LED device of claim 11, wherein the reflective metal layer includes Al, Au, Ag, Pt, Ti, Cu, or a combination thereof.

16. The micro-LED device of claim 11, wherein each of the n-type semiconductor layer, the active region, the p-type semiconductor layer, and the first passivation layer includes a III-P semiconductor material.

17. The micro-LED device of claim 11, wherein the sidewalls of the semiconductor mesa structure are outwardly tilted from the p-type semiconductor layer to the n-type semiconductor layer.

18. The micro-LED device of claim 11, wherein the refractive index of the second passivation layer is lower than 2.4.

19. The micro-LED device of claim 11, wherein the insulator layer includes one or more layers between the first passivation layer and the second passivation layer, the one or more layers including a dielectric material, a doped semiconductor material, an undoped semiconductor material, or a combination thereof.

20. The micro-LED device of claim 11, wherein each micro-LED of the array of micro-LEDs further comprises a back metal reflector coupled to the p-type semiconductor layer and electrically connected to a drive circuit of the backplane wafer.

* * * * *